US011817429B2

(12) United States Patent
Kakimoto et al.

(10) Patent No.: US 11,817,429 B2
(45) Date of Patent: Nov. 14, 2023

(54) PLURALITY OF CHIPS BETWEEN TWO HEAT SINKS

(71) Applicant: DENSO CORPORATION, Kariya (JP)

(72) Inventors: Noriyuki Kakimoto, Kariya (JP); Hiroshi Ishino, Kariya (JP); Shinji Hiramitsu, Kariya (JP)

(73) Assignee: DENSO CORPORATION, Kariya (JP)

( * ) Notice: Subject to any disclaimer, the term of this patent is extended or adjusted under 35 U.S.C. 154(b) by 148 days.

(21) Appl. No.: 17/464,914

(22) Filed: Sep. 2, 2021

(65) Prior Publication Data

US 2021/0398951 A1 Dec. 23, 2021

Related U.S. Application Data

(63) Continuation of application No. PCT/JP2020/001272, filed on Jan. 16, 2020.

(30) Foreign Application Priority Data

Mar. 6, 2019 (JP) .................................. 2019-040953

(51) Int. Cl.
*H01L 25/07* (2006.01)
*H01L 23/31* (2006.01)
(Continued)

(52) U.S. Cl.
CPC ........ *H01L 25/072* (2013.01); *H01L 23/3107* (2013.01); *H01L 23/36* (2013.01);
(Continued)

(58) Field of Classification Search
CPC ... H01L 2924/181; H01L 24/29; H01L 24/32; H01L 25/072; H01L 25/0657;
(Continued)

(56) References Cited

U.S. PATENT DOCUMENTS 11,587,921 B2 * 2/2023 Sugita ............... H01L 23/49541
2007/0052072 A1 * 3/2007 Iwade ..................... H01L 24/33
257/E23.092
(Continued)

FOREIGN PATENT DOCUMENTS

| JP | 2010245212 A | 10/2010 |
|----|--------------|---------|
| JP | 2014096461 A | 5/2014  |

(Continued)

*Primary Examiner* — Alonzo Chambliss
(74) *Attorney, Agent, or Firm* — POSZ LAW GROUP, PLC

(57) ABSTRACT

A semiconductor device includes: multiple semiconductor elements each having a one surface and a rear surface in a plate thickness direction; a first member that sandwiches the multiple semiconductor elements and is electrically connected to an electrode on the one surface; a second member electrically connected to an electrode on the rear surface; and multiple terminals that are continuous from the first or second member. An area of the second member is smaller than that of the first member. Semiconductor elements are arranged in a longitudinal direction of the second member. The semiconductor device further includes a first joint portion that electrically connects each semiconductor element and the second member and a second joint portion that electrically connects a terminal and the second member. The multiple solder joint portions are symmetrically placed.

8 Claims, 33 Drawing Sheets

(51) Int. Cl.
*H01L 23/367* (2006.01)
*H01L 23/50* (2006.01)
*H01L 25/065* (2023.01)
*H01L 23/36* (2006.01)
*H01L 23/00* (2006.01)
*B60L 50/60* (2019.01)
*H02P 27/08* (2006.01)

(52) U.S. Cl.
CPC ............ *H01L 23/367* (2013.01); *H01L 23/50* (2013.01); *H01L 24/29* (2013.01); *H01L 24/32* (2013.01); *H01L 25/0657* (2013.01); *B60L 50/60* (2019.02); *H02P 27/08* (2013.01)

(58) Field of Classification Search
CPC ... H01L 23/3107; H01L 23/367; H01L 23/50; H01L 23/36
See application file for complete search history.

(56) References Cited

U.S. PATENT DOCUMENTS

| 2010/0238632 | A1* | 9/2010 | Shiraki ................ H05K 7/1432 361/709 |
| 2012/0001308 | A1* | 1/2012 | Fukutani ................ H01L 24/73 438/123 |
| 2016/0204047 | A1 | 7/2016 | Sugiura et al. |
| 2017/0018484 | A1 | 1/2017 | Kadoguchi et al. |
| 2017/0092559 | A1* | 3/2017 | Iwasaki ............... H01L 23/3142 |
| 2017/0278774 | A1 | 9/2017 | Hayashi et al. |

FOREIGN PATENT DOCUMENTS

| JP | 2015142052 A | 8/2015 |
| JP | 2018-067657 A | 4/2018 |

* cited by examiner

UPPER ARM DRIVING

LOWER ARM DRIVING

FIG. 21
(a) DUTY RATIO 50%
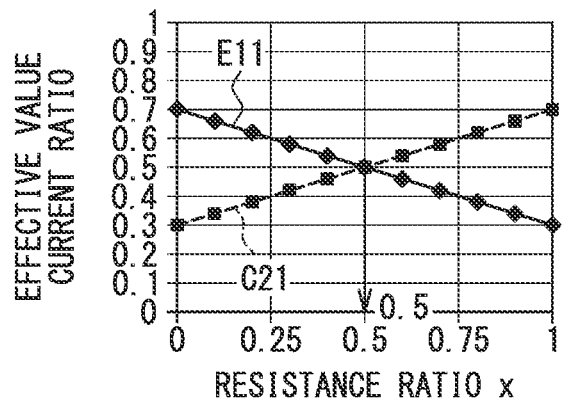
(b) DUTY RATIO 55%
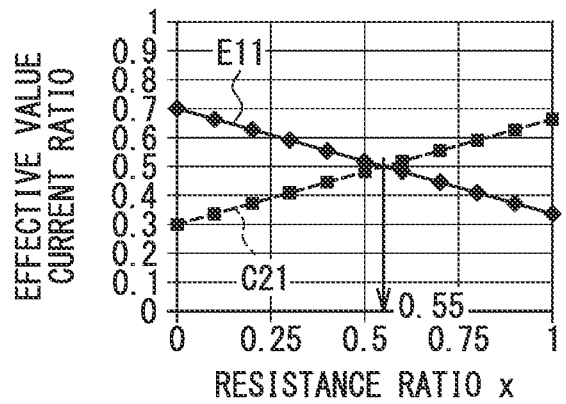
(c) DUTY RATIO 60%
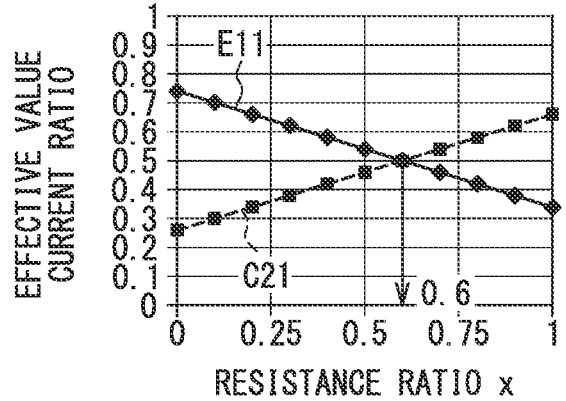

FIG. 22
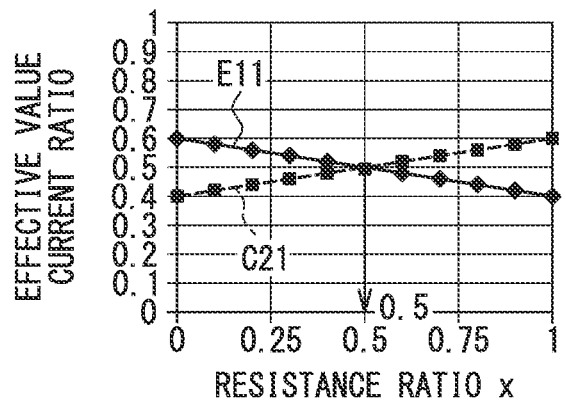
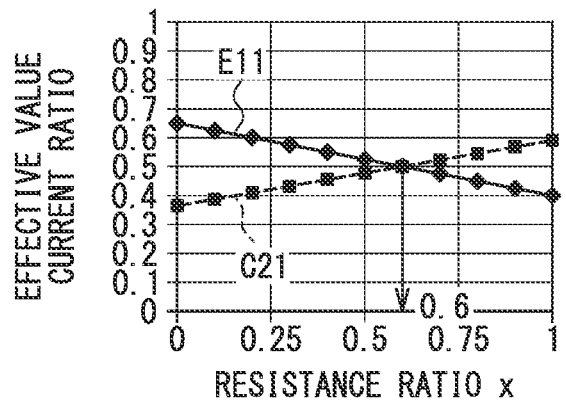
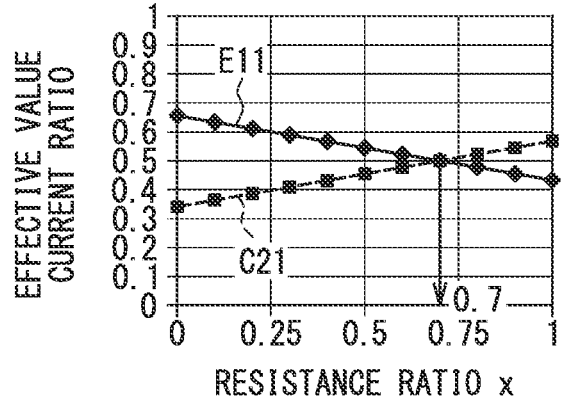

FIG. 23
(a) DUTY RATIO 50%, k=1.5
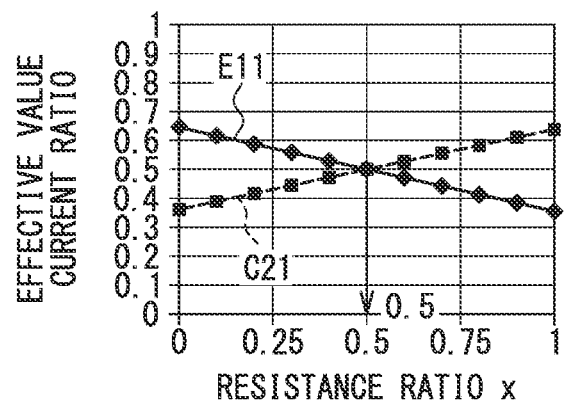
(b) DUTY RATIO 55%, k=1.5
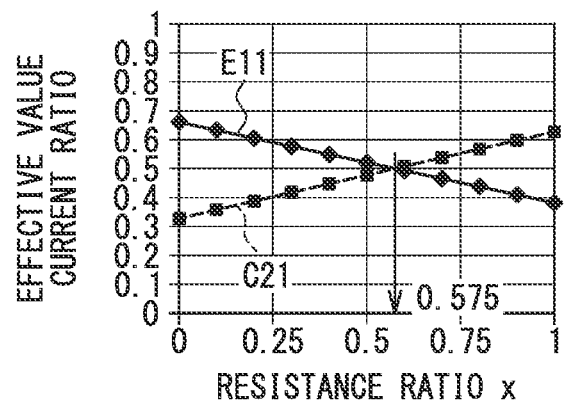
(c) DUTY RATIO 60%, k=1.5
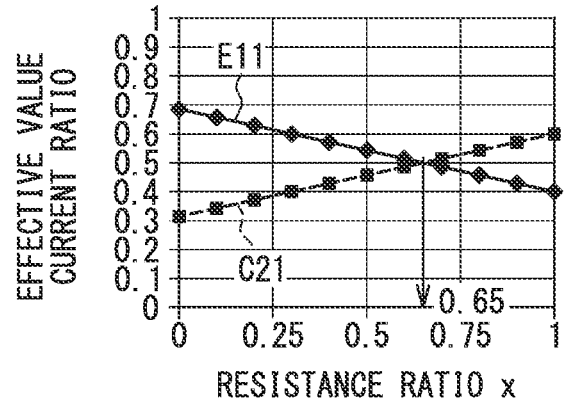

FIG. 24
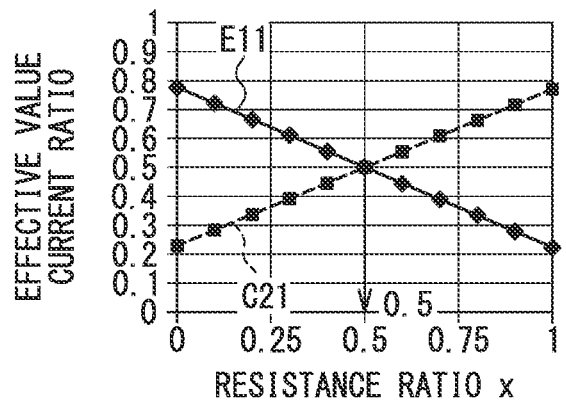
(a) DUTY RATIO 50%, k=0.5
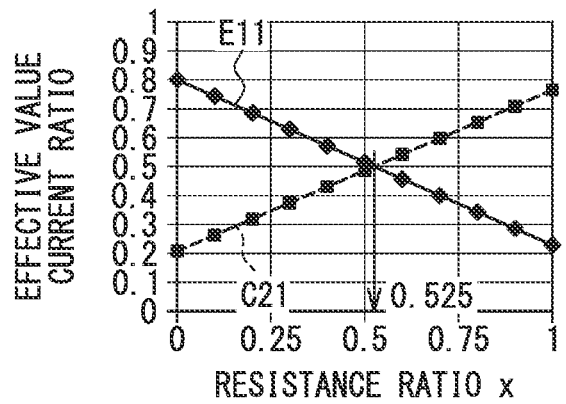
(b) DUTY RATIO 55%, k=0.5
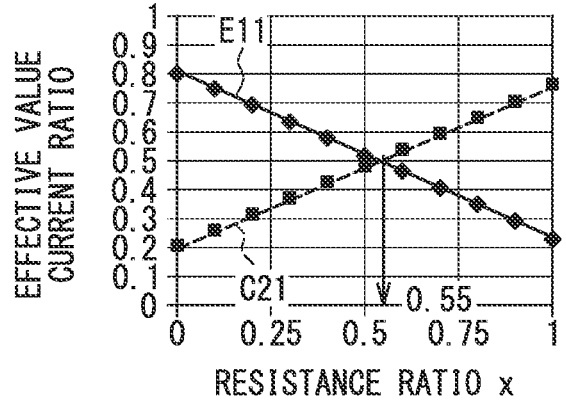
(c) DUTY RATIO 60%, k=0.5

FIG. 31
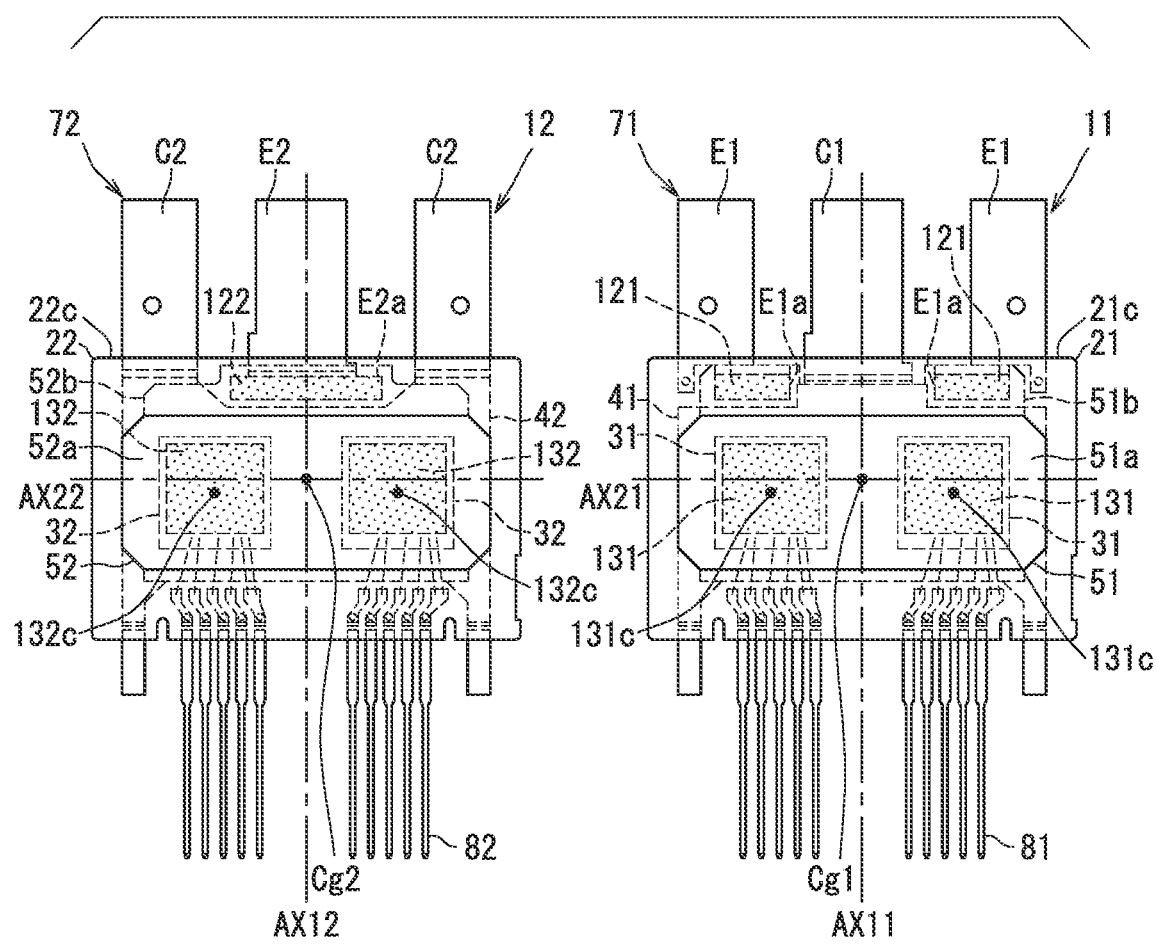
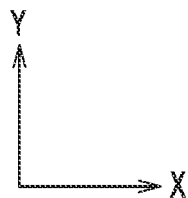

FIG. 39
(a) $\theta=0$, $ta2=0.5$
| THICKNESS tb2 [mm] | CURRENT DENSITY max [kA/cm$^2$] |
|---|---|
| 0.25 | 2.1454 |
| 0.50 | 1.4269 |
| 0.65 | 1.321 |
| 0.75 | 1.0394 |
| 0.85 | 1.389 |
| 1 | 1.4234 |
| 2 | 1.543 |
| 5 | 1.6131 |
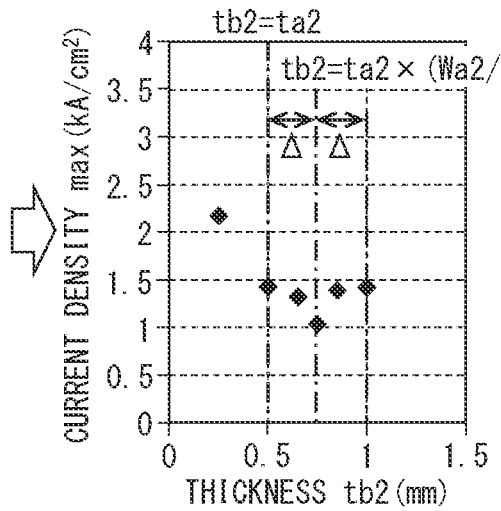
(b) $\theta=90$, $ta2=0.5$
| THICKNESS tb2 [mm] | CURRENT DENSITY max [kA/cm$^2$] |
|---|---|
| 0.50 | 3.0458 |
| 0.65 | 2.935 |
| 0.75 | 2.8914 |
| 0.85 | 2.8513 |
| 1 | 2.8096 |
| 2 | 2.6901 |
| 5 | 2.6226 |
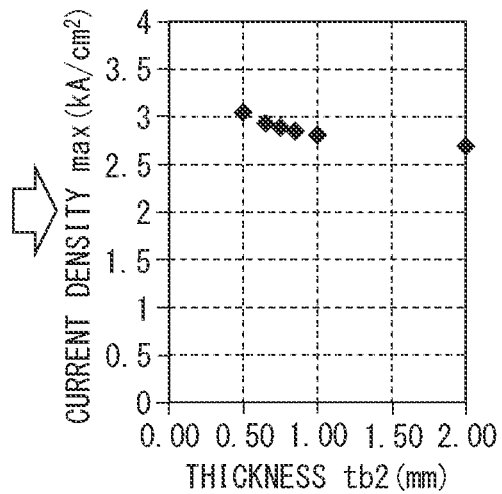
(c) $\theta=180$, $ta2=0.5$
| THICKNESS tb2 [mm] | CURRENT DENSITY max [kA/cm$^2$] |
|---|---|
| 0.50 | 2.3357 |
| 0.65 | 2.208 |
| 0.75 | 2.1433 |
| 0.85 | 2.0943 |
| 1 | 2.0385 |
| 2 | 1.8783 |
| 5 | 1.785 |
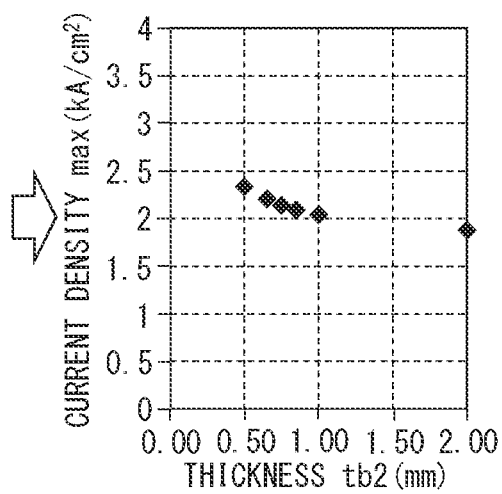

US 11,817,429 B2

PLURALITY OF CHIPS BETWEEN TWO HEAT SINKS

CROSS REFERENCE TO RELATED APPLICATIONS

The present application is a continuation application of International Patent Application No. PCT/JP2020/001272 filed on Jan. 16, 2020, which designated the U.S. and claims the benefit of priority from Japanese Patent Application No. 2019-040953 filed on Mar. 6, 2019. The entire disclosures of all of the above applications are incorporated herein by reference.

TECHNICAL FIELD

The present disclosure relates to a semiconductor device.

BACKGROUND

A semiconductor device of a comparative example includes a semiconductor element, a heat dissipation member, and a terminal. The semiconductor element has electrodes on both sides in a plate thickness direction. The heat dissipation member includes a first member electrically connected to the electrode on one surface, and a second member electrically connected to the electrode on an opposite surface. The terminal is continuous from the heat dissipation member.

SUMMARY

A semiconductor device includes: multiple semiconductor elements each having a one surface and a rear surface in a plate thickness direction; a first member that sandwiches the multiple semiconductor elements and is electrically connected to an electrode on the one surface; a second member electrically connected to an electrode on the rear surface; and multiple terminals that are continuous from the first or second member. An area of the second member is smaller than that of the first member. Semiconductor elements are arranged in a longitudinal direction of the second member. The semiconductor device further includes a first joint portion that electrically connects each semiconductor element and the second member and a second joint portion that electrically connects a terminal and the second member. The multiple solder joint portions are symmetrically placed.

BRIEF DESCRIPTION OF DRAWINGS

The above and other features, and advantages of the present disclosure will be more clearly understood from the following detailed description with reference to the accompanying drawings. In the accompanying drawings.

FIG. 21 is a diagram showing a relationship between a resistance ratio and an effective value current ratio;

FIG. 22 is a diagram showing a relationship between the resistance ratio and the effective value current ratio;

FIG. 23 is a diagram showing a relationship between the resistance ratio and the effective value current ratio;

FIG. 24 is a diagram showing a relationship between the resistance ratio and the effective value current ratio;

FIG. 31 is a plan view showing a semiconductor device according to a third embodiment;

FIG. 39 is a diagram showing a relationship between a thickness and a maximum value of the current density of a solder joint portion.

DETAILED DESCRIPTION

Figure 1:
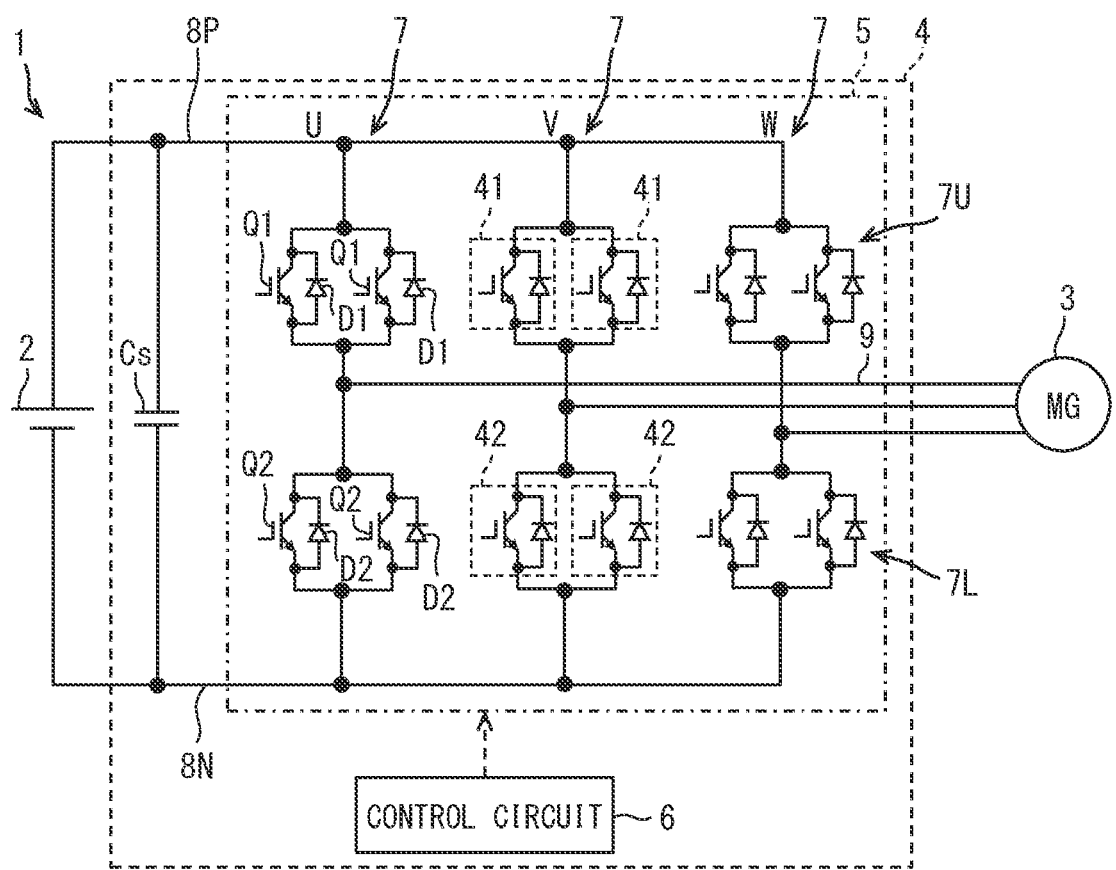
FIG. 1 is a diagram showing a schematic configuration of a vehicle drive system to which an electric power conversion device is applied.

In the comparative example, an area of the second member is smaller than an area of the first member in a plan view in the plate thickness direction. In such a configuration, in the heat dissipation member, the first member having the larger area is positioned in the plate thickness direction, and, in this state, a solder joint portion of the second member is formed. Accordingly, the first member and the second member may be relatively inclined.

In a configuration including multiple semiconductor elements, a direction in which at least two semiconductor elements are arranged is set to a long-side direction (also referred to as a longitudinal direction) of the second member. When the inclining in the long-side direction of the second member occurs, the amount of displacement is larger than that in a short-side direction.

One example of the present disclosure provides a semiconductor device capable of preventing inclining of a heat dissipation member.

According to one example embodiment, a semiconductor device includes: multiple semiconductor elements each having a one surface and a rear surface opposite to the one surface in a plate thickness direction, wherein a plurality of electrodes are placed on the one surface and the rear surface; a first member that is a heat dissipation member placed to sandwich the multiple semiconductor elements and is electrically connected to each of the multiple electrodes on the one surface; a second member that is the heat dissipation member and is electrically connected to each of the multiple electrodes on the rear surface; and multiple terminals that are continuous from the heat dissipation member.

In a plan view from the plate thickness direction, an area of the second member is smaller than an area of the first member. At least two of the multiple semiconductor elements are arranged in a longitudinal direction of the second member. The semiconductor device further includes, as multiple solder joint portions formed between the multiple semiconductor elements and the second member, a first joint portion that electrically connects each of the multiple semiconductor elements and the second member and a second joint portion that electrically connects at least one of the multiple terminals and the second member.

The multiple solder joint portions are symmetrically placed with respect to an axis that passes through a gravity center of the second member and is orthogonal to the thickness direction and the longitudinal direction.

According to this semiconductor device, the solder joint portions of the second member are symmetrically placed with respect to an axis that is orthogonal to the direction in which the semiconductor elements are arranged, that is, the longitudinal direction of the second member and the plate thickness direction and passes through the gravity center of the second member. Thereby, when the solder joint portion is formed, in the longitudinal direction of the second member, the surface tension of the solder joint portion is balanced with respect to the gravity center of the second member. Accordingly, it is possible to prevent the first member and the second member from being relatively inclined. In particular, it is possible to prevent the heat dissipation member from being inclined in the longitudinal direction.

Multiple embodiments will be described with reference to the drawings.

First Embodiment

A semiconductor device and a semiconductor module according to the present embodiment are applied to an electric power conversion device. The electric power conversion device is applied to, for example, a vehicle drive system. The electric power conversion device is applicable to vehicles, such as an electric vehicle (EV) and a hybrid vehicle (HV). In the following, an example in which the electric power conversion device is applied to the hybrid vehicle will be described.

<Vehicle Drive System>

First, a schematic configuration of the vehicle drive system will be described. As shown in FIG. 1, a vehicle drive system 1 is provided with a direct current (DC) power supply 2, a motor generator 3, and an electric power converter device 4.

The direct current power source 2 is a secondary battery capable of charging and discharging such as a lithium ion battery or a nickel hydrogen battery. The motor generator 3 is a three-phase alternating current (AC) type rotating electric machine. The motor generator 3 functions as a vehicle driving power source, that is, an electric motor. The motor generator 3 also functions as an electric generator during regeneration. The vehicle includes, as traveling drive sources, an engine (not shown) and the motor generator 3. The electric power conversion device 4 performs electric power conversion between the DC power supply 2 and the motor generator 3.

<Circuit Configuration of Electric Power Conversion Device>

Next, a circuit configuration of the electric power conversion device 4 will be described. As shown in FIG. 1, the electric power conversion device 4 includes an inverter 5, a control circuit 6, and a smoothing capacitor Cs. The inverter 5 corresponds to an electric power converter. The inverter 5 corresponds to a DC-AC converter. The electric power converter includes an upper-lower arm 7.

The upper-lower arm 7 is a circuit in which an upper arm 7U and a lower arm 7L are connected in series. Each of the upper arm 7U and the lower arm 7L includes multiple switching elements having a gate electrode. In each of the upper arm 7U and the lower arm 7L, the multiple switching elements are connected in parallel to each other. In the present embodiment, as the switching elements, n-channel type IGBTs are employed.

The upper arm 7U has two switching elements Q1. Each of the two switching elements Q1 is connected to a freewheeling diode D1. The diode D1 is connected to the corresponding switching element Q1 in antiparallel (i.e., reversely). The two parallelly connected switching elements Q1 are controlled by a gate drive signal of which high level and low level are switched at the same timing. The gate electrode of each of the two switching elements Q1 is electrically connected to, for example, the same drive circuit portion (gate driver). The upper arm 7U includes two semiconductor elements 31 described later.

The lower arm 7L includes two switching elements Q2. Each of the two switching elements Q2 is connected to a freewheeling diode D2. The diode D2 is connected to the corresponding switching element Q2 in antiparallel (i.e., reversely). The two parallelly connected switching elements Q2 are controlled by the gate drive signal of which high level and low level are switched at the same timing. The gate electrode of each of the two switching elements Q2 is electrically connected to, for example, the same drive circuit portion. The lower arm 7L includes two semiconductor elements 32 described later.

The switching elements Q1 and Q2 are not limited to the IGBT. For example, a MOSFET can be employed. As the diodes D1 and D2, parasitic diodes can be used.

The upper arm 7U and the lower arm 7L are connected in series between an electric power line 8P and an electric power line 8N with defining the upper arm 7U as a side of the electric power line 8P. The electric power line 8P is an electric power line on the high potential side. The electric power line 8P is connected to a positive electrode of the direct current power source 2. The electric power line 8P is connected to a terminal on the positive electrode side of the smoothing capacitor Cs. The electric power line 8N is connected to the electric power line on the low potential side. The electric power line 8N is connected to the negative electrode of the direct current power source 2. The electric power line 8N is connected to a terminal on the negative electrode side of the smoothing capacitor Cs. The electric power line 8N is also referred to as a ground line.

The inverter 5 is connected to the direct current power source 2 via the smoothing capacitor Cs. The inverter 5 has three sets of the upper-lower arms 7 described above. The inverter 5 has the upper-lower arms 7 for three phases. In each phase, a collector electrode of the switching element Q1 is connected to the electric power line 8P. An emitter electrode of the switching element Q2 is connected to the electric power line 8N. The emitter electrode of the switching element Q1 and the collector electrode of the switching element Q2 are connected to each other to form a connection point of the upper-lower arm 7.

A connection point of the upper-lower arm 7 of the U-phase is connected to a U-phase winding provided at a stator of the motor generator 3. A connection point of the upper-lower arm 7 of the V-phase is connected to a V-phase winding of the motor generator 3. A connection point of the upper-lower arm 7 of the W-phase is connected to a W-phase winding of the motor generator 3. The connection point of the upper-lower arm 7 in each phase is connected to the winding in accordance with the corresponding phase via a load line 9 placed for each phase. The load line 9 is also referred to as an output line.

The inverter 5 converts the direct voltage into a three-phase AC voltage in accordance with the switching control by the control circuit 6, and outputs the three-phase AC voltage to the motor generator 3. Thereby, the motor generator 3 is driven to generate a predetermined torque. During receiving braking of the vehicle, the motor generator 3 generates the three-phase AC voltage by receiving the rotational force from the wheels. The inverter 5 can convert the three-phase AC voltage generated by the motor generator 3 into the direct voltage in accordance with the switching control by the control circuit 6, and output the direct voltage to the electric power line 8P. In this way, the inverter 5 performs bidirectional power conversion between the DC power supply 2 and the motor generator 3.

The control circuit 6 includes, for example, a microcomputer. The control circuit 6 generates the drive instruction for operating the switching elements Q1 and Q2 of the inverter 5 and outputs the drive instruction to a drive circuit portion (not shown). Specifically, the control circuit 6 outputs a PWM signal as the drive instruction. The drive instruction is, for example, the output duty ratio. The control circuit 6 generates the drive instruction based on a torque request input from a higher-level ECU (not shown) or signals detected by various sensors.

Various sensors include a current sensor that detects a phase current flowing in the winding of each phase of the motor generator 3, a rotation angle sensor that detects a rotation angle of a rotor of the motor generator 3, and a voltage sensor that detects, a voltage across the smoothing capacitor Cs, that is, the voltage of the electric power line 8P. The electric power conversion device 4 has these sensors (not shown).

The electric power conversion device 4 has the drive circuit portion (not shown). The drive circuit portion generates the drive signal based on the drive instruction from the control circuit 6, and outputs the drive instruction to the gate electrode of switching elements Q1 and Q2 of the corresponding upper-lower arm 7. Thereby, the switching elements Q1 and Q2 are driven, that is, turned on and off. The drive circuit portion is provided, for example, for each arm.

The smoothing capacitor Cs is connected between the electric power lines 8P and 8N. The smoothing capacitor Cs is placed between the direct current power source 2 and the inverter 5. The smoothing capacitor Cs and the inverter 5 are connected in parallel. For example, the smoothing capacitor Cs smoothes the direct voltage supply from, for example, the direct current power source 2, and accumulates the electric charge of the direct voltage. The voltage between both ends of the smoothing capacitor Cs provides a DC high voltage for driving the motor generator 3.

The electric power conversion device 4 may further include a converter that is the electric power converter, a filter capacitor, and the like. The converter is a DC-DC converter that converts a DC voltage into the DC voltage having a different value. The converter is provided between the DC power supply 2 and the smoothing capacitor Cs. The converter boosts the direct voltage supplied from the direct current power source 2, for example. The converter can also have a step-down function. For example, the converter has the upper-lower arm and a reactor. The upper-lower arm of the converter may have the same configuration as that of the upper-lower arm 7. In the case of only the boost function, a configuration of a lower arm part of the converter may be same as that of the lower arm 7L of the inverter 5, and the upper part may be a diode. The filter capacitor is connected to the direct current power source 2 in parallel. For example, the filter capacitor removes a power source noise from the direct current power source 2.

<Structure of Semiconductor Device>

Next, the semiconductor device constituting the inverter 5 will be described. The upper-lower arm 7 is configured by one semiconductor module 10 described later. The semiconductor module 10 includes two types (two product numbers) of semiconductor devices 11 and 12 shown in FIGS. 2 to 8. The semiconductor device 11 constitutes the upper arm 7U, and the semiconductor device 12 constitutes the lower arm 7L.

Figure 5:
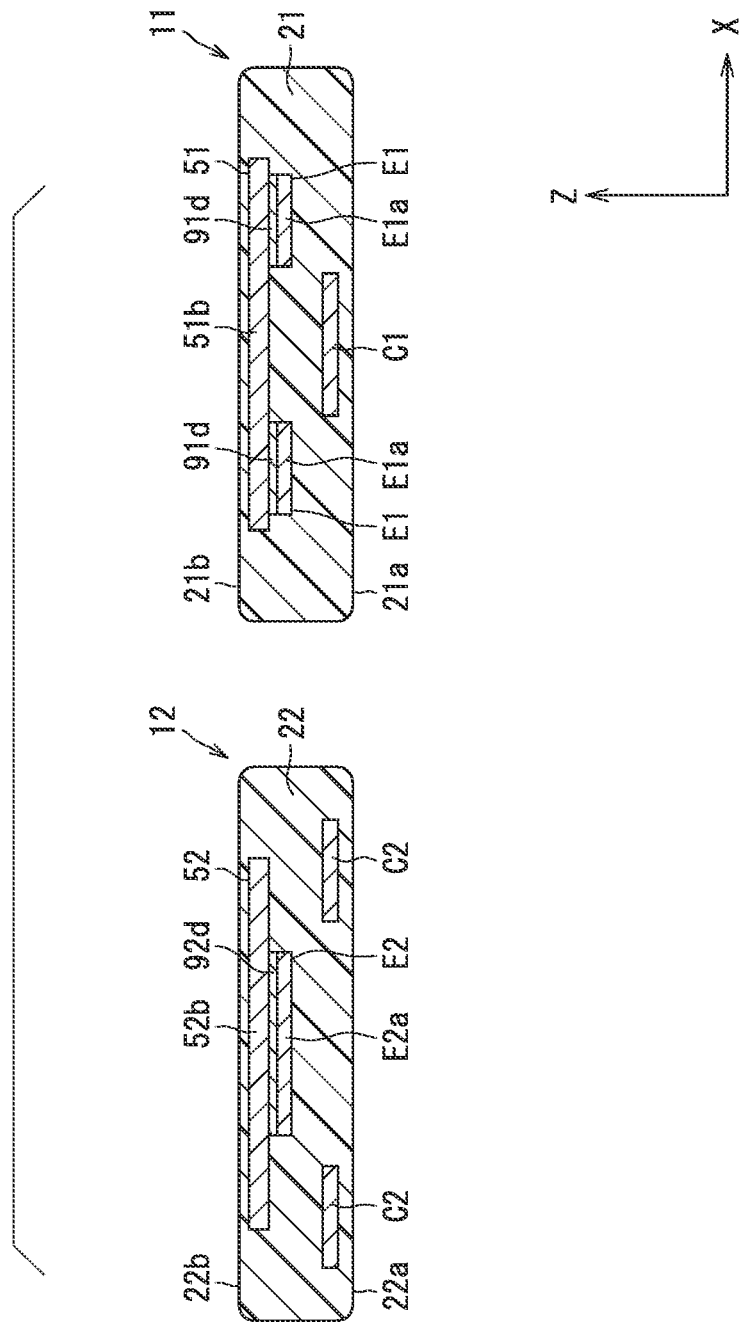
FIG. 5 is a cross-sectional view taken along a line V-V of FIG. 2.
Figure 6:
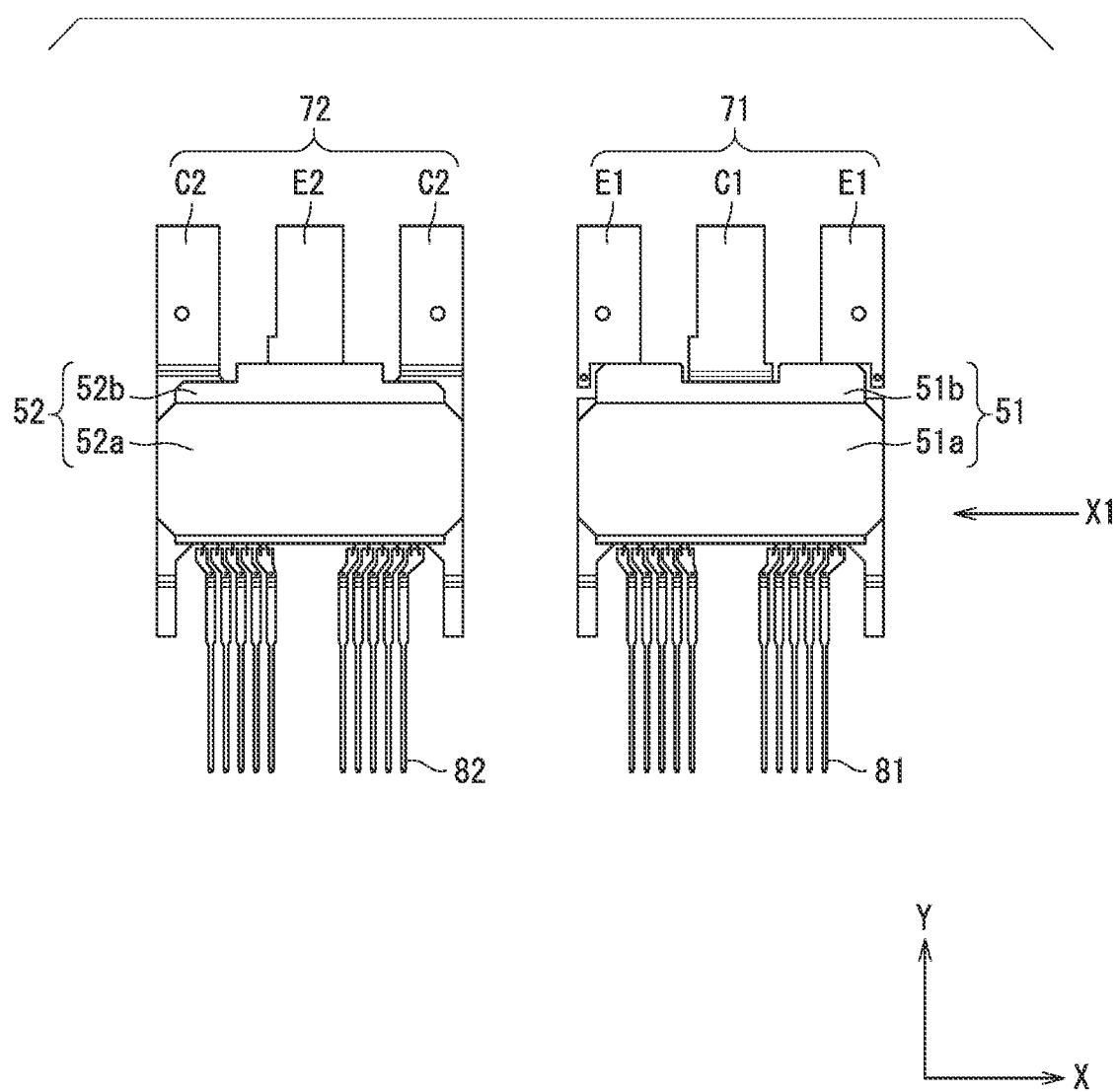
FIG. 6 is a plan view showing a state where a sealing resin body is omitted.
Figure 7:
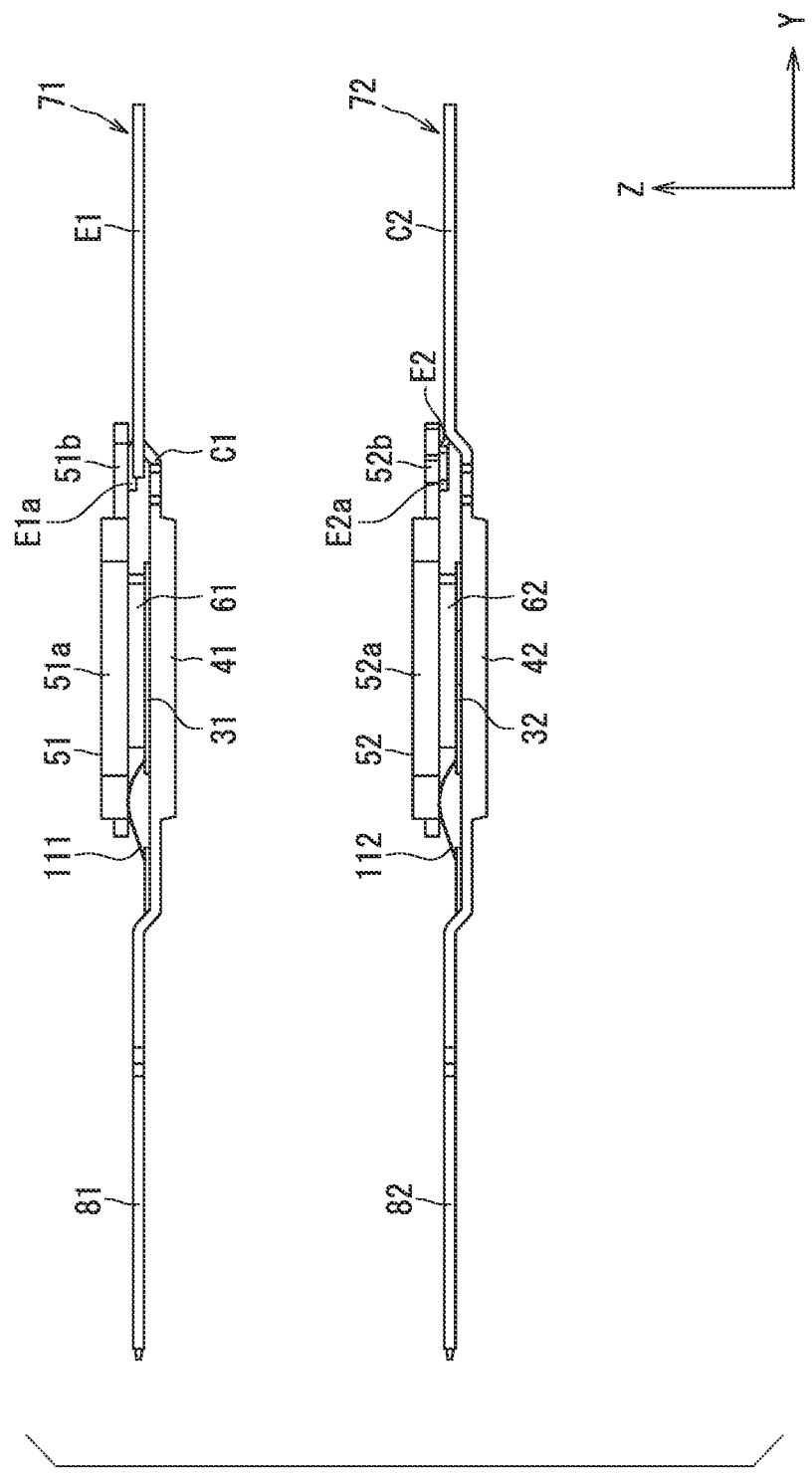
FIG. 7 is a plan view of FIG. 6 as seen from an X1 direction.
Figure 8:
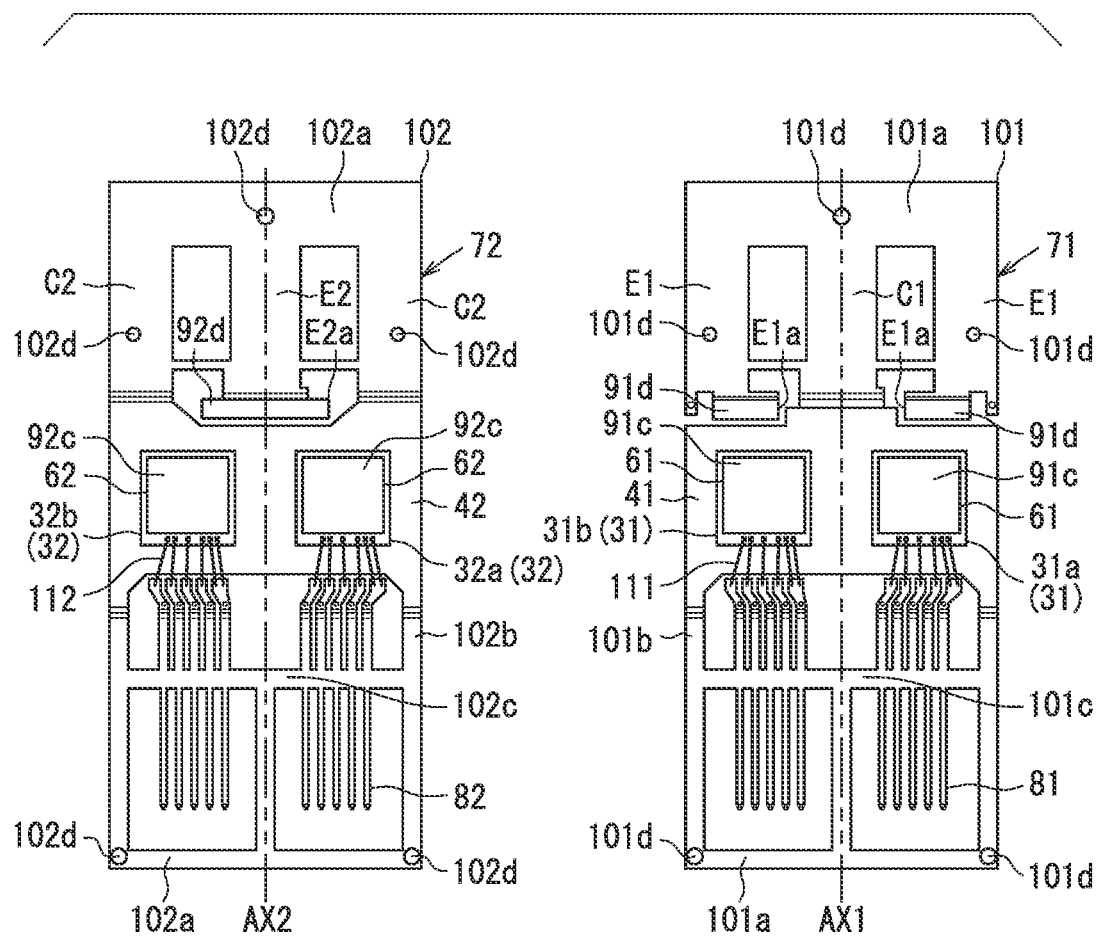
FIG. 8 is a plan view showing a state where a heat sink close to an emitter is omitted.

The specifications of the semiconductor devices 11 and 12 are different from each other. In FIGS. 2 to 8, a plate thickness direction of each semiconductor element is set to a Z direction, a direction orthogonal to the Z direction is set to the X direction in which at least two semiconductor elements are arranged, and a direction orthogonal to the Z direction and the X direction is set to a Y direction. Unless otherwise specified, a shape along an XY plane defined by the X direction and the Y direction is a planar shape. In FIGS. 2 to 8, for convenience, the two semiconductor devices 11 and 12 are shown side by side. In FIGS. 6 to 8, the sealing resin body is omitted. Further, in FIG. 8, a heat sink close to the emitter is omitted. FIG. 8 shows, for convenience, a state of a lead frame before unnecessary portions such as tie bars are removed.

First, the semiconductor device 11 for the upper arm 7U will be described. For the elements of the semiconductor device 11, the end of the reference numeral is set to "1". As shown in FIGS. 2 to 8, the semiconductor device 11 includes a sealing resin body 21, a semiconductor element 31, heat sinks 41 and 51, a terminal 61, a main terminal 71, and a signal terminal 81.

The sealing resin body 21 seals the corresponding semiconductor element 31 and the like. The sealing resin body 21 is made of, for example, an epoxy resin. The sealing resin body 21 is formed by, for example, a transfer molding method. As shown in FIGS. 2 to 5, the sealing resin body 21 has a substantially rectangular parallelepiped shape. The sealing resin body 21 has a substantially rectangular shape in plan view.

The semiconductor element 31 is provided by forming the switching element Q1 and the diode D1 on the semiconductor substrate. On the semiconductor element 31, a RC(Reverse Conducting)-IGBT is formed. The semiconductor element 31 is also referred to as a semiconductor chip. The semiconductor element 31 has a vertical structure so that the current flows in the Z direction.

Figure 4:
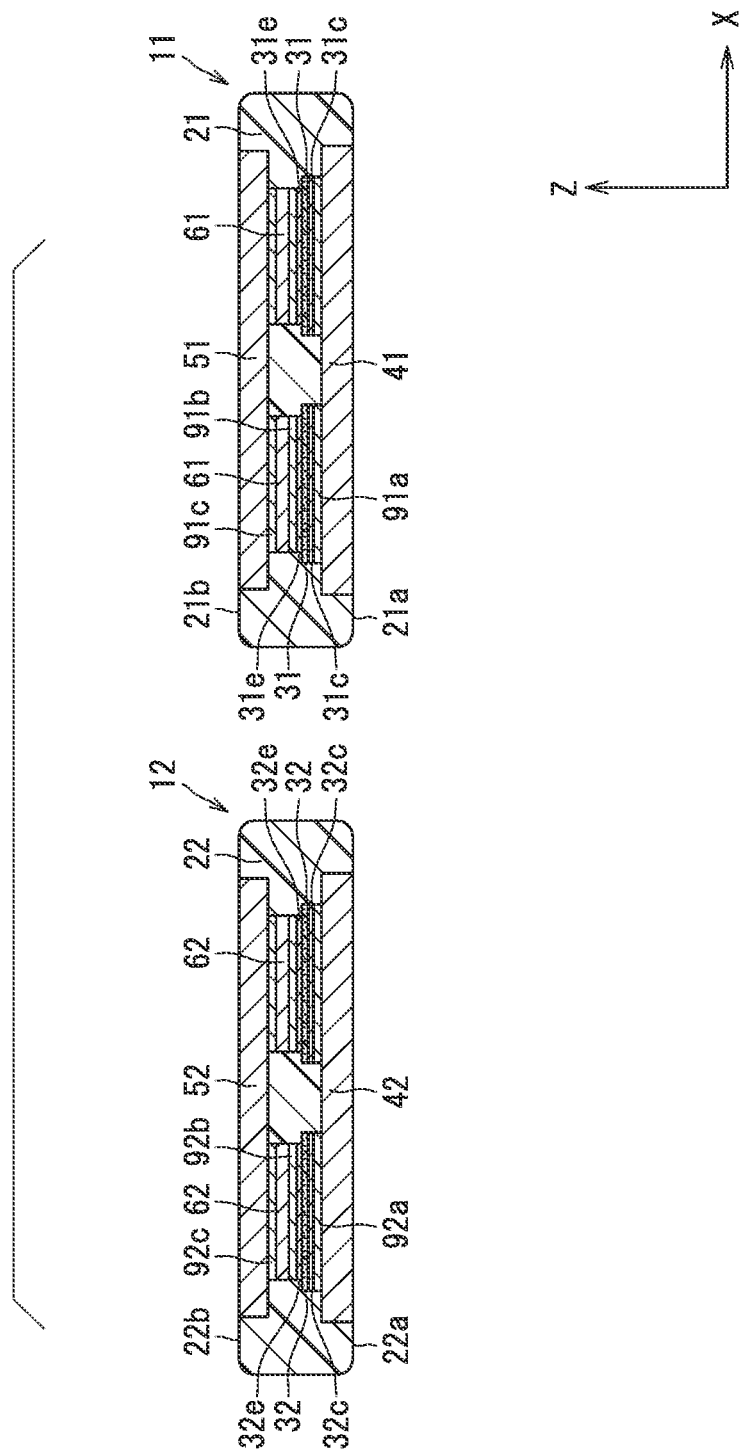
FIG. 4 is a cross-sectional view taken along a line IV-IV of FIG. 2.

As shown in FIG. 4, in the Z direction, a collector electrode 31c is formed on one surface of the semiconductor element 31, and an emitter electrode 31e is formed on a rear surface opposite to the one surface. The collector electrode 31c serves as a cathode electrode of the diode D1, and the emitter electrode 31e serves as an anode electrode of the diode D1. The collector electrode 31c is an electrode on the high potential side, and the emitter electrode 31e is an electrode on the low potential side. On the emitter electrode formation surface, a pad (not shown) that is an electrode for signals is also formed.

The semiconductor device 11 includes multiple semiconductor elements 31. The multiple semiconductor elements 31 are connected in parallel to form the upper arm 7U. In the present embodiment, the semiconductor device 11 includes two semiconductor elements 31. As shown in FIG. 4 and FIG. 8, the two semiconductor elements 31 have the substantially same configuration, in other words, have the same shape and the same size. The semiconductor element 31 has a substantially rectangular shape in a plane. The two semiconductor elements 31 are arranged so that the collector electrodes 31c are on the same side in the Z direction. The two semiconductor element 31 are positioned at substantially the same height in the Z direction and are arranged in the X direction.

Figure 2:
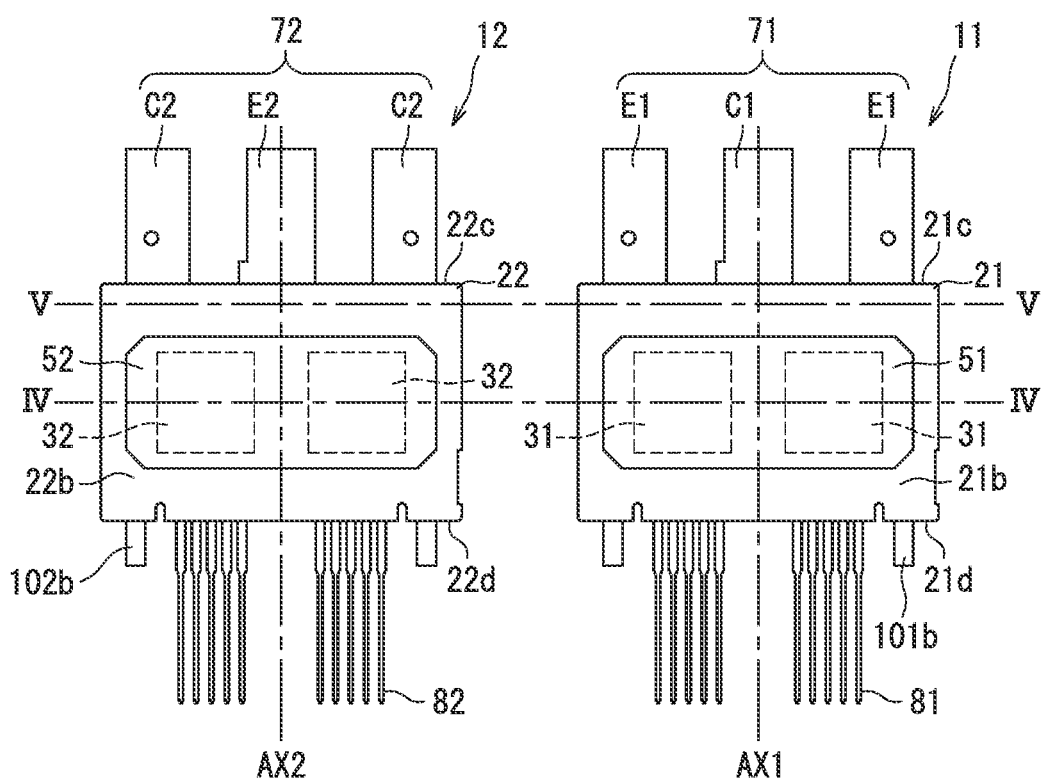
FIG. 2 is a plan view showing a semiconductor device according to a first embodiment.

As shown in FIG. 2 and FIG. 8, the two semiconductor elements 31 are placed in line symmetry with an axis AX1, as a symmetry axis, orthogonal to the X direction and the Z direction. In the present embodiment, the sealing resin body 21 has a substantially rectangular planar shape, and the two semiconductor elements 31 are placed so that the axis AX1 substantially coincides with a center of an outer shape of the sealing resin body 21 in the X direction.

The heat sinks 41 and 51 have a function of dissipating heat of the semiconductor element 31 to the outside of the semiconductor device 11. The heat sinks 41 and 51 are also referred to as heat dissipation members. The heat sinks 41 and 51 are electrically connected to the semiconductor element 31 and function as wirings. The heat sinks 41 and 51 are also referred to as wiring members. The heat sinks 41 and 51 are formed of a metal material such as copper. The heat sinks 41 and 51 are also referred to as metal members.

The heat sinks 41 and 51 are arranged so as to sandwich the multiple semiconductor elements 31. In the Z direction, between the heat sinks 41 and 51, two semiconductor elements 31 are arranged side by side. The heat sinks 41 and 51 include the semiconductor elements 31 in a projection view from the Z direction. The plate thickness direction of each of the heat sinks 41 and 51 is substantially parallel to the Z direction. As shown in FIG. 2, FIG. 6, and FIG. 8, in the heat sinks 41 and 51, the X direction is the longitudinal direction (long-side direction), and the Y direction is the short-side direction.

The heat sinks 41 and 51 are electrically connected to the semiconductor element 31 via a connection member such as solder. As shown in FIG. 4, the heat sink 41 is connected to the collector electrode 31c via a solder 91a. The heat sink 51 is connected to the emitter electrode 31e via solders 91b and 91c and the terminal 61. The terminal 61 is a metal member that electrically relays the semiconductor element 31 and the heat sink 51. The terminal 61 has a shape so as to substantially coincide with the emitter electrode 31e in the projection view from the Z direction. The terminal 61 has a substantially rectangular shape in a plane. The heat sink 51 is connected to the terminal 61 via the solder 91c. In the terminal 61, a surface far from the heat sink 51 is connected to the emitter electrode 31e via the solder 91b.

As shown in FIG. 2, FIG. 6, and FIG. 7, the heat sink 51 has a main portion 51a, and a joint portion 51b. One surface of the main portion 51a is connected to the semiconductor element 31 via the terminal 61. The joint portion 51b is continuous from the main portion 51a. The joint portion 51b is integrally provided with the main portion 51a as one member. The joint portion 51b extends from one end of the main portion 51a in the Y direction. The joint portion 51b is thinner than the main portion 51a.

Most of each of the heat sinks 41 and 51 is covered with the sealing resin body 21. Among surfaces of each of the heat sinks 41 and 51, a surface far from the semiconductor element 31 is exposed from the sealing resin body 21. In the Z direction, the heat sink 41 is exposed from one surface 21a of the sealing resin body 21, and the heat sink 51 is exposed from a rear surface 21b opposite to the one surface 21a. The exposed surface of the heat sink 41 is substantially flush with the one surface 21a, and the exposed surface of the heat sink 51 is substantially flush with the rear surface 21b.

The main terminal 71 is a terminal through which a main current flows among the external connection terminals. The semiconductor device 11 includes three or more main terminals 71. The main terminal 71 has a collector terminal C1 and an emitter terminal E1. The collector terminal C1 is continuous from the heat sink 41. The collector terminal C1 is electrically connected to the collector electrode 41c via the heat sink 41. The emitter terminal E1 is continuous from the heat sink 51. The emitter terminal E1 is electrically connected to the emitter electrode 31e via the heat sink 51 and the terminal 61.

The semiconductor device 11 includes three main terminals 71. As shown in FIG. 2, FIG. 3, FIG. 6, and FIG. 8, the main terminal 71 includes one collector terminal C1 and two emitter terminals E1. As shown in FIG. 8, a lead frame 101 includes the heat sink 41, the collector terminal C1 and the emitter terminal E1 that are the main terminals 71, and the signal terminal 81.

The heat sink 41 is thicker than the other parts of the lead frame 101, that is, the main terminal 71 and the signal terminal 81. The main terminal 71 and the signal terminal 81 are substantially flush with an element mounting surface of the heat sink 41. The ends of multiple main terminals 71 on the same side are continuous from an outer frame 101a. The heat sink 41 is fixed to the outer frame 101a via the collector terminal C1 and a suspension lead 101b. The signal terminal 81 is fixed to the suspension lead 101b via a tie bar 101c. The lead frame 101 is provided with multiple reference holes 101d for positioning.

The heat sink 41 is provided integrally with the collector terminal C1 as one member. The collector terminal C1 has a bent portion in the sealing resin body 21, and projects outward from the vicinity of the center, in the Z direction, of one side surface 21c of the sealing resin body 21. Each emitter terminal E1 includes a facing portion E1a facing the joint portion 51b of the heat sink 51. As shown in FIG. 5, the facing portion E1a is connected to the joint portion 51b via a solder 91d. The emitter terminal E1 includes the bent portion in the sealing resin body 21, and projects outward from the vicinity of the center, in the Z direction, of the side surface 21c that is same as the side surface 21c from which the collector terminal C1 projects. All main terminals 71 project from the side surface 21c. In the heat sink 51, for example, an annular groove (not shown) is formed so that each of connection portions with the solders 91c and 91d is covered. The overflowing solder is stored in the groove. In order to prevent the solder from wetting and spreading, a roughened portion obtained by roughening plating or laser light irradiation may be provided instead of the groove.

Figure 3:
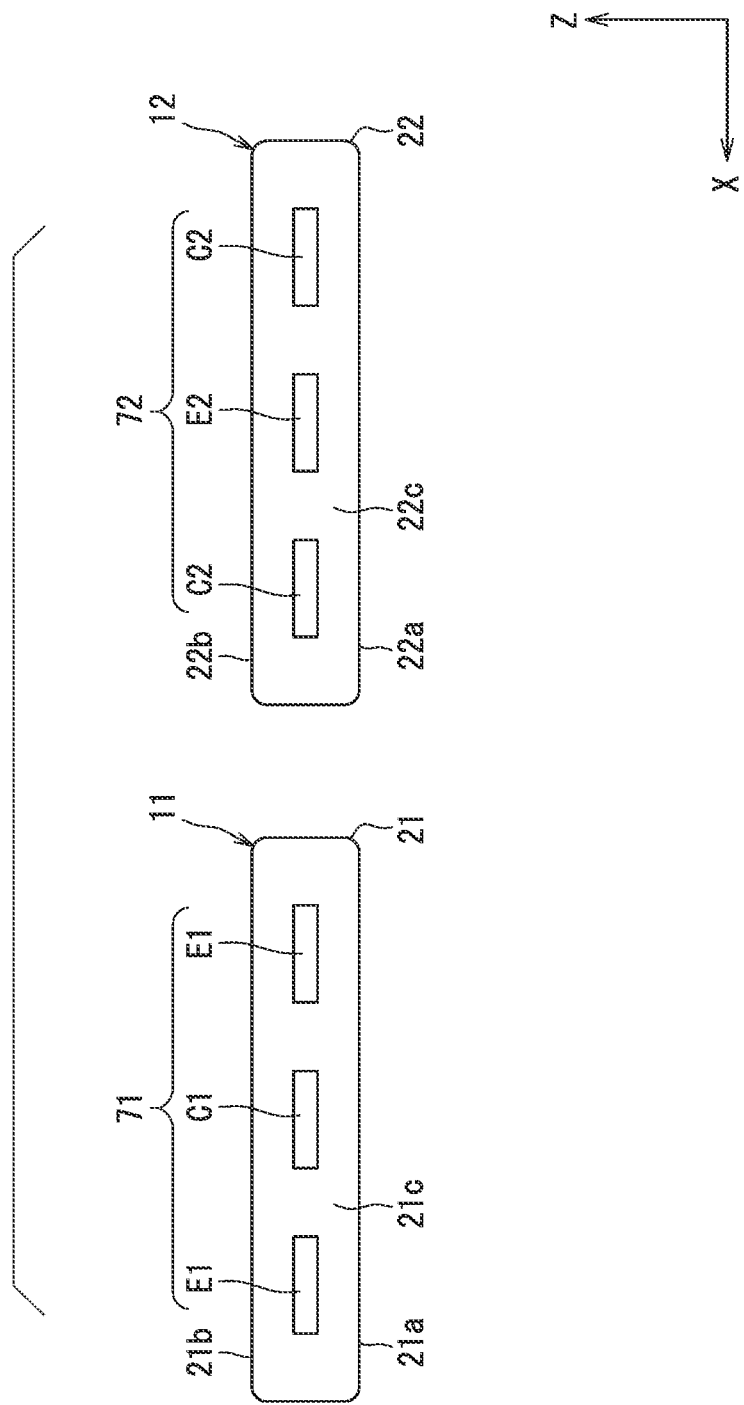
FIG. 3 is a plan view of the semiconductor device seen from a main terminal side.

The protrusion portion of the collector terminal C1 and the emitter terminal E1 extend in the Y direction. The collector terminal C1 and the emitter terminal E1 are arranged in the X direction, and each plate thickness direction substantially coincides with the Z direction. As shown in FIG. 3, in the X direction, the collector terminal C1 is placed between the emitter terminals E1. The arrangement order of the main terminals 71 is set so that the main terminals 71 are symmetrical with respect to the center of arrangement. The main terminals 71 are arranged in order of the emitter terminal E1, the collector terminal C1, and the emitter terminal E1.

As shown in FIG. 2 and FIG. 8, the collector terminal C1 and the emitter terminal E1 are placed symmetrically with respect to the axis AX1 as the symmetry axis. The collector terminal C1 is disposed on the axis AX1, and the center of the width of the collector terminal C1 substantially coincides with the axis AX1. The two emitter terminals E1 are arranged in line symmetry with the axis AX1 as the symmetry axis. In the followings, as shown in FIG. 8, one semiconductor element 31 may be also shown as a semiconductor element 31a, and another semiconductor element 31 may be also shown as a semiconductor element 31b. One of the emitter terminals E1 is placed close to the semiconductor element 31a with respect to the axis AX1, and the other of the emitter terminals E1 is placed close to the semiconductor element 31b with respect to the axis AX1.

The signal terminal 81 is connected to the pad of the corresponding semiconductor element 31. The signal terminal 81 is connected to a pad via a bonding wire 111 inside the sealing resin body 21. The signal terminal 81 projects outward from a side surface of the sealing resin body 21, specifically, a side surface 21d opposite to the side surface 21c. The signal terminal 81 projects in the Y direction away from the main terminal 71.

In the semiconductor device 11 described above, the sealing resin body 21 integrally seals the semiconductor element 31, a part of each of the heat sinks 41 and 51, the terminal 61, and a part of each of the main terminal 71 and the signal terminal 81.

Next, the semiconductor device 12 for the lower arm 7L will be described. For the elements of the semiconductor device 12, the end of the reference numeral is set to "2". The semiconductor device 12 includes a sealing resin body 22, the semiconductor element 32, heat sinks 42 and 52, a terminal 62, a main terminal 72, and a signal terminal 82. The semiconductor device 12 has the same components as the semiconductor device 11, and has the substantially same structure. Therefore, different parts will be mainly described.

The sealing resin body 22 seals the semiconductor element 32 and the like. As shown in FIG. 4, in the Z direction, a collector electrode 32c is formed on one surface of the semiconductor element 32, and an emitter electrode 32e is formed on a rear surface opposite to the one surface. The semiconductor device 12 includes multiple semiconductor elements 32. The multiple semiconductor elements 32 are connected in parallel to form the lower arm 7L. In the present embodiment, the semiconductor device 12 includes two semiconductor element 32. The two semiconductor element 32 have the same structure. The two semiconductor element 32 are positioned at substantially the same height in the Z direction and are arranged in the X direction.

As shown in FIG. 2 and FIG. 8, the two semiconductor elements 32 are arranged in line symmetry with an axis AX2, as a symmetry axis, orthogonal to the X direction and the Z direction. In the present embodiment, the sealing resin body 22 has a substantially rectangular planar shape, and the two semiconductor elements 32 are placed so that the axis AX2 substantially coincides with a center of an outer shape of the sealing resin body 22 in the X direction.

The heat sinks 42 and 52 are arranged so as to sandwich the multiple semiconductor elements 32. The plate thickness direction of each of the heat sinks 42 and 52 is substantially parallel to the Z direction. As shown in FIG. 2, FIG. 6, and FIG. 8, in the heat sinks 42 and 52, the X direction is the longitudinal direction (long-side direction), and the Y direction is the short-side direction. As shown in FIG. 4, the heat sink 42 is connected to the collector electrode 32c via a solder 92a. The heat sink 52 is connected to the emitter electrode 32e via solders 92b and 92c and the terminal 62.

The heat sink 52 has a main portion 52a connected to the semiconductor element 32 via the terminal 62 and a joint portion 52b continuous from the main portion 52a. As shown in FIG. 7, the joint portion 52b extends from one end of the main portion 52a in the Y direction. The joint portion 52b is thinner than the main portion 52a. The heat sink 42 is exposed from one surface 22a of the sealing resin body 22, and the heat sink 52 is exposed from a rear surface 22b opposite to the one surface 22a. The exposed surface of the heat sink 42 is substantially flush with the one surface 22a, and the exposed surface of the heat sink 52 is substantially flush with the rear surface 22b.

The semiconductor device 12 includes three or more main terminals 72. The main terminal 72 has a collector terminal C2 and an emitter terminal E2. The collector terminal C2 is electrically connected to the collector electrode 42c via the heat sink 42. The emitter terminal E2 is electrically connected to the emitter electrode 32e via the heat sink 52 and the terminal 62. The number of main terminals 72 included in the semiconductor device 12 is same as the number of main terminals in the semiconductor device 11. The main terminal 72 has two collector terminals C2 and one emitter terminal E2. As shown in FIG. 8, a lead frame 102 includes the heat sink 42, the collector terminals C2 and the emitter terminal E2 that are the main terminals 72, and the signal terminal 82. The reference numeral of 102a shown in FIG. 8 indicates an outer frame, the reference numeral of 102b indicates a suspension lead, the reference numeral of 102c indicates a tie bar, and the reference numeral of 102d indicates a reference hole.

The heat sink 42 is provided integrally with the collector terminal C2 as one member. The collector terminal C2 has a bent portion in the sealing resin body 22, and projects outward from the vicinity of the center, in the Z direction, of one side surface 22c of the sealing resin body 22. The emitter terminal E2 includes a facing portion E2a facing the joint portion 52b of the heat sink 52. The facing portion E2a is connected to the joint portion 52b via a solder 92d. The emitter terminal E2 include the bent portion in the sealing resin body 22, and projects outward from the vicinity of the center, in the Z direction, of the side surface 22c that is the same side surface from which the collector terminal C2 projects. In the heat sink 52, for example, an annular groove (not shown) is formed so that each of connection portions with the solders 92c and 92d is covered.

The protrusion portions of the collector terminal C2 and the emitter terminal E2 extend in the Y direction. The collector terminal C2 and the emitter terminal E2 are arranged in the X direction, and each plate thickness direction substantially coincides with the Z direction. As shown in FIG. 3, in the X direction, the emitter terminal E2 is placed between the collector terminals C2. The arrangement order of the main terminals 72 is set so that the main terminals 72 are symmetrical with respect to the center of arrangement. The main terminals 72 are arranged in order of the collector terminal C2, the emitter terminal E2, and the collector terminal C2. The arrangement order of the main terminals 72 is opposite to that of the main terminals 71.

As shown in FIG. 2 and FIG. 8, the collector terminal C2 and the emitter terminal E2 are placed symmetrically with the axis AX2 as the symmetry axis. The emitter terminal E2 is placed on the axis AX2, and the center of a width of the emitter terminal E2 substantially coincides with the axis AX2. The two collector terminals C2 are arranged in line symmetry with the axis AX2 as the symmetry axis. In the followings, as shown in FIG. 8, one semiconductor element 32 may be also shown as a semiconductor element 32a, and another semiconductor element 32 may be also shown as a semiconductor element 32b. One of the collector terminals C2 is placed close to the semiconductor element 32a with respect to the axis AX2, and the other of the collector terminals C2 is placed close to the semiconductor element 32b with respect to the axis AX2.

The signal terminal 81 is connected to a pad of the semiconductor element 32 via a bonding wire 112 inside the sealing resin body 22. The signal terminal 82 projects outward from a side surface 22d opposite to the side surface 22c of the sealing resin body 21.

<Manufacturing Method of Semiconductor Device>

Next, a manufacturing method of the semiconductor devices 11 and 12 will be described. A manufacturing process (step) for the semiconductor device 11 is same as that for the semiconductor device 12. Therefore, an example in the case of the semiconductor device 11 will be described.

First, each component of the semiconductor device 11 is prepared. The lead frame 101 shown in FIG. 8 is prepared. Further, the semiconductor element 31, the terminal 61, and the heat sink 51 are prepared.

Next, the semiconductor element 31 is placed on a mounting surface of the heat sink 41 of the lead frame 101 via the solder 91a. The semiconductor element 31 is placed on the solder 91a so that the collector electrode 31c is close to the mounting surface. Next, on the emitter electrode 31e, the terminal 61 is placed via the solder 91b. The solder 91c is placed on a surface of the terminal 61, the surface being opposite to the surface close to the semiconductor element 31. The solder 91 has an amount capable of absorbing the height variation in the semiconductor device 11. The solders 91b and 91c may be placed as preliminary solders, on the terminal 61 in advance. Further, the solder 91d is placed on the facing portion E1a of the emitter terminal E1.

In this laminated state, 1st reflow is performed. Thereby, the collector electrode 31c of the semiconductor element 31 and the heat sink 41 are connected via the solder 91a. Further, the emitter electrode 31e of the semiconductor element 31 and the corresponding terminal 61 are connected via the solder 91b. That is, it is possible to obtain a connector in which the lead frame 101, the semiconductor element 31, and the terminal 61 are integrated. The solders 91c and 91d are preliminary solders used in the subsequent process in the connector.

Next, the pad of the semiconductor element 31 is electrically connected to the signal terminal 81. In the present embodiment, the bonding wire 111 connects the pad of the semiconductor element 31 and the signal terminal 81.

Next, the heat sink 41 is placed on a pedestal (not shown) so that the terminal 61 is located at the upper position. Then, the heat sink 51 is placed on the heat sink 41 so that the mounting surface close to the terminal 61 is positioned under the heat sink 51. In this arrangement state, 2nd reflow is performed. By the 2nd reflow, the heat sink 51 is integrated with the connector including the lead frame 101.

Next, the sealing resin body 21 is formed. In the present embodiment, the transfer mold method is adopted. The connector including the lead frame 101 is placed in a mold to form the sealing resin body 21. In the present embodiment, the sealing resin body 21 is formed so that the heat sinks 41 and 51 are completely covered.

Next, unnecessary parts of the lead frame 101 such as the outer frame 101a and the tie bar 101c are removed. Thereby, the semiconductor device 11 can be obtained.

<Schematic Structure of Semiconductor Module>

Figure 9:
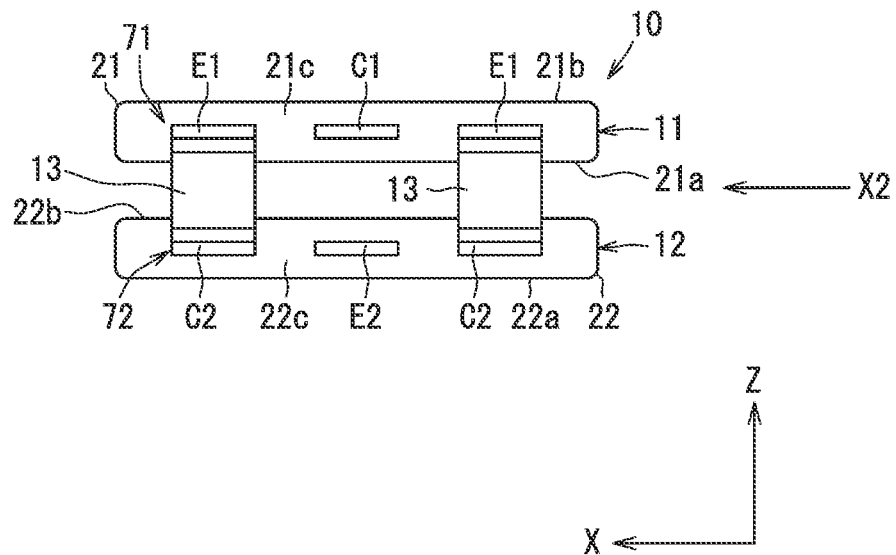
FIG. 9 is a plan view showing a semiconductor module according to the first embodiment.
Figure 10:
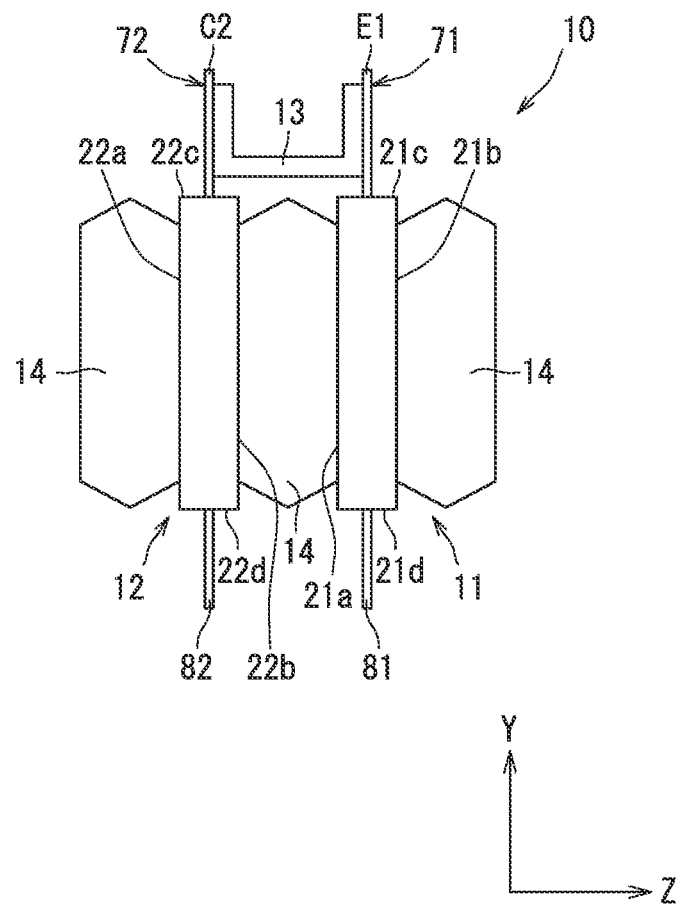
FIG. 10 is a plan view of FIG. 9 as seen from an X2 direction.

Next, a schematic structure of the semiconductor module will be described. One semiconductor module constitutes the upper-lower arm 7 for one phase. Three semiconductor modules constitute the inverter 5. As shown in FIG. 9 and FIG. 10, the semiconductor module 10 includes the above-described semiconductor devices 11 and 12, a connection member 13, and a cooler 14. In FIG. 9, for convenience, the cooler 14 is omitted.

The cooler 14 is formed of a material having excellent thermal conductivity, for example, an aluminum-based material. The cooler 14 has a flat tubular body as a whole. In order to cool the semiconductor devices 11 and 12 that generate heat during operation, the semiconductor devices 11 and 12 and the cooler 14 are alternately laminated. The semiconductor devices 11 and 12 and the cooler 14 are arranged in the Z direction. Each of the semiconductor devices 11 and 12 is sandwiched by the cooler 14. The cooler 14 cools the semiconductor devices 11 and 12 from both surfaces.

The cooler 14 is connected to an introduction pipe (not shown) and a discharge pipe (not shown). When the refrigerant is supplied to the introduction pipe via a pump (not shown), the refrigerant flows in a path in the laminated cooler 14. Thereby, each of the semiconductor devices 11 and 12 is cooled by the refrigerant. The refrigerant flowing through the cooler 14 is discharged via the discharge pipe.

In the semiconductor device 11, the collector terminal C1 on the high potential side is electrically connected to the electric power line 8P. The emitter terminal E1 on the low potential side is the output terminal. The collector terminal C1 is also referred to as a P terminal and the positive electrode terminal. The output terminal is also referred to as an O terminal. In the semiconductor device 12, the collector terminal C2 on the high potential side is the output terminal. The emitter terminal E2 on the low potential side is electrically connected to the electric power line 8N. The collector terminal C2 is also referred to as the O terminal. The emitter terminal E2 is also referred to as a N terminal and the negative electrode terminal.

As shown in FIG. 9 and FIG. 10, a set of semiconductor devices 11 and 12 constituting the upper-lower arm 7 are arranged so as to be adjacent to each other via the cooler 14. The semiconductor devices 11 and 12 are arranged so that the collector terminal C1 and the emitter terminal E2 face each other and the emitter terminal E1 and the collector terminal C2 face each other. The facing state is a state where plate surfaces of at least a part of protrusion portions from the corresponding sealing resin bodies 21 and 22 face each other. In the present embodiment, the protrusion portions from the corresponding sealing resin bodies 21 and 22 face each other in almost the entire area.

The connection member 13 is a member that connects the semiconductor devices 11 and 12. The connection member 13 is a wiring that electrically connects the upper arm 7U and the lower arm 7L. The connection member 13 electrically connects the collector terminal C2 and the emitter terminal E1 that is the output terminal. One semiconductor module 10 includes two connection members 13 for connecting two sets of output terminals.

The connection member 13 is formed by processing a metal plate, for example. The connection member 13 is also referred to as a cross-linking member and a connecting bus bar. The connection member 13 is connected to the emitter terminal E1 and the collector terminal C2 by welding, for example. The connection member 13 of the present embodiment has a substantially U-shape. One end of the connection member 13 is connected to the emitter terminal E1, and the other end is connected to the collector terminal C2. The connection member 13 is placed so that the corresponding output terminal and the plate surfaces face each other, and is connected in this arrangement state. Two connection members 13 have the same structure.

Figure 11:
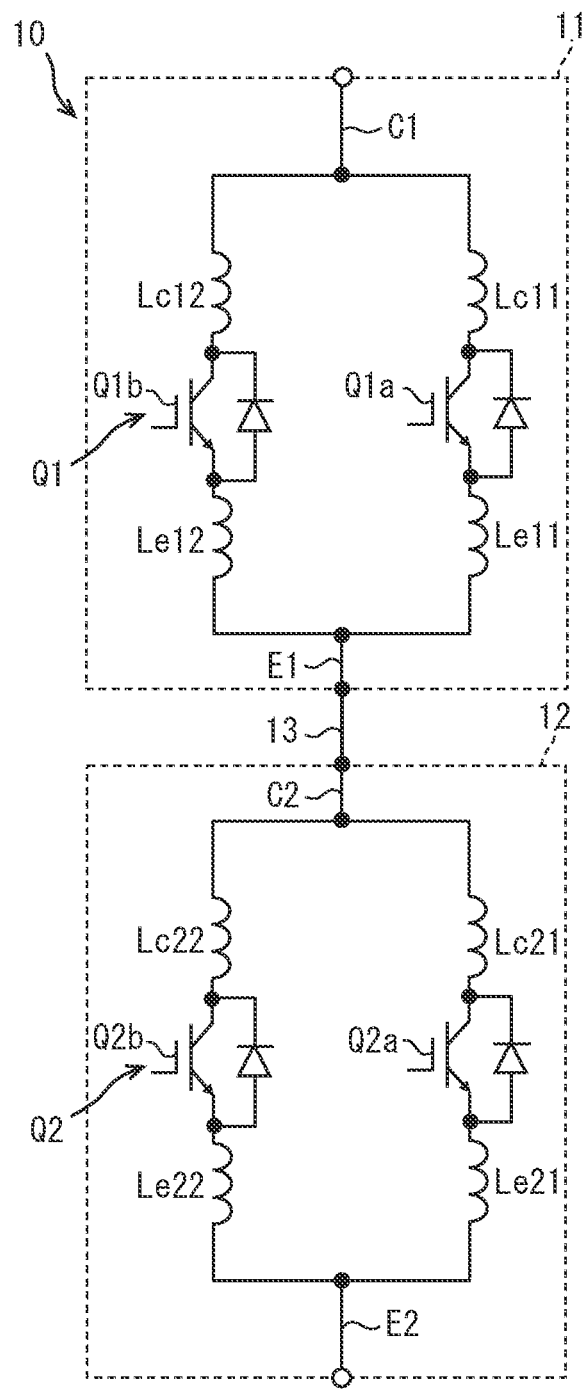
FIG. 11 is an equivalent circuit of the semiconductor module in consideration of a wiring inductance.

FIG. 11 is an equivalent circuit diagram in consideration of a wiring inductance (parasitic inductance) of the semiconductor module 10, that is, the upper-lower arm 7. In FIG. 11, among the switching elements Q1, a switching element formed on the semiconductor element 31a is shown as Q1a, and a switching element formed on the semiconductor element 31b is shown as Q1b. Further, among the switching elements Q2, a switching element formed on the semiconductor element 32a is shown as Q2a, and a switching element formed on the semiconductor element 32b is shown as Q2b. A Lc11, a Lc12, a Le11, and a Le12 indicate the wiring inductances of the parallel circuit of the switching element Q1. A Lc21, a Lc22, a Le21, and a Le22 indicate the wiring inductances of the parallel circuit of the switching element Q2.

As described above, the semiconductor devices 11 and 12 respectively include three or more main terminals 71 and 72. That is, the semiconductor device 11 includes at least multiple collector terminals C1 or multiple emitter terminals E1. Further, the semiconductor device 12 includes at least multiple collector terminals C2 or multiple emitter terminals E2. Multiple same type main terminals are provided and used in parallel. For example, the emitter terminals E1 are parallelized, and the collector terminals C2 are parallelized. Thereby, it is possible to reduce the inductance of the main terminal.

The arrangement order of the main terminals 71 of the semiconductor device 11 is opposite to that of the main terminals 72 of the semiconductor device 12. The number of emitter terminals E1 that are the output terminals are same as the number of collector terminals C2. Accordingly, as compared with a case where the upper-lower arm is constituted by a semiconductor device having the same type (one type), it is possible to simplify the connection structure of the output terminals, so that it is possible to reduce the inductance of the main circuit wiring. The main circuit is a circuit including the smoothing capacitor Cs and the upper-lower arm 7.

The arrangement order of the collector terminal C1 and the emitter terminals E1 is symmetrical with respect to the center of the arrangement. As compared with the asymmetrical configuration, wiring inductances Lc11 and Lc12 can be brought closer to each other, and wiring inductances Le11 and Le12 can be brought closer to each other. Further, the arrangement of the collector terminals C2 and the emitter terminal E2 is symmetrical with the center of the arrangement. As compared with the asymmetrical configuration, wiring inductances Lc21 and Lc22 can be brought closer to each other, and wiring inductances Le21 and Le22 can be brought closer to each other. As described above, in each of the semiconductor devices 11 and 12, it is possible to prevent current imbalance flowing at the time of switching, that is, the imbalance of the AC current.

In the semiconductor device 11, when the arrangement is symmetrical, the number of collector terminals C1 and emitter terminals E1 that are adjacent to each other in the X direction increases. The side surfaces of the collector terminal C1 and the emitter terminal E1 adjacent to each other face each other. It may be possible to reduce the inductance by the effect of canceling the magnetic flux. Similarly, in the semiconductor device 12, it is possible to reduce the inductance.

Multiple semiconductor elements 31 are arranged to be symmetrical with respect to an axis A1X orthogonal to the X direction that is the arrangement direction. The collector terminal C1 and the emitter terminal E1 are arranged in line symmetry with an axis A2X as the symmetry axis. Thereby, a current path from the collector terminal C1 to the emitter terminal E2 via the switching element Q1a and a current path from the collector terminal C1 to the emitter terminal E2 via the switching element Q1b are substantially symmetrical with respect to the axis A1X. That is, the wiring inductances Lc11 and Lc12 are substantially equal to each other. The wiring inductances Le11 and Le12 are substantially equal to each other. Accordingly, in the semiconductor device 11, it is possible to effectively prevent the imbalance of the AC current.

Similarly, multiple semiconductor elements 32 are arranged to be symmetrical with respect to the axis A2X orthogonal to the X direction that is the arrangement direction. The collector terminal C2 and the emitter terminal E2 are arranged in line symmetry with the axis A2X as the symmetry axis. Thereby, a current path from the collector terminal C2 to the emitter terminal E2 via the switching element Q2a and a current path from the collector terminal C2 to the emitter terminal E2 via the switching element Q2b are substantially symmetrical with respect to the axis A2X. That is, the wiring inductances Lc21 and Lc22 are substantially equal to each other. The wiring inductances Le21 and Le22 are substantially equal to each other. Accordingly, in the semiconductor device 12, it is possible to effectively prevent the imbalance of the AC current.

In the present embodiment, the centers of the arranged semiconductor elements 31 are completely coincident in the Y direction. Further, the centers of the arranged semiconductor elements 32 are completely coincident in the Y direction. Thereby, it is possible to more effectively prevent the imbalance of the AC current. However, the arrangement is not limited to the arrangement in which the centers are completely coincident. Also when there is a slight deviation in the Y direction between the centers, it is possible to obtain the similar effect to the above effect.

Further, the main terminals 71 and 72 are connected to the bus bar and the like for electrical connection with the smoothing capacitor Cs and the motor generator 3. The bus bar is welded, for example. When, in the main terminals 71 and 72, portions forming at least the current path, that is, portions to the connection position with the bus bar are line-symmetrical, it is possible to obtain the above effect.

The axis AX1 substantially coincides with the center, in the X direction, of the outer shape of the sealing resin body 21. Thereby, it is possible to obtain the above effect while reducing the size of the semiconductor device 11. Similarly, the axis AX2 substantially coincides with the center, in the X direction, of the outer shape of the sealing resin body 22. Thereby, it is possible to obtain the above effect while reducing the size of the semiconductor device 12.

The multiple connection members 13 connect the semiconductor devices 11 and 12. It is possible to reduce the inductance of the main circuit wiring by increasing the number of connection paths of the upper arm 7U and lower arm 7L.

All the main terminals 71 project from the side surface 21c of the sealing resin body 21 and are arranged along the X direction. All the main terminals 72 project from the side surface 22c of the sealing resin body 22 and are arranged along the X direction. As a result, the connection between the upper arm 7U and the lower arm 7L and the connection with the smoothing capacitor Cs can be simplified, and the inductance of the main circuit wiring can be reduced.

The protruding portions of the collector terminal C1 and the emitter terminal E2 face each other in the substantially entire area, and the protrusion portions of the emitter terminal E1 and the collector terminal C2 face each other in the substantially entire area. Therefore, the inductance of the main circuit wiring can be effectively reduced.

The heat sinks 41 and 51 are provided with multiple common semiconductor elements 31. This makes it possible to prevent a voltage fluctuation between the switching elements Q1. Similarly, since the heat sinks 42 and 52 are provided with multiple common semiconductor elements 32, it is possible to prevent a voltage fluctuation between the switching elements Q2. Furthermore, it is possible to reduce the number of parts.

<Detailed Structure of Semiconductor Module>

Figure 12:
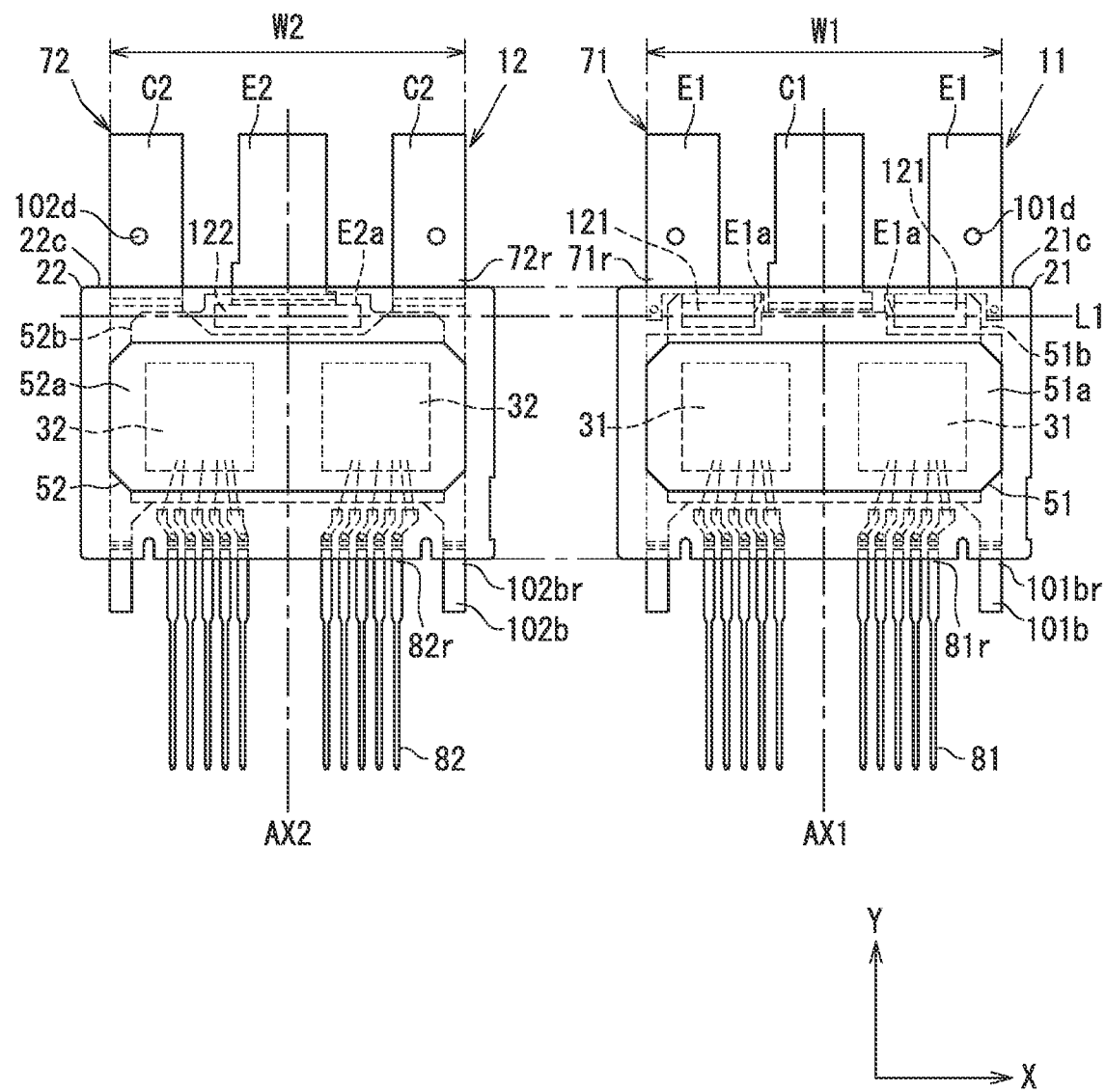
FIG. 12 is a plan view showing a structure inside the sealing resin body in the semiconductor device.

Next, a structure of the semiconductor module described above will be described in detail. FIG. 12 corresponds to FIG. 2, and shows elements in the sealing resin bodies 21 and 22 by broken lines.

The semiconductor module 10 includes, as described above, the semiconductor devices 11 and 12 respectively including the three or more main terminals 71 and 72. In consideration of the position accuracy during molding of the sealing resin body and the like, all the main terminals 71 and 72 are configured on the lead frames 101 and 102. The arrangement orders of the main terminals 71 and 72 are reverse, and, in the semiconductor devices 11 and 12, differences in the connection structures between the emitter terminals E1 and E2 and the heat sinks 51 and 52 occur. Thereby, the manufacturing process is complicated, and the productivity may be reduced.

When the emitter terminal E1 is configured on the lead frame 101 with the collector terminal C1, a part close to the heat sink 51 is not clamped by the mold, and only a part close to the heat sink 41 (lead frame 101) is clamped. Since only one member is clamped, it is possible to improve the position accuracy when the sealing resin body 21 is formed. For example, it is possible to prevent resin leakage. The similar applies to the lead frame 102.

As to the above difficulty, in the semiconductor module 10 according to the present embodiment, as shown in FIGS. 2 to 5, and 12, the sealing resin bodies 21 and 22 and at least root portions 71r and 72r in protrusion portions of the main terminals 71 and 72 have the same configuration. The sealing resin bodies 21 and 22 have the same shape and the same size. The sealing resin bodies 21 and 22 have the same appearance. The root portions 71r and 72r have the same shape and the same size.

The root portions 71r and 72r of the collector terminal C1 and the emitter terminal E2 have the same structure. The root portions 71r and 72r of the emitter terminal E1 and the collector terminal C2 have the same structure. The arrangements (positions) of the root portions 71r and 72 with respect to the sealing resin bodies 21 and 22 are same as each other. From the above, it is possible to form the sealing resin bodies 21 and 22 by using the same mold. By using the common mold, it is possible to improve the productivity. For example, it is not necessary to exchange the mold.

The root portions 71r and 72r are portions clamped at the time of molding the sealing resin bodies 21 and 22 in the main terminals 71 and 72. The root portions 71r and 72r are portions within a predetermined range (for example, about 1 mm) from the side surfaces 21c and 22c of the sealing resin bodies 21 and 22. The same arrangement means a positional relationship in which the root portions 71r and 72r completely overlap with each other in the projection view from the Z direction in a state where the semiconductor devices 11 and 12 are laminated so that the sealing resin bodies 21 and 22 coincide, for example.

Further, a solder joint portion 121 via the solder 91d is formed between the heat sink 51 and the emitter terminal E1. A solder joint portion 122 via the solder 92d is formed between the heat sink 52 and the emitter terminal E2. Then, at least one of the sealing resin bodies 21 and 22 or the root portions 71r and 72r are set to the position references of the semiconductor devices 11 and 12, and at least parts of the solder joint portions 121 and 122 are placed at the same position in the Y direction. As shown in FIG. 12, the solder joint portions 121 and 122 are placed on a virtual line L1 parallel to the X direction.

Thereby, solder joining can be performed under the same reflow process and conditions. In particular, the 2nd reflow can be performed under the same process and conditions. When the reflow is performed during the transportation along the X direction, for example, the positions of the heaters can be made same. Further, even when the heaters are provided directly under the heat sinks 41 and 42, heat transfer distance from the heats to the solder joint portions 121 and 122 can be made substantially same. Thereby, it is possible to prevent the bias in the molten state of the solders 91d and 92d during reflow.

From the above, according to the semiconductor module 10 of the present embodiment, it is possible to improve the productivity while providing the two types (two product numbers) of semiconductor devices 11 and 12. In particular, in the present embodiment, the centers of the solder joint portions 121 and 122 in the Y direction coincide with each other. Thereby, it is possible to further improve the productivity.

Further, other clamp parts of the lead frames 101 and 102 have the same structure as each other, and the arrangements with respect to the sealing resin bodies 21 and 22 are same as each other. From each other, root portions 81r and 82r in protrusion portions of the signal terminals 81 and 82 have the same structure, and the arrangements (positions) with respect to the sealing resin bodies 21 and 22 are same as each other. Protrusion portions 101*br* and 102*br* in protrusion portions of the suspension leads 101*b* and 102*b* have the same structure, and the arrangements (positions) with respect to the sealing resin bodies 21 and 22 are same as each other.

In the present embodiment, in the entire protrusion portions of the main terminals 71 and 72, the structures are same, and the arrangements are same. Although the potentials (collectors/emitters) of the main terminals 71 and 72 are opposite to each other, the semiconductor devices 11 and 12 have the same appearance. Thereby, it is possible to further improve the productivity. For example, the manufacturing is easily performed under the same process and conditions. For example, the connection with the smoothing capacitor Cs can be performed under the same process and the conditions.

In the present embodiment, as shown in FIG. 12, the solder joint portions 121 are symmetrically arranged with respect to the axis AX1 as the symmetry axis. The semiconductor elements 31 and the solder joint portions 121 are symmetrically arranged with respect to the axis A1X as the symmetry axis. Further, the solder joint portions 122 are symmetrically arranged with respect to the axis AX2 as the symmetry axis. The semiconductor elements 32 and the solder joint portions 122 are symmetrically arranged with respect to the axis A2X as the symmetry axis. Thereby, in the X direction, the balance at the time of reflow (2nd reflow) is obtained. Accordingly, it is possible to improve the productivity. For example, it is possible to prevent the inclination of the heat sinks 51 and 52 in the X direction that is the long-side direction. Further, it is possible to prevent the imbalance of the AC current.

In the present embodiment, positions of the positioning reference holes 101*d* and 102*d* respectively provided for the lead frames 101 and 102 are same with respect to the sealing resin bodies 21 and 22. For example, a positioning pin (not shown) is positioned according to the reference holes 101*d* and 102*d*. Accordingly, the positions of elements corresponding to the semiconductor devices 11 and 12 can be accurately aligned.

In the present embodiment, as shown in FIG. 12, a width W1 for the multiple main terminals 71 and a width W2 for the multiple main terminals 72 are same as each other. In other words, the widths of the lead frames 101 and 102 in the X direction are same as each other. Thereby, in each process, before positioning (main positioning) using the reference holes 101*d* and 102*d*, it is possible to perform temporal positioning using the outer frames of the lead frame 101 and 102. Accordingly, it is possible to shorten the time required for positioning. The width W1 is a length of a placement area of the main terminals 71 in the width direction of the main terminal 71. The width W2 is a length of a placement area of the main terminals 72 in the width direction of the main terminal 72.

In the present embodiment, the heat sinks 41 and 42 that are thick portions of the lead frames 101 and 102 have the same structure. Since the heat capacities of the heat sinks 41 and 42 are same, when forming the semiconductor devices 11 and 12, it is possible to perform the solder joint under the same reflow process and the conditions. For example, the 1st reflow can be performed under the same process and conditions.

Figure 13:
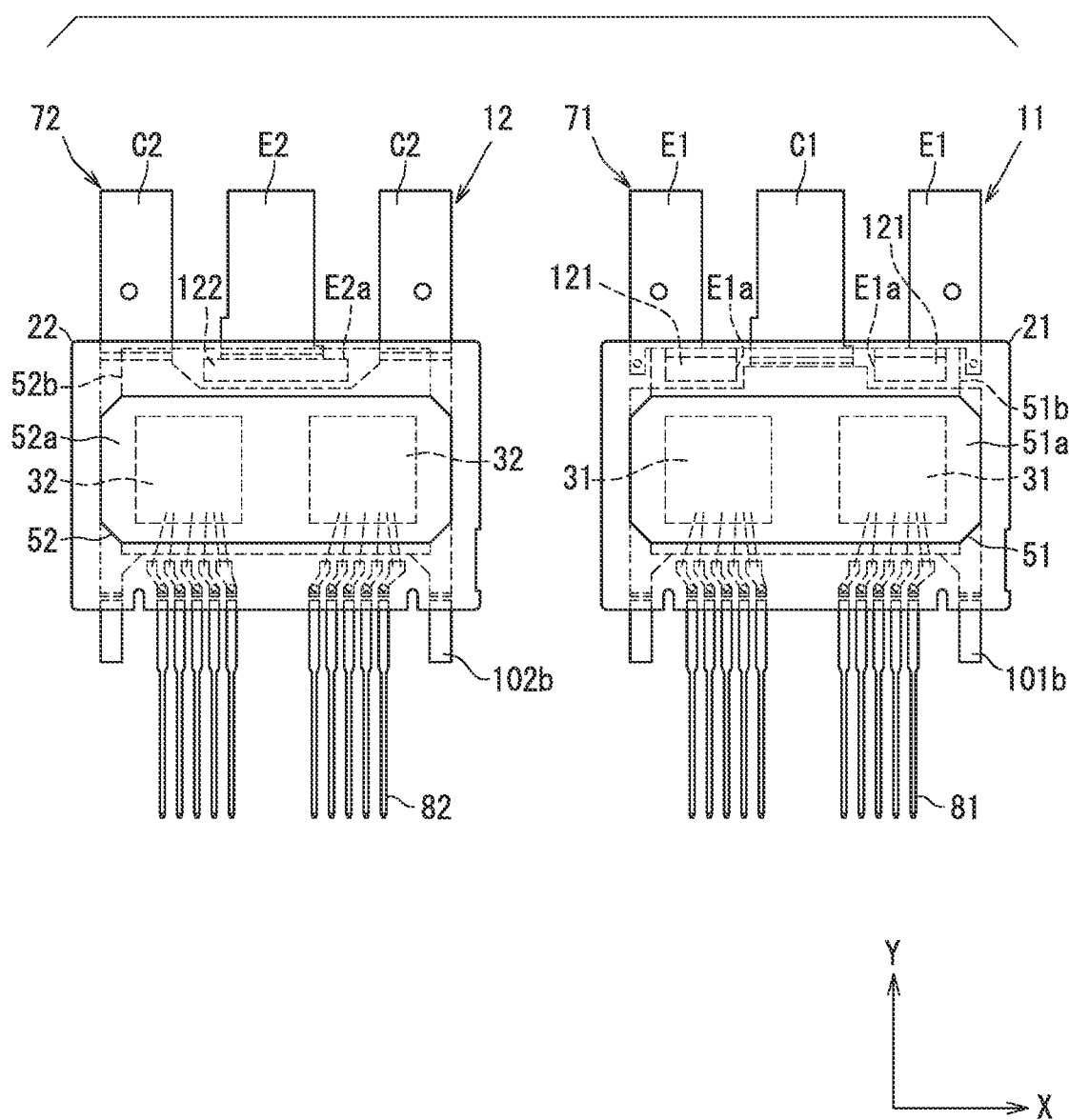
FIG. 13 is a plan view showing a first modification.

In the present embodies, the example where the structures of the heat sinks 51 and 52 are different from each other has been shown. However, it is not limited to this. As in a first modification shown in FIG. 13, the heat sinks 51 and 52 may have the same structure. The heat sinks 51 and 52 have the same shape and the shape size. The heat sinks 51 and 52 have the same heat capacity. Thereby, it is possible to stabilize the 2nd reflow. Further, it is possible to reduce the number of components by commonly using the heat sinks 51 and 52.

Figure 14:
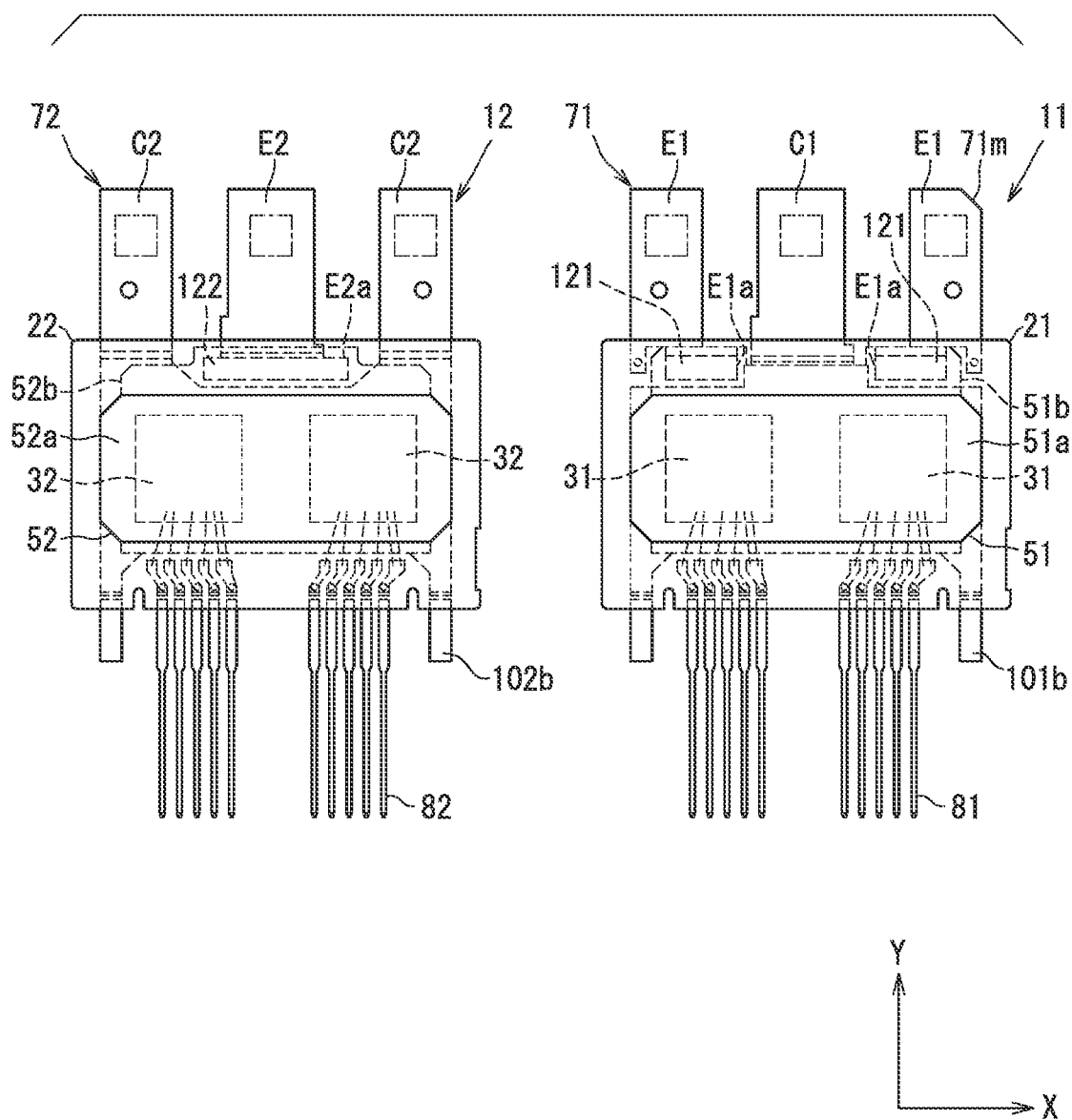
FIG. 14 is a plan view showing a second modification.

When the appearances of the semiconductor devices 11 and 12 are same, a mark for distinguishing one semiconductor device to the other semiconductor device may be provided at least one of the semiconductor devices. The mark may be provided at a position close to the protrusion tip with respect to a portion connected to the bus bar and the like. That is, the mark may be provided at a portion that does not affect the current operation of the upper-lower arm 7. In a second modification shown in FIG. 14, a notch 71*m* that is the mark is placed at one emitter terminal E1 of the semiconductor device 11. Thereby, it is possible to prevent the same semiconductor devices from being accidentally connected to each other. In the main terminal 71, a position of the notch 71*m* may not be limited to the emitter terminal E1. With the notch 71*m*, another notch may be provided at a different position of the semiconductor device 12. For example, the notch may be provided at the protrusion tip of the emitter terminal E2.

A mark different from the notch may be used. For example, a mark formed by printing, laser processing, and the like can be used. In order to improve the productivity, the above notch is preferable. The notch can be formed, for example, when the lead frames 101 and 102 are formed or when the tie bars 101*c* and 102*c* and the like are removed (lead cut is performed).

The example in which the semiconductor device 11 includes the three main terminals 71 and the semiconductor device 12 includes the three main terminals 72 has been shown. However, it is not limited to this. The semiconductor device 11 may include four or more main terminals 71, and the semiconductor device 12 may include four or more main terminals 72. In a third modification shown in FIG. 15, the semiconductor devices 11 and 12 include seven main terminals 71 and 72 respectively. The semiconductor device 11 includes three collector terminals C1 and four emitter terminals E1. The collector terminals C1 and the emitter terminals E1 are alternately arranged in the X direction.

Figure 15:
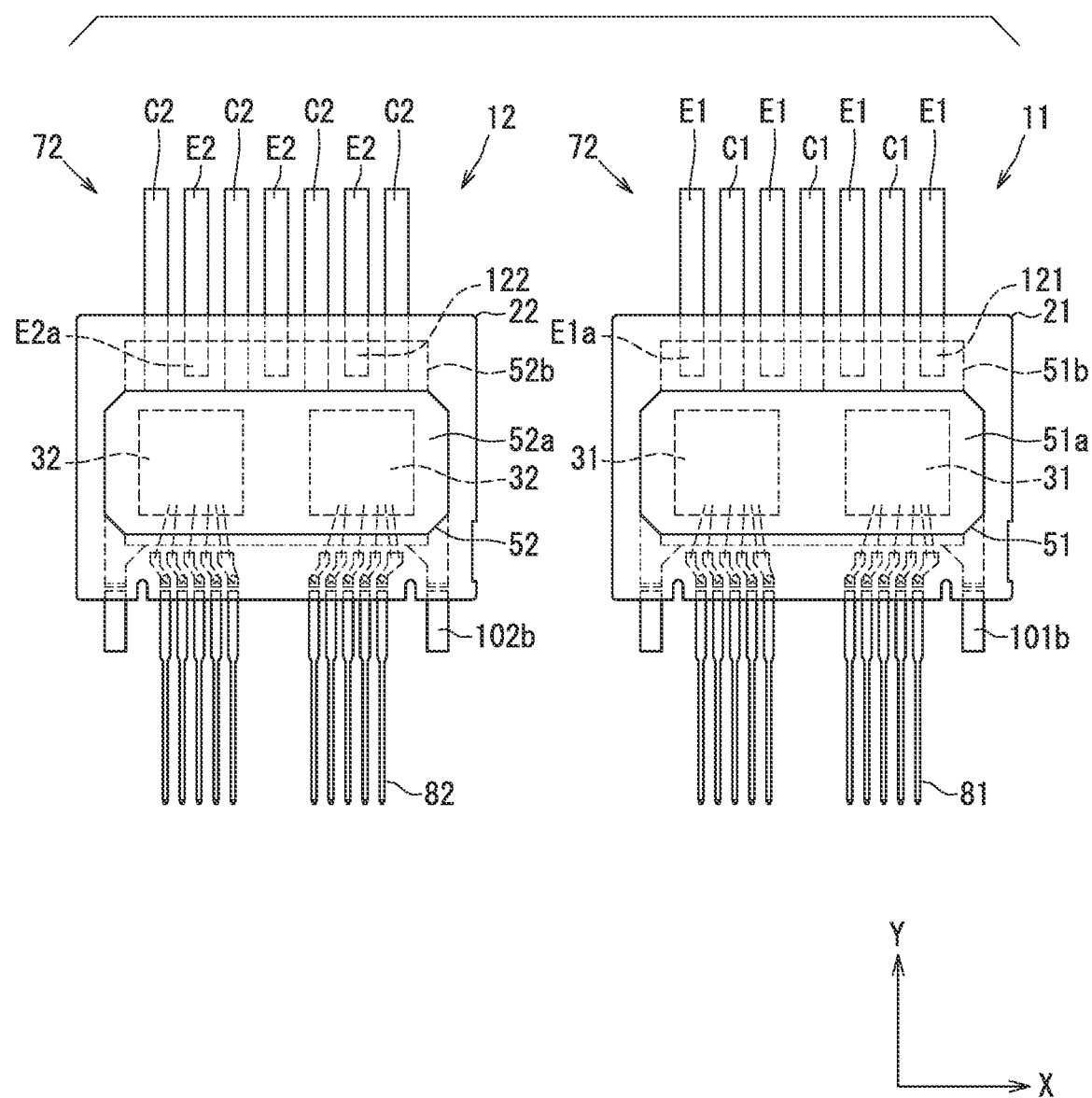
FIG. 15 is a plan view showing a third modification.

The semiconductor device 12 includes four collector terminals C2 and three emitter terminals E2. The collector terminals C2 and the emitter terminals E2 are alternately arranged in the X direction. Each of the arrangement of the main terminals 71 and the arrangement of the main terminals 72 is symmetrical with respect to the center of each arrangement. When each arrangement of the main terminals 71 and 72 is viewed from the center, the arrangement order of the main terminals 71 is opposite to the arrangement order of the main terminals 72. The number of solder joint portions 121 is four, and the number of solder joint portions 122 is three. In FIG. 15, the heat sinks 51 and 52 have the same configurations as that in FIG. 13.

The example in which the semiconductor device 11 includes the two corresponding semiconductor element 31 and the semiconductor device 12 includes the two corresponding semiconductor elements 32 has been shown. However, it is not limited to this. The semiconductor device 11 may include three or more semiconductor elements 31, and the semiconductor device 12 may include three or more semiconductor element 32.

The example in which the terminals 61, 62 are provided as the semiconductor devices 11 and 12 having a double-sided heat dissipation structure has been described. However, it is not limited to this. The terminals 61 and 62 may not be provided. The example in which the heat sinks 41, 42, 51, and 52 are exposed from the corresponding sealing resin bodies 21 and 22 has been shown. However, the heat sinks 41, 42, 51, and 52 are not exposed from the sealing resin bodies 21 and 22. The heat sinks 41, 42, 51, and 52 may be divided into multiple pieces in accordance with the number of semiconductor elements 31 and 32. However, the productivity can be improved by integrating them. Further, the fluctuation of the voltage in the parallel circuit can be prevented.

Second Embodiment

In the embodiments, parts functionally and/or structurally corresponding to the preceding embodiment and/or associated parts are given the same reference numerals. For corresponding and/or associated portions, it is possible to make reference to the descriptions of the preceding embodiment.

Figure 16:
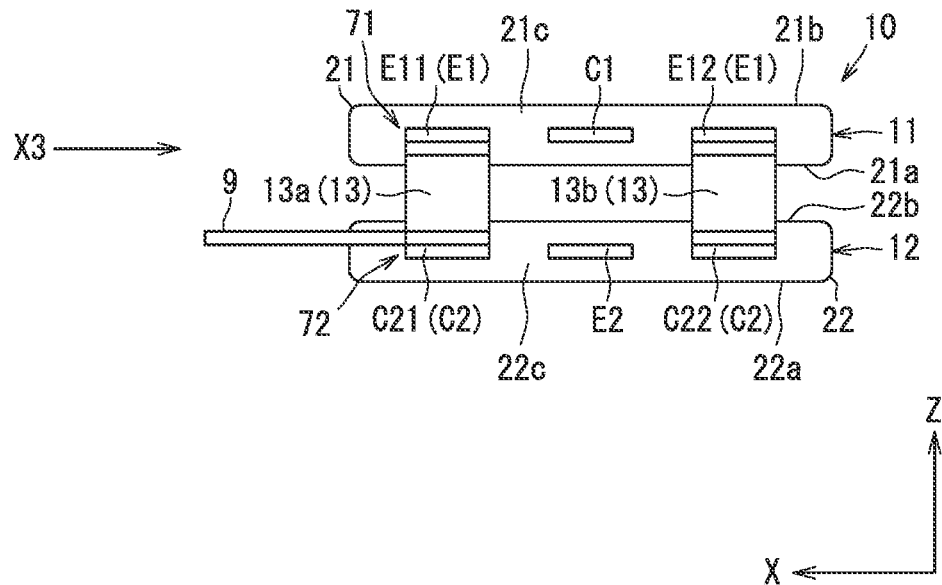
FIG. 16 is a plan view showing a semiconductor module according to a second embodiment.
Figure 17:
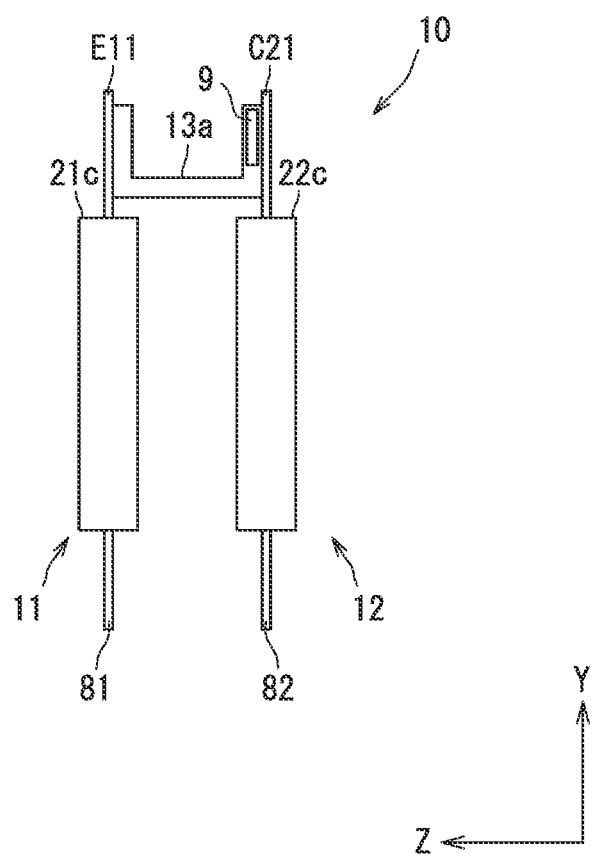
FIG. 17 is a plan view of FIG. 16 as seen from an X3 direction.

As shown in FIGS. 16 and 17, the semiconductor module 10 according to the present embodiment further includes the load line 9. The load line 9 is formed of a metal material such as, for example, copper. The load line 9 is formed in the plate shape, for example. The load line 9 is also referred to as a bus bar. The semiconductor module 10 includes, as the connection member 13, a connection member 13a connected to the load line 9, and a connection member 13b that is not connected to the load line 9.

The load line 9 may be integrally provided with the connection member 13a, and may be connected to the connection member 13a. The load line 9 is connected to a predetermined part of the connection member 13a. In FIG. 16 and FIG. 17, for convenience, the cooler 14 is omitted.

By connecting the load line 9 to only the connection member 13a, it is possible to simplify the connection structure with the motor generator 3. Further, it is possible to simplify the connection between the collector terminal C1 and the emitter terminal E2, and the smoothing capacitor Cs.

The basic configurations of the semiconductor devices 11 and 12 are same as that of the preceding embodiment. The semiconductor device 11 includes one collector terminal C1 and two emitter terminals E1. The semiconductor device 12 includes two collector terminals C2 and one emitter terminal E2. The emitter terminals E1 and E2 of the semiconductor devices 11 and 12 are respectively connected to the corresponding heat sinks 51 and 52 by solder.

Hereinafter, one emitter terminal E1 is also referred to as an emitter terminal E11, and another is also referred to as an emitter terminal E12. One collector terminal C2 is also referred to as a collector terminal C21, and another is also referred to as a collector terminal C22. In the X direction, the emitter terminal E11 is placed close to the semiconductor element 31a, and the emitter terminal E12 is placed close to the semiconductor element 31b. The collector terminal C21 is placed close to the semiconductor element 32a, and the collector terminal C22 is placed close to the semiconductor element 32b.

Hereinafter, the connection position of the load line 9 will be described.

Figure 18:
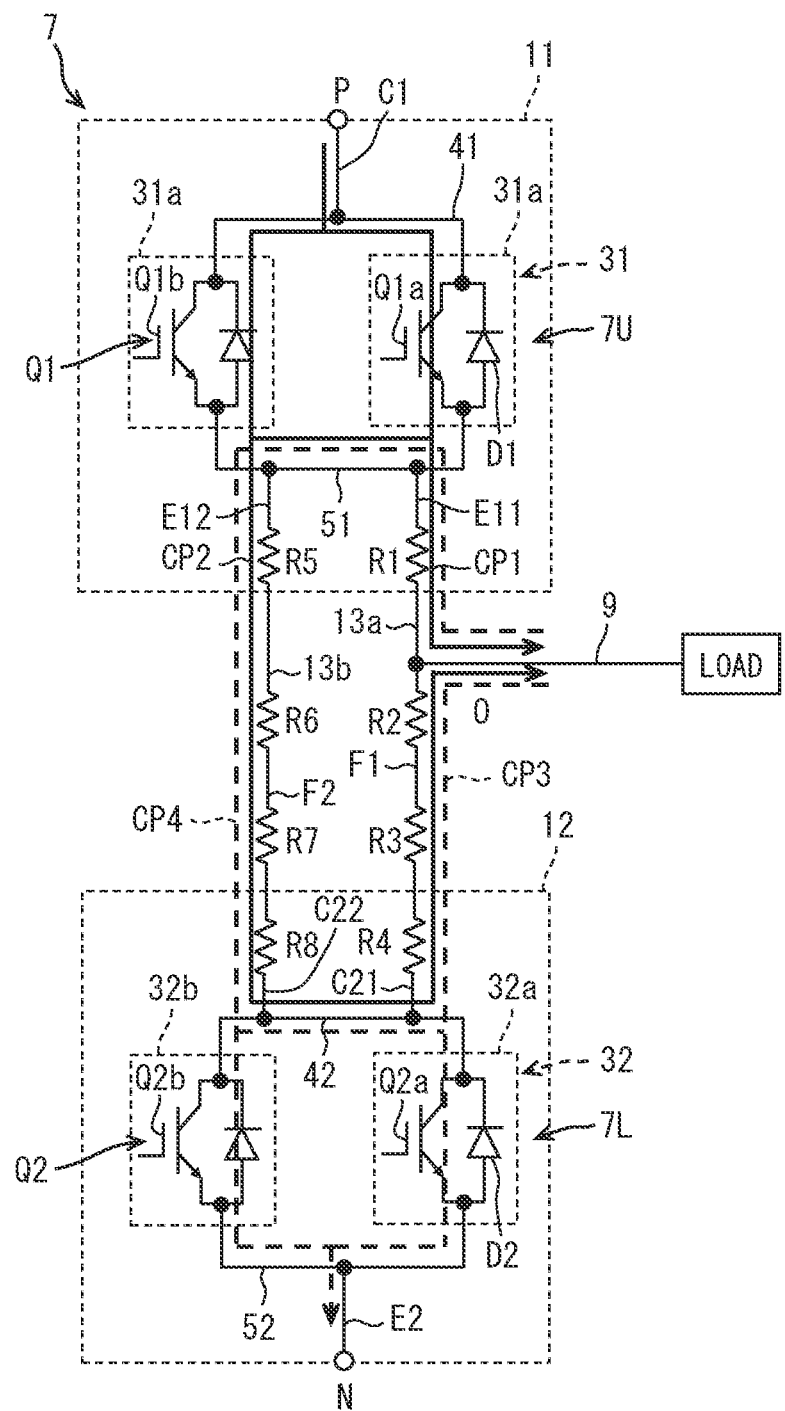
FIG. 18 is a model of an upper-lower arm used for position verification of a load line.

FIG. 18 is a circuit model of the upper-lower arm 7 in consideration of the wiring resistance in order to verify the connection position of the load line 9. A load shown in FIG. 18 corresponds to a stator winding of the motor generator 3. The load is an inductive load (L load). Hereinafter, the collector terminal C1, which is the P terminal, is also referred to as P, and the emitter terminal E2, which is the N terminal, is also referred to as N, and the load line 9, which is the output terminal, is also referred to as O.

As shown in FIG. 18, the upper-lower arm 7 includes, as a path connecting the upper arm 7U and the lower arm 7L, a first path F1 and a second path F2. Hereinafter, the first path F1 is also referred to as a path F1, and the second path F2 may be also referred to as a path F2. The first path F1 includes the connection member 13a, the emitter terminal E11, and the collector terminal C21. The connection member 13a is welded to the emitter terminal E11 and the collector terminal C21 that are the output terminals. The first path F1 includes, as main resistance components, a resistor R1 of a welded portion between the emitter terminal E11 and the connection member 13a, resistors R2 and R3 that are the wiring resistances of the connection member 13a itself, and a resistor R4 of the welded portion between the collector terminal C21 and the connection member 13a.

The second path F2 includes, the connection member 13b, the emitter terminal E12, and the collector terminal C22. The connection member 13b is welded to the emitter terminal E12 and the collector terminal C22 that are the output terminals. The second path F2 includes, as main resistance components, a resistor R5 of a welded portion between the emitter terminal E12 and the connection member 13b, resistors R6 and R7 that are the wiring resistances of the connection member 13b itself, and a resistor R8 of a welded portion between the collector terminal C22 and the connection member 13b. In a model shown in FIG. 18, it is assumed that the load line 9 is connected closer to the upper arm 7U, and, in the first path F1, there are the resistors R2 and R3 between the lower arm 7L and the connection position of the load line 9.

As described above, in the configuration in which the load line 9 is connected to one connection member 13, there are mainly two DC current paths. The DC current is a current not at the time of switching but at a steady time when the switching element is turned on. A CP1 and a CP2 indicated by solid arrows in FIG. 18 are the main current paths when the switching elements Q1 (Q1a, Q1b) close to the upper arm 7U are driven. A CP3 and a CP4 indicated by broken arrows are the main current paths when the switching elements Q2 (Q2a, Q2b) close to the lower arm 7L are driven.

The current path CP1 extends in the order of, the collector terminal C1 (P), the heat sink 41, the switching elements Q1a and Q1b, the heat sink 51, the emitter terminal E11, the connection member 13a, and the load line 9 (O). The current path CP2 extends in the order of the collector terminal C1 (P), the heat sink 41, the switching elements Q1a and Q1b, the heat sink 51, the emitter terminal E12, the connection member 13b, the collector terminal C22, the heat sink 42, the collector terminal C21, the connection member 13a, and the load line 9 (O). As described above, since the resistance components of the main circuit wirings of the current paths CP1 and CP2 are different from each other, the DC current imbalance may occur.

Similarly, the current path CP3 extends in the order of the load line 9 (O), the connection member 13a, the collector terminal C21, the heat sink 42, the switching elements Q2a and Q2b, the heat sink 52, and the emitter terminal E2 (N). The current path CP4 extends in the order of the load line 9 (O), the connection member 13a, the emitter terminal E11, the heat sink 51, the emitter terminal E12, the connection member 13b, the collector terminal C22, the heat sink 42, the switching elements Q2a and Q2b, the heat sink 52, and the emitter terminal E2 (N). As described above, since resistance components of the main circuit wirings differ between the current paths CP3 and CP4, the DC current imbalance may occur.

Figure 19A:
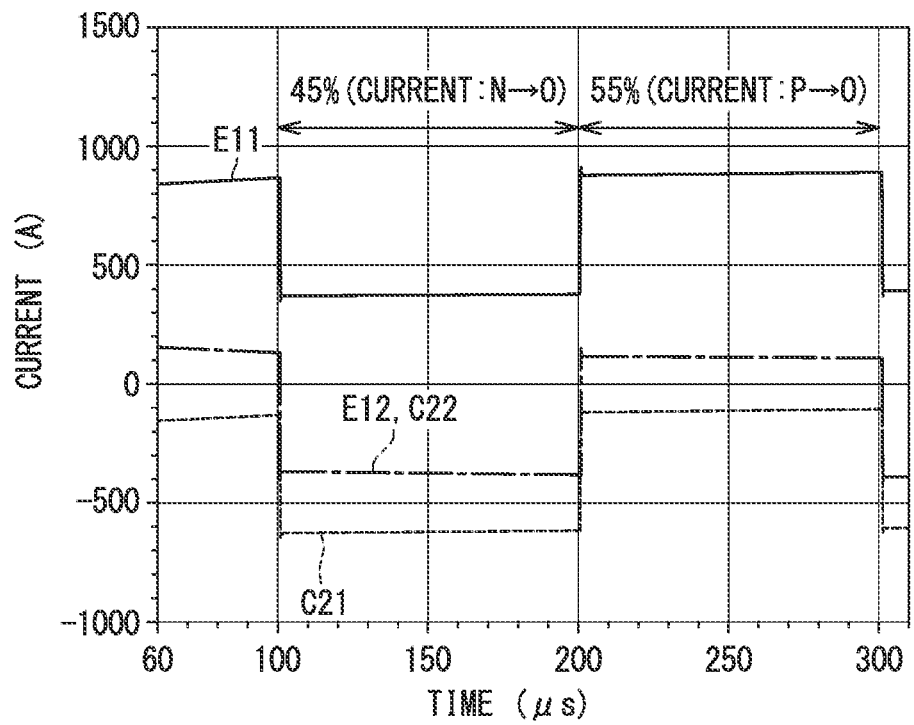
FIG. 19A is a diagram showing a current flowing through each output terminal when a switching element is driven.
Figure 19B:
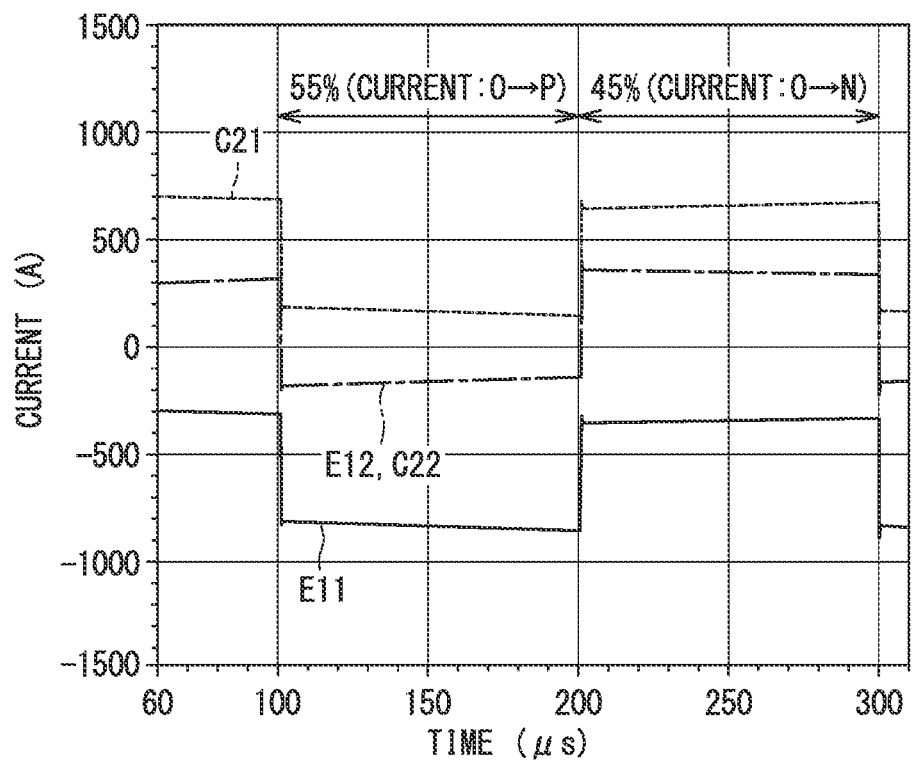
FIG. 19B is a diagram showing the current flowing through each output terminal when the switching element is driven.

FIG. 19A and FIG. 19B show simulation results of currents flowing through the output terminal when the motor lock occurs in the model shown in FIG. 18. FIG. 19A shows the current flowing through each output terminal during driving on the side of the upper arm 7U. FIG. 19A shows the current flowing through each output terminal during driving on the side of the lower arm 7L. FIG. 19A and FIG. 19B show the current flowing through the emitter terminal E11 by the solid line, the current flowing through the collector terminal C21 by the broken line, and the currents flowing through the emitter terminal E12 and the collector terminal C22 by the dashed dotted line.

In the simulation, the load current was set to 1000 [A], and the duty ratio of the output waveform of the upper-lower arm 7 was set to 55%. Further, values of the resistors R1 to R8 were equal to each other and set to r. The total resistance value of the paths F1 and F2 is 8r. As of the total resistance value, a resistance value of the current path CP1 is r, a resistance value of the current path CP2 is 7r, a resistance value of the current path CP3 is 3r, and a resistance value of the current path CP4 is 5r.

Accordingly, the current path CP1 is easier for the current to flow than the current path CP2. When the switching element Q1 is driven, the current flowing in the emitter terminal E11 is larger than that in the emitter terminal E12. Further, the current path CP3 is easier for the current to flow than the current path CP4. When the switching element Q2 is driven, the current flowing in the collector terminal C21 is larger than that in the collector terminal C22. In such a manner, the current is concentrated on the output terminal constituting the path F1, specifically, concentrated close to the emitter terminal E11 and the collector terminal C21.

When the switching element Q1 is driven, the current flows from the upper-lower arm 7 to the load. As shown in FIG. 19A, during an on-state period of the PWM cycle, the current flows from the collector terminal C1 (P) to the load line 9 (O) via the switching element Q1. The current of 875 [A] (=1000×⅞) flows through the emitter terminal E11. During an off-state period, the current flows from the emitter terminal E2 (N) to the load line 9 (O) via the diode D2. Then, the current of 375 [A] (=1000×⅜) flows through the emitter terminal E11. The current flowing through the emitter terminal E11 is a rectangular wave with 875 [A] (duty ratio of 55%) and 375 [A] (duty ratio of 45%). The current of 696 [A] in terms of effective value flows through the emitter terminal E11.

When the switching element Q2 is driven, the current flows from the load to the upper-lower arm 7. During the on-state period of the PWM cycle, the current flows from the load line 9 (O) to the emitter terminal E2 (N) via the switching element Q2. As shown in FIG. 19B, the current of 625 [A] (=1000×⅝) flows through the collector terminal C21. During the off-state, the current flows from the load line 9 (O) to the collector terminal C1 (P) via the diode D1. Then, the current of 125 [A] (=1000×⅛) flows through the collector terminal C21. The current flowing through the collector terminal C21 is a rectangular wave with 625 [A] (duty ratio of 45%) and 125 [A] (duty ratio of 55%). The current of 429 [A] in terms of effective value flows through the collector terminal C21.

As described above, in the model shown FIG. 18, the balance of DC current in the upper arm 7U is worse than that in the lower arm 7L. Accordingly, among the emitter terminal E11 and the collector terminal C21 where the current is concentrated due to the imbalance of the DC current, particularly, the large current flows through the emitter terminal E11. The energization stress for the emitter terminal E11 is larger.

Similarly to the preceding embodiment, the semiconductor module 10 of the present embodiment includes, as the joint portion between the heat sinks 51 and 52 and the main terminals 71 and 72, the solder joint portions 121 and the solder joint portion 122. The solder joint portions 121 are formed between the heat sink 51 and each of the emitter terminals E11 and E12. The solder joint portion 122 is formed between the heat sink 52 and the emitter terminal E2. Among the emitter terminal E11 and the collector terminal C21 where the current is concentrated, the emitter terminal E11 is formed with the solder joint portion 121, and the collector terminal C21 is formed with no solder joint portion. The collector terminal C21 is continuously provided with the heat sink 42 as one member. For example, an electromigration effect increases as the flowing current increases. The emitter terminal E11 has a lower resistance to the energization stress than that of the collector terminal C21.

Therefore, in the present embodiment, the connection position (hereinafter, also referred to as a reference position) is set so that a value of the wiring reference, in the path F1, from the reference position of the load line 9 to the heat sink 51 via the emitter terminal E11 is larger than a value of the wiring reference from the reference position to the heat sink 42 via the collector terminal C21. As shown in FIG. 16 and FIG. 17, in the semiconductor module 10 of the present embodiment, the load line 9 is continuous from the welded portion to the collector terminal C21 in the connection member 13a having the substantially U-shape. The reference position is also referred to as an output branch point.

Figure 20:
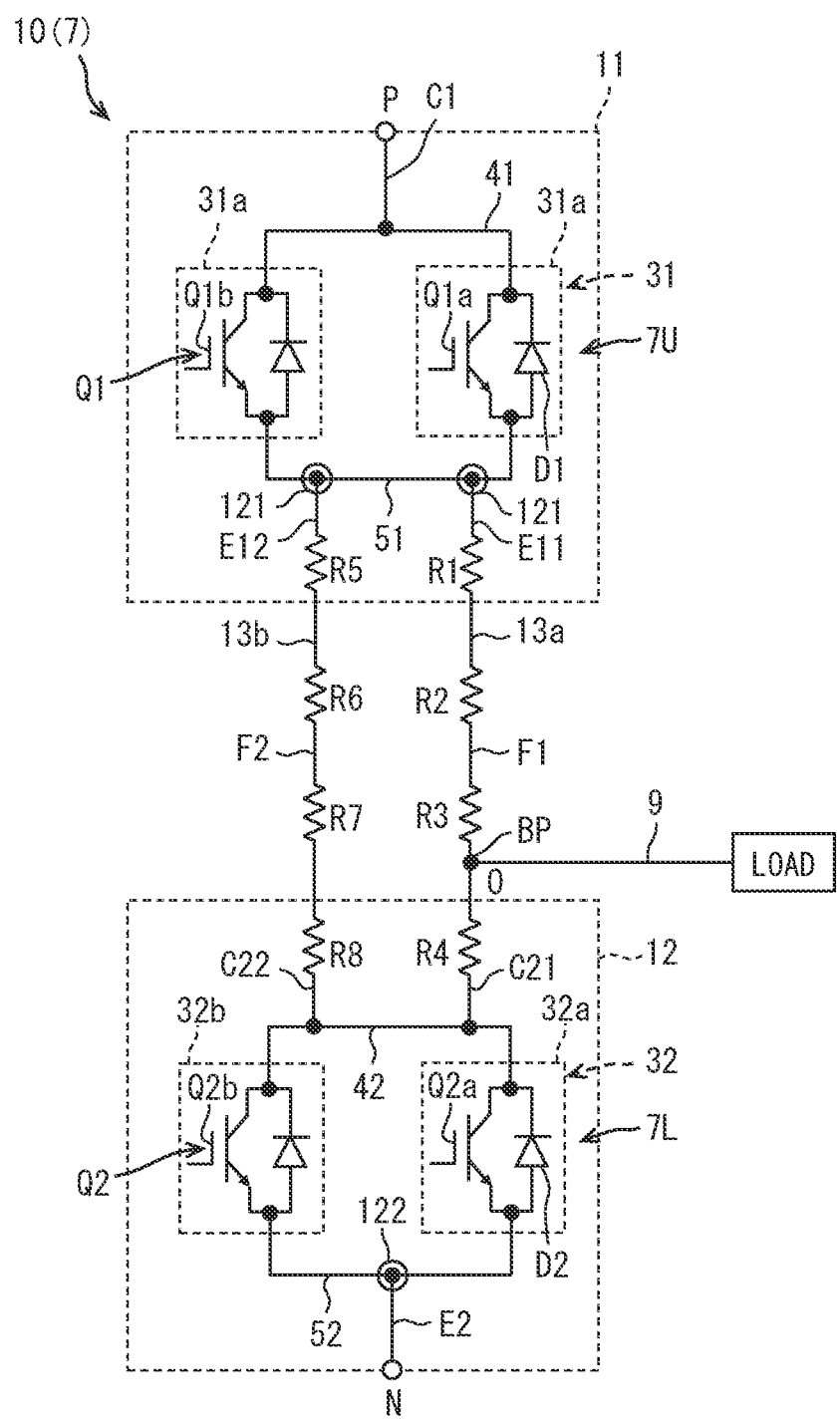
FIG. 20 is an equivalent circuit of the semiconductor module in consideration of a wiring resistance.

FIG. 20 is an equivalent circuit diagram of the semiconductor module 10 shown in FIG. 16 and FIG. 17. In the connection member 13a, a reference position BP at which the load line 9 is connected is set closer to the lower arm 7L. In FIG. 20, for convenience, the wiring reference between the reference position BP and the resistor R4 of the welded portion with the collector terminal C21 is zero, and the reference position BP is placed between the wiring resistors R2 and R3 of the connection member 13a and the resistor R4.

In the path F1, a resistance value (first resistance value) of a wiring portion from the reference position BP to the heat sink 51 via the emitter terminal E11 and the solder joint portion 121 is a total value of the resistors R1, R2, and R3. A resistance value (second resistance value) of a wiring portion from the reference position BP to the heat sink 52 via the collector terminal C21 is a value of the resistor R4. For example, when the value of each of the resistors R1 to R8 is r, the first resistance value is 3r, and the second resistance value is r.

As described above, in the semiconductor device 11 for the emitter terminal E11 having the low resistance to the energization stress, it is possible to prevent the imbalance of the DC currents of the emitter terminals E11 and E12. It is possible to reduce the degree of DC current imbalance of the emitter terminals E11 and E12. Thereby, it is possible to prevent the current concentration on the solder joint portion 121 formed on the emitter terminal E11. By preventing the imbalance of the DC current, it is possible to reduce the current flowing through the solder joint portion 121. Accordingly, in the semiconductor module 10 including the two types (two product numbers) of the semiconductor devices 11 and 12, it is possible to improve the reliability.

By the above placement of the load line 9, the degree of DC current imbalance in the collector terminal C2 increases, and the current flowing through the collector terminal C21 increases. However, the collector terminal C21 has the higher energization stress resistance than that of the emitter terminal E11. Accordingly, it is possible to improve the reliability of the semiconductor module 10 as a whole.

The example, in which the energization stress resistance of the emitter terminal E11 is lower than the collector terminal C21 due to the presence or absence of the solder joint (solder bonding), has been shown. However, it is not limited to this. For example, the collector terminal C21 may be bonded to the heat sink 42 by using the solder, and an area of the solder joint portion of the collector terminal C21 may be larger than an area of the solder joint portion 121 of the emitter terminal E11. The magnitude of the energization stress resistance is determined based on the presence or absence of the solder joint, the area of the solder joint portion, and the like.

An opposite configuration to that of the present embodiment may be provided. Specifically, the energization stress resistance of the collector terminal C21 close to the lower arm 7L may be lower than that of the emitter terminal E11 close to the upper arm 7U. In this configuration, the load line 9 may be provided so that, in the path F1, a wiring resistance value from the resistance position BP to the heat sink 42 is larger than a wiring reference from the reference position BP to the heat sink 51. For example, the reference position BP is set to a position close to the upper arm 7U at the connection member 13a.

In the present embodiment, the connection members 13a and 13b have the same structure. According to this, it is easy to adjust the DC current imbalance based on the reference position BP of the load line 9. By using the connection members 13a and 13b having the same structure and welding in the similar manner, the resistance value of the entire path F1 can be substantially same as the resistance value of the entire path F2.

It was found that, when the resistance values of the paths F1 and F2 are equal, a resistance ratio x at a cross point between the current flowing through the emitter terminal E11 and the current flowing through the collector terminal C21 substantially coincides with a duty ratio of an output waveform set at the time of motor lock. FIG. 21 shows a relationship between the resistance ratio x and a ratio of the effective value currents of the emitter terminal E11 and the collector terminal C21 at various duty ratios set at the time of motor lock. In the following, for the sake of distinction, the resistance ratio at the cross point is shown as x0.

The resistance ratio x is a ratio of the first resistance value to the resistance value of the entire path F1. In FIG. 20, when the total value of the resistors R1 to R4 is 1, the total value of the resistors R1, R2, and R3 is x and the resistor R4 is (1-x). The duty ratio at the time of motor lock is generally set to about 50% (for example, a value within a range from 40 to 60%). The duty ratio is 50% in FIG. 21 (a), 55% in FIG. 21 (b), and 60% in FIG. 21 (c). The above simulation result is a result when, in FIG. 21 (b), the resistance ratio x is 0.25/When the resistance ratio x is equal to 0.25 (x=0.25), the effective value current ratio between the emitter terminal E11 and the collector terminal C21 is a ratio of 0.62:0.38.

As shown in FIG. 21, in all duty ratios, the resistance ratio x0 at the cross point and a duty ratio Rd are same. In FIG. 21(a), the resistance ratio x0 is 0.5. In FIG. 21(b), the resistance ratio x0 is 0.55. In FIG. 21(c), the resistance ratio x0 is 0.6.

Accordingly, in a case where the duty ratio set at the time of motor lock is Rd, when the energization stress resistance of the emitter terminal E11 is lower, the resistance ratio x, that is, the reference position BP may be set so as to satisfy a relationship of x≥Rd. By satisfying this relationship, the effective value current of the emitter terminal E11 can be made equal to or less than the effective value current of the collector terminal C21. Thereby, it is possible to improve the reliability of the semiconductor module 10. When a relationship of x>Rd is satisfied, the effective value current of the emitter terminal E11 can be made smaller than the effective value current of the collector terminal C21. Thereby, it is possible to further improve the reliability of the semiconductor module 10.

When the energization stress reference of the collector terminal C21 is lower, the resistance ratio x, that is, the reference position BP may be set so as to satisfy a relationship of x≤Rd. By satisfying this relationship, the effective value current of the collector terminal C21 can be made equal to or less than the effective value current of the emitter terminal E11. Thereby, it is possible to improve the reliability of the semiconductor module 10. When a relationship of x<Rd is satisfied, the effective value current of the collector terminal C21 can be made smaller than the effective value current of the emitter terminal E11. Thereby, it is possible to further improve the reliability of the semiconductor module 10.

The example in which the connection members 13a and 13b have the same structure has been shown. However, it is not limited to this. The example in which the resistance values of the paths F1 and F2 are substantially same has been shown. However, it is not limited to this. The structures of the connection members 13a and 13b may be different from each other. The resistance values of the paths F1 and F2 may be different from each other. For example, at least one of the width, the thickness, or the length of at least a part of the connection member 13a or the connection member 13b may be different. For example, the resistance values of the paths F1 and F2 may be made different by setting the welding resistance (value of the resistors R1, R4, R5, or R8) to the different value with use of the connection members 13a and 13b having the same structure. The method of the connection between the connection members 13 and 13b and the output terminal is not limited to welding. As a fixing method other than the welding, for example, fixing with a connection member, fastening, and the like may be used.

For example, FIG. 22 shows a relationship between the effective value current ratio and the resistance ratio x when, in FIG. 20, the value of each of the resistors R1 to R4 of the path F1 is set to r and the value of each of the resistors R5 to R8 of the path F2 is set to 2r. When a ratio of the resistance value of the entire path F1 to the resistance value of the entire path F2 is defined as k, and the k is equal to 2 (k=2). The duty ratio is 50% in FIG. 22 (a), 55% in FIG. 22 (b), and 60% in FIG. 22 (c).

As shown in FIG. 22(a), when the duty ratio is 50%, the resistance ratio x0 at the cross point and the duty ratio Rd are same. As shown in FIG. 22(b) and FIG. 22(c), when the duty ratio is 55% or 60%, there is a difference between the resistance ratio x0 and the duty ratio Rd. The resistance ratio x0 is larger than the duty ratio Rd. When the duty ratio is 55%, the resistance ratio x0 is 0.6. When the duty ratio is 60%, the resistance ratio x0 is 0.7.

When the resistance values of the paths F1 and F2 are not same, the resistance ratio x0 at the cross point is determined by the following first equation.

$$x0=\{(Rd-0.5) \times k+0.5\}$$ (First equation)

Accordingly, when the energization stress reference of the emitter terminal E11 is lower, the resistance ratio x, that is, the reference position BP may be set so as to satisfy the following second equation.

$$x \geq \{(Rd-0.5) \times k + 0.5\} \quad \text{(Second equation)}$$

By satisfying this relationship, the effective value current of the emitter terminal E11 can be made equal to or less than the effective value current of the collector terminal C21. When the following third equation is satisfied, the effective value current of the emitter terminal E11 can be made smaller than the effective value current of the collector terminal C21.

$$x > \{(Rd-0.5) \times k + 0.5\} \quad \text{(Third equation)}$$

When the energization stress reference of the collector terminal C21 is lower, the resistance ratio x, that is, the reference position BP may be set so as to satisfy the following fourth equation.

$$x \leq \{(Rd-0.5) \times k + 0.5\} \quad \text{(Fourth equation)}$$

By satisfying this relationship, the effective value current of the collector terminal C21 can be made equal to or less than the effective value current of the emitter terminal E11. When the following fifth equation is satisfied, the effective value current of the collector terminal C21 can be made smaller than the effective value current of the emitter terminal E11.

$$x < \{(Rd-0.5) \times k + 0.5\} \quad \text{(Fifth equation)}$$

The relationships of the first to fifth equations described above are true even in a case other than the case where the k is equal to 2 (k=2). For example, FIG. 23 shows a case where k is equal to 1.5 (k=1.5). The duty ratio is 50% in FIG. 23 (a), 55% in FIG. 23 (b), and 60% in FIG. 23 (c). When the duty ratio is 50%, the resistance ratio x0 at the cross point and the duty ratio Rd are same. When the duty ratio is 55%, the resistance ratio x0 is 0.575. When the duty ratio is 60%, the resistance ratio x0 is 0.65. At all the duty ratios, the resistance ratio x0 at the cross point and the value calculated by the above first equation are same.

FIG. 24 shows a case where k is equal to 0.5 (k=0.5). The duty ratio is 50% in FIG. 24 (a), 55% in FIG. 24 (b), and 60% in FIG. 24 (c). When the duty ratio is 50%, the resistance ratio x0 at the cross point and the duty ratio Rd are same. When the duty ratio is 55%, the resistance ratio x0 is 0.525. When the duty ratio is 60%, the resistance ratio x0 is 0.55. At all the duty ratios, the resistance ratio x0 at the cross point and the value calculated by the above first equation are same. The relationships of the first to fifth equations described above are true, for example, when k is equal to 1 (k=1).

Figure 25:
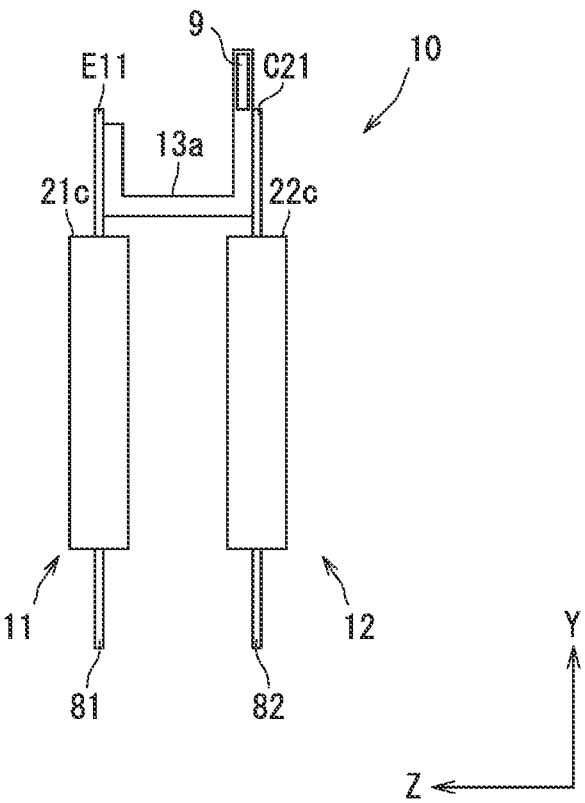
FIG. 25 is a plan view showing a fourth modification.
Figure 26:
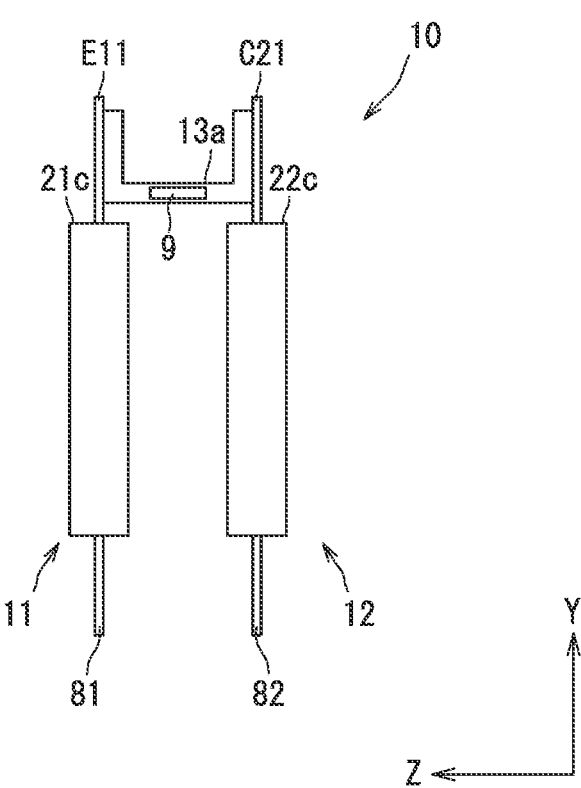
FIG. 26 is a plan view showing a fifth modification.
Figure 27:
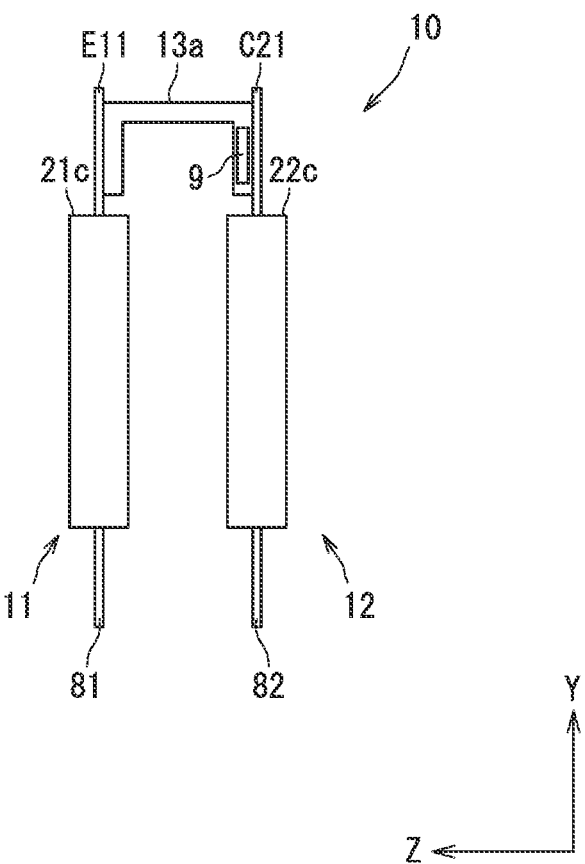
FIG. 27 is a plan view showing a sixth modification.

The position of the load line 9 is not limited to the above example. For example, when the energization stress resistance of the emitter terminal E11 is low, as shown in a fourth modification of FIG. 25, the connection member 13a may further extend from the connection portion with the collector terminal C21, and the load line 9 may be continuous from the extension portion. As shown in a fifth modification of FIG. 26, in the connection member 13a having the substantially U-shape, the load line 9 may be continuous from a linking portion that links the connection portion between the emitter terminal E11 and the collector terminal C21. In this case, the difference in the welding resistance may be provided, and/or the width of the connection portion in the connection member 13a may be made different. As shown in a sixth modification of FIG. 27, the connection member 13a may be inverted in the Y direction.

Figure 28:
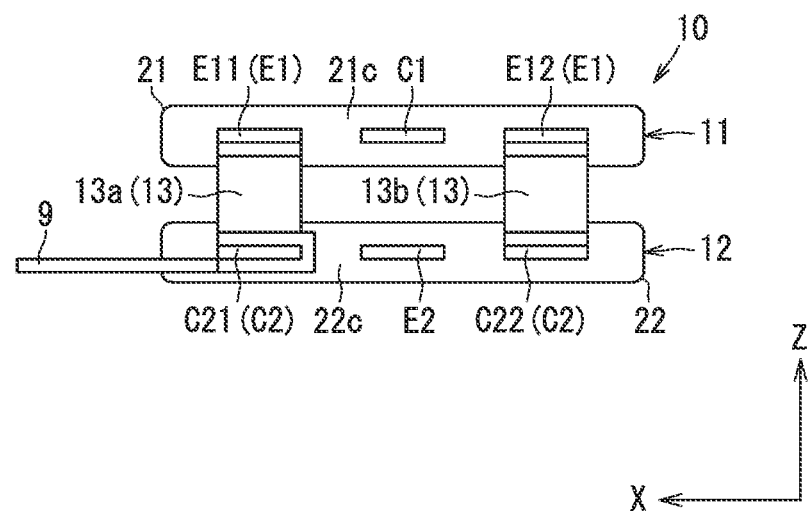
FIG. 28 is a plan view showing a seventh modification.

The example, in which the number of connections between the emitter terminal E11 and the connection member 13a in the path F1 is same as the number of connections between the collector terminal C21 and the connection member 13, has been shown. However, it is not limited to this. By making the number of connections with the emitter terminal E11 different from the number of connections with the collector terminal C21, it is possible to adjust the wiring resistance from the reference position BP. For example, in a seventh modification shown in FIG. 28, the connection member 13a is connected to the collector terminal C21 on the front and back sides in the plate thickness direction. The structures of the connection member 13a and 13b are different from each other. The collector terminal C21 has two connection portions, and the emitter terminal E11 has one connection portion. Due to the two connection portions, the connection area of the collector terminal C21 is large. Thereby, the value of the resistor R4 is smaller than the value of the resistor R1.

Figure 29:
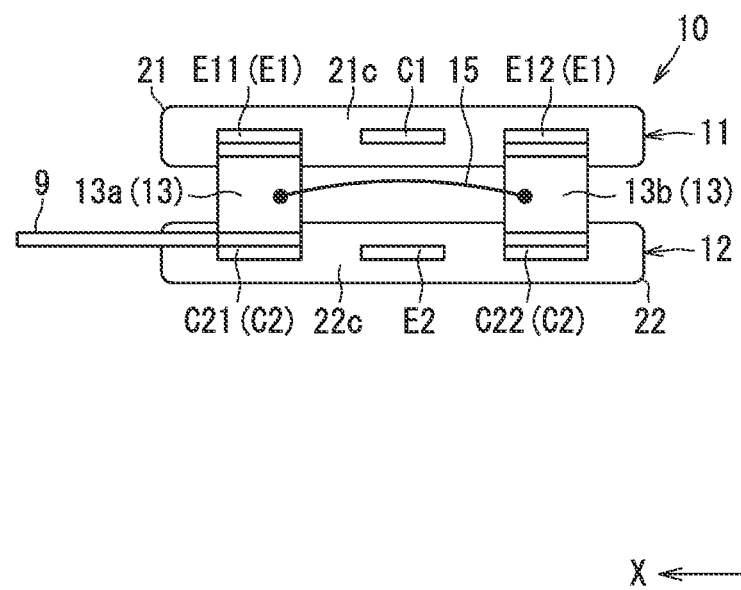
FIG. 29 is a plan view showing an eighth modification.

As in an eighth modification shown in FIG. 29, the connection members 13a and 13b may be electrically connected by a thin wire 15 such as wire. A resistance value of the thin wire 15 is sufficiently larger than the resistance values of the other elements constituting the current paths CP1, CP2, CP3, and CP4. The thin wire 15 does not significantly affect the balance of the DC current.

Figure 30:
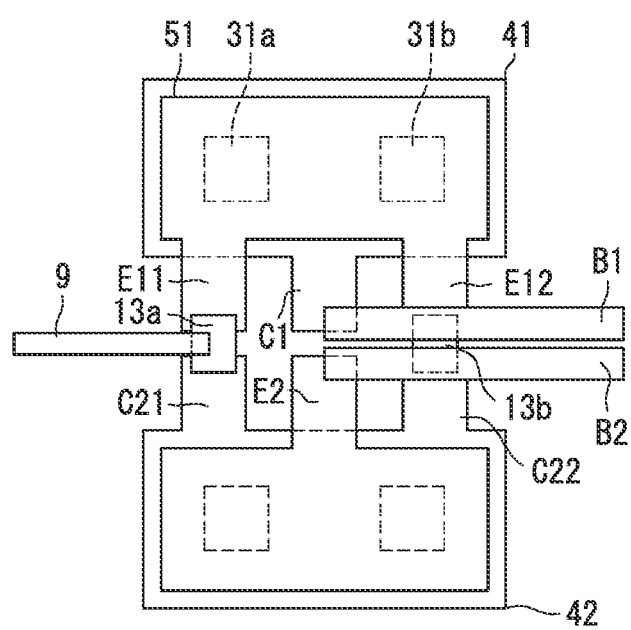
FIG. 30 is a plan view showing a ninth modification.

The example in which the semiconductor devices 11 and 12 are laminated in the Z direction has been shown. However, it is not limited to this. For example, as in a ninth modification shown in FIG. 30, the connection can be made in a flat placement state. A reference numeral of B1 shown in FIG. 30 indicates a positive electrode bus bar, and a reference numeral of B2 indicates a negative electrode bus bar. Via the bus bar B1, the collector terminal C1 is connected to the terminal on the positive electrode side of the smoothing capacitor Cs. Via the bus bar B2, the emitter terminal E2 is connected to the terminal on the negative electrode side of the smoothing capacitor Cs. In FIG. 30, some of the elements of the semiconductor devices 11 and 12 such as the sealing resin bodies 21 and 22 are omitted.

The structures of the semiconductor devices 11 and 12 are not limited to the double-sided heat dissipation structure. The present disclosure is also applicable to a single-sided heat dissipation structure. Further, the present disclosure is not limited to a switching element having a vertical structure, and can be applied to a switching element having a horizontal structure (for example, a LDMOS). In the case of the single-sided heat dissipation structure, for example, a connection structure in the flat placement state can be employed.

The example in which the semiconductor devices 11 and 12 respectively include the multiple semiconductor elements 31 and 32 has been shown. However, it is not limited to this. In a configuration where the semiconductor device 11 includes one semiconductor element 31 and the semiconductor device 12 includes one semiconductor element 32, for example, when two paths F1 and F2 are provided, the DC current imbalance may occur. Therefore, the present disclosure is also applicable to the configuration in which the semiconductor device 11 includes one semiconductor element 31 and the semiconductor device 12 includes one semiconductor element 32.

Although an example in which the semiconductor devices 11 and 12 respectively include the sealing resin bodies 21 and 22 has been shown, the present disclosure is not limited to this. The sealing resin bodies 21 and 22 may not be provided.

Third Embodiment

In the embodiments, parts functionally and/or structurally corresponding to the preceding embodiments and/or associated parts are given the same reference numerals. For corresponding and/or associated portions, it is possible to make reference to the descriptions of the preceding embodiments.

FIG. 31 shows the semiconductor devices 11 and 12 of the present embodiment. For convenience, in FIG. 31, the semiconductor devices 11 and 12 are shown side by side. Similarly to FIG. 12, FIG. 31 shows elements in the sealing resin bodies 21 and 22 by broken lines.

The basic configurations of the semiconductor devices 11 and 12 are same as that of the preceding embodiments. The semiconductor devices 11 and 12 have the double-sided heat dissipation structure. In a plan view from the Z direction, the areas of the heat sinks 51 and 52 are smaller than the areas of the corresponding heat sinks 41 and 42. In the long-side direction of the heat sink 51 (main portion 51a), two semiconductor elements 31 are arranged. Similarly, in the long-side direction of the heat sink 52 (main portion 52a), two semiconductor elements 32 are arranged.

The semiconductor device 11 includes the solder joint portions 121. The solder joint portion 121 are formed between each emitter terminal E1 and the heat sink 51. The semiconductor device 12 includes the solder joint portions 122. The solder joint portion 122 is formed between the heat sink 52 and the emitter terminal E2.

The semiconductor devices 11 further includes a solder joint portion 131. The semiconductor device 12 further includes a solder joint portion 132. The solder joint portion 131 is formed between each terminal 61 and the heat sink 51. The solder joint portion 132 is formed between each terminal 62 and the heat sink 52. In FIG. 31, the solder joint portions 121, 122, 131, and 132 are hatched to distinguish them from the others.

Figure 32:
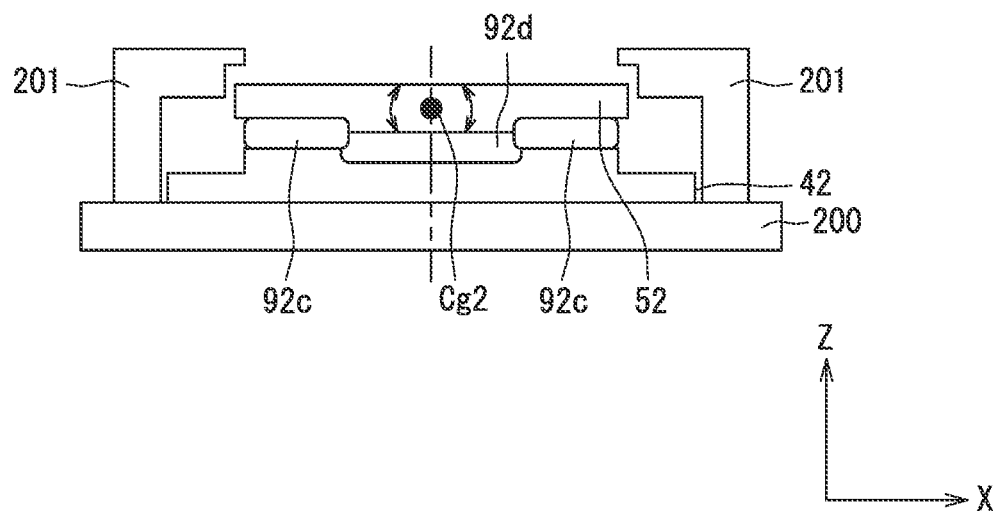
FIG. 32 is a schematic diagram showing a solder reflow process.

When the areas of the heat sinks 51 and 52 are smaller than the areas of the heat sinks 41 and 42, by the 2nd reflow as described above, the solder joint portions close to the heat sinks 51 and 52 are formed. For example, when the semiconductor device 12 is formed, as shown in FIG. 32, the connector including the heat sink 42 is placed on a pedestal 200 so that the solders 92c and 92d are positioned on the upper side. Next, the heat sink 52 is placed. In this placement state, 2nd reflow is performed. Then, the position of the heat sink 42 is determined by the weight of the member, the jig, and the like, with the pedestal 200 as the position reference in the Z direction.

Although the heat sink 52 is positioned and placed on the pedestal 200 by a jig 201, it is free in the Z direction when the solder is melted. The relationship between the center of gravity Cg2 of the heat sink 52 and the surface tension of the solder connected to the heat sink 52 may cause the inclination of the heat sink 52. For example, it is conceivable that the solders 92c and 92d do not harden at the same timing. The volume change from the liquid phase to the solid phase of the solder may affect the inclination. The similar applies to the semiconductor device 11 (heat sink 51). In FIG. 32, attention is paid to the heat sinks 42 and 52 and the solders 92c and 92d, and for convenience, other elements are shown integrally with the heat sink 42.

In the semiconductor device 11 according to the present embodiment, the main solder joint portions of the heat sink 51 are arranged line-symmetrically with the axis AX11 passing through the center of gravity Cg1 of the heat sink 51 as the symmetry axis. The axis AX11 is orthogonal to the long-side direction of the heat sink 51, that is, the X direction and the Z direction, which is the plate thickness direction of the semiconductor element 31. Similarly, in the semiconductor device 12, the main solder joint portions are arranged line-symmetrically with the axis AX12 passing through the center of gravity Cg2 of the heat sink 52 as the symmetry axis. The axis AX12 is orthogonal to the long-side direction of the heat sink 52, that is, the X direction and the Z direction, which is the plate thickness direction of the semiconductor element 32.

With this arrangement, substantially the same surface tension acts on the centers of gravity Cg1 and Cg2 at substantially the same distance in the longitudinal direction of the heat sinks 51 and 52. Thereby, the torques are substantially balanced on one side and the other side in the long-side direction as shown in FIG. 32. Accordingly, the heat sinks 41 and 42 each having the large area is positioned in the Z direction. When, in this state, the solder joint portions of the heat sinks 51 and 52 are formed, the heat sinks 41 and 42 and the heat sinks 51 and 52 can be prevented from being relatively inclined.

In particular, the inclination in the long-side direction can be prevented. Even in a case of the same inclination, the amount of displacement in the long-side direction is larger than that in the short-side direction. According to the present embodiment, it is possible to reduce the displacement. By the reduction in the inclination, for example, it is possible to ensure the heat dissipation. In the semiconductor elements 31 and 32 connected in parallel, it is possible to reduce the deviation of the wiring inductance.

In the present embodiment, the semiconductor device 11 includes, as the solder joint portions formed at the heat sink 51, the solder joint portion 131 electrically connecting the heat sink 51 and the semiconductor element 31 and the solder joint portion 121 electrically connecting the heat sink 51 and the emitter terminal E1. The solder joint portion 131 is formed to include the solder 91c, and the solder joint portion 121 is formed to include the solder 91d. The semiconductor device 11 includes two solder joint portions 131 and two solder joint portions 121.

The two solder joint portions 131 are symmetrically placed with respect to an axis AX11 as the symmetry axis. Thereby, in the long-side direction of the heat sink 51, the surface tension of the solder 91c is balanced. The two solder joint portions 121 are symmetrically arranged with respect to the axis AX11 as the symmetry axis. Thereby, in the long-side direction of the heat sink 51, the surface tension of the solder 91d is balanced. As described above, it is possible to prevent the inclination of the heat sink 51 in the long-side direction from occurring.

Similarly, the semiconductor device 12 includes, as the solder joint portions formed at the heat sink 52, the solder joint portion 132 electrically connecting the heat sink 52 and the semiconductor element 32 and the solder joint portion 122 electrically connecting the heat sink 52 and the emitter terminal E2. The solder joint portion 132 is formed to include the solder 92c, and the solder joint portion 122 is formed to include the solder 92d. The semiconductor device 12 includes two solder joint portions 132 and one solder joint portion 122.

The two solder joint portions 132 are symmetrically placed with respect to an axis AX12 as the symmetry axis.

Thereby, in the long-side direction of the heat sink 52, the surface tension of the solder 92c is balanced. The solder joint portions 122 are symmetrically placed with respect to the axis AX12 as the symmetry axis. Thereby, in the long-side direction of the heat sink 52, the surface tension of the solder 92d is balanced. As described above, it is possible to prevent the inclination of the heat sink 52 in the long-side direction from occurring.

In the present embodiment, among the solder joint portions, at least, two solder joint portions, corresponding to the two at the top of the descending order of the sizes of connection areas with the heat sink 51, are provided so as to overlap with the axis AX21 in the short-side direction of the heat sink 51. The axis AX21 is orthogonal to the short-side direction of the heat sink 51, that is, the Y direction and the Z direction, and passes through the gravity center Cg1. Since the surface tension acts at a position close to the axis AX21, the torque that causes the inclination in the short-side direction can be reduced. Thereby, it is possible to prevent the heat sink 51 from being inclined in the short-side direction. In the present embodiment, all the solder joint portions 131 are placed on the axis AX21.

Similarly, among the solder joint portions, at least, two solder joint portions, corresponding to the two at the top in the descending order of the sizes of connection areas with the heat sink 52, are provided so as to overlap with the axis AX22 in the short-side direction of the heat sink 52. The axis AX22 is orthogonal to the short-side direction of the heat sink 52, that is, the Y direction and the Z direction, and passes through the gravity center Cg2. Since the surface tension acts at a position close to the axis AX22, the torque that causes the inclination in the short-side direction can be reduced. Thereby, it is possible to prevent the heat sink 52 from being inclined in the short-side direction. In the present embodiment, all the solder joint portions 132 are placed on the axis AX22.

In the present embodiment, the solder joint portions 121 and 122 are provided at positions separated from the axes AX21 and AX22 in the short-side direction so as not to overlap with the axes AX21 and AX22. Thereby, it is possible to simplify the connection structure between the heat sinks 51 and 52, and the semiconductor elements 31 and 32 and the emitter terminals E1 and E2. In particular, in the semiconductor device 11, two solder joint portions 121 are arranged on the same side with respect to the axis AX21. Therefore, it is possible to simplify the structure.

Also in the present embodiment, as shown in FIG. 31, all the main terminals 71 project from the side surface 21c of the sealing resin body 21. In the plan view from the Z direction, a center 131c of the solder joint portion 131 is provided at a position farther apart from the solder joint portion 121 than the axis AX21 in the short-side direction. In other words, in the short-side direction, a distance between the center 131c and the axis AX21 is smaller than a distance between the center 131c and the solder joint portion 121. Thereby, the surface tension of the solder 91c can be applied so as to cancel the torque due to the surface tension of the solder 91d. Accordingly, it is possible to effectively prevent the heat sink 51 from being inclined in the short-side direction. The center 131c substantially coincides with the center of the emitter electrode 31e.

Similarly, as shown in FIG. 31, all the main terminals 72 project from the side surface 22c of the sealing resin body 22. In the plan view from the Z direction, a center 132c of the solder joint portion 132 is provided at a position farther apart from the solder joint portion 122 than the axis AX22 in the short-side direction. Thereby, the surface tension of the solder 92c can be applied so as to cancel the torque due to the surface tension of the solder 92d. Accordingly, it is possible to effectively prevent the heat sink 52 from being inclined in the short-side direction. The center 132c substantially coincides with the center of the emitter electrode 32e.

In the present embodiment, the heat sinks 41, 42, 51, and 52 correspond to a heat dissipation member. The heat sinks 41 and 42 correspond to a first member, and the heat sinks 51 and 52 correspond to a second member. The solder joint portions 121, 122, 131, and 132 correspond to multiple solder joint portions. The solder joint portions 131 and 132 correspond to a first joint portion, and the solder joint portions 121 and 122 correspond to a second joint portion. The axes AX1 and AX12 correspond to a first axis. The axes AX21 and AX22 correspond to a second axis.

As the heat dissipation member, the examples of the heat sinks 41, 42, 51, and 52 have been shown. However, it is not limited to this. For example, a DBC (Direct Bonded Copper) substrate can be employed as at least one of the heat sinks 41, 42, 51, or 52.

The number and arrangement of the semiconductor elements 31 included in the semiconductor device 11 are not limited to the above examples. The number and arrangement of the semiconductor elements 32 included in the semiconductor device 12 are not limited to the above examples. The semiconductor device 11 may include three or more semiconductor elements 31, and the semiconductor device 12 may include three or more semiconductor element 32. By including four semiconductor elements 31, in a tenth modification shown in FIG. 33, the semiconductor device 11 includes four solder joint portions 131.

Figure 33:
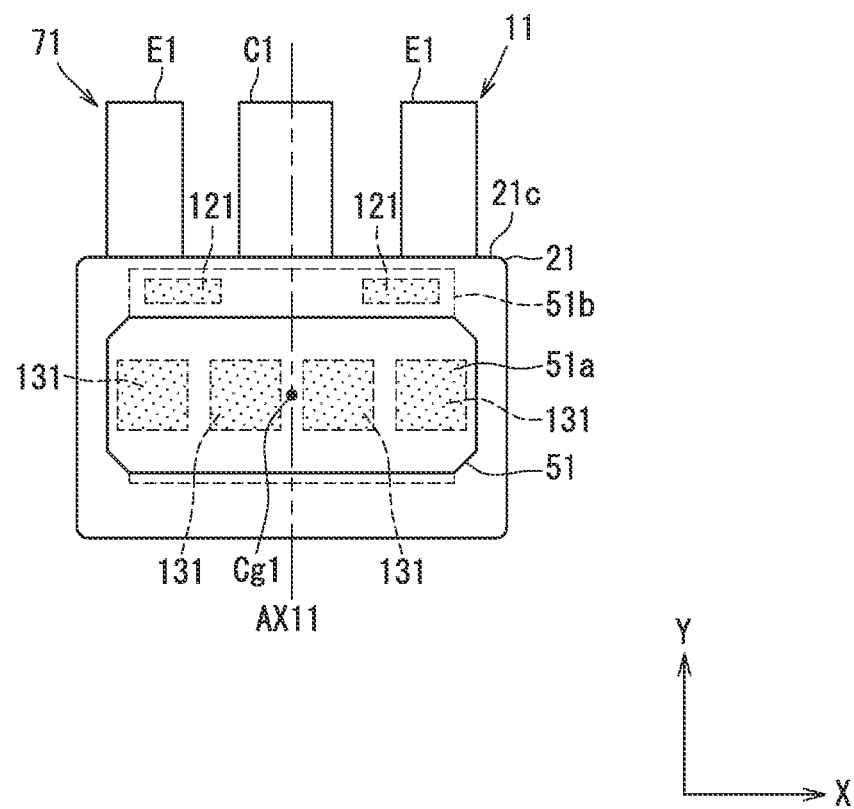
FIG. 33 is a plan view showing a tenth modification.
Figure 34:
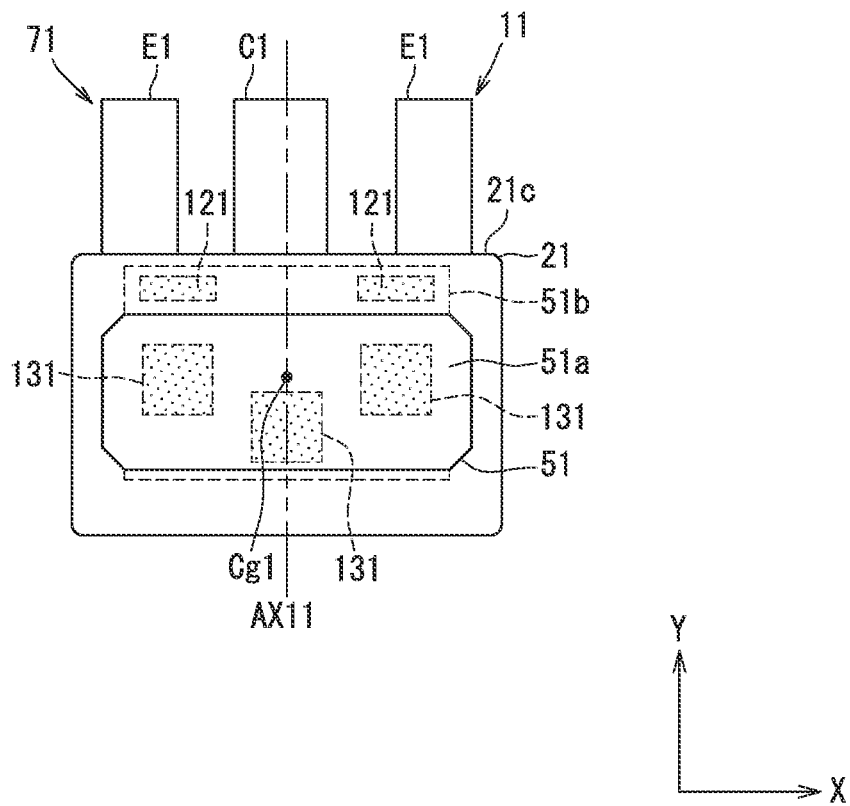
FIG. 34 is a plan view showing an eleventh modification.

A configuration, in which some of the multiple semiconductor elements 31 and 32 are arranged in the X direction and the remaining semiconductor elements 31 and 32 are arranged so as to be offset in the Y direction with respect to the arranged semiconductor elements 31 and 32, can be employed. Also in this case, the multiple solder joint portions 131 and 132 may be placed line-symmetrically with respect to the axes AX11 and AX12. In an eleventh modification shown in FIG. 34, the semiconductor device 11 includes three solder joint portions 131. The two solder joint portions 131 are arranged in the X direction so as to be line-symmetrical with respect to the axis AX11. The remaining solder joint portion 131 is placed so as to be offset in the Y direction with respect to the other two, and is placed line-symmetrically with respect to the axis AX11. In FIG. 33 and FIG. 34, for convenience, the signal terminal 81, the suspension lead 101b, and the like are omitted. Although FIG. 33 and FIG. 34 show the semiconductor device 11, the configuration can also be applied to the semiconductor device 12.

Although an example in which the semiconductor devices 11 and 12 respectively include the sealing resin bodies 21 and 22 has been described, the present disclosure is not limited to this. The sealing resin bodies 21 and 22 may not be provided.

Fourth Embodiment

In the embodiments, parts functionally and/or structurally corresponding to the preceding embodiments and/or associated parts are given the same reference numerals. For corresponding and/or associated portions, it is possible to make reference to the descriptions of the preceding embodiment.

Figure 35:
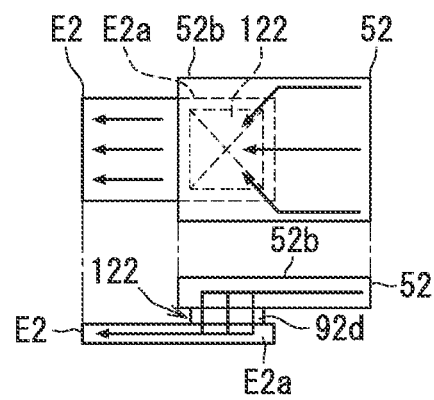
FIG. 35 is a view for describing local concentration of the current.

The semiconductor device 11 shown in the preceding embodiment includes the solder joint portion 121 between the heat sink 51 and the main terminals 71. The semiconductor device 12 includes the solder joint portion 122 between the heat sink 52 and the main terminals 72. FIG. 35 schematically shows the periphery of the solder joint portion 122 of the semiconductor device 12, as one example. FIG. 35 shows the current flow by a solid arrow.

As shown in FIG. 35, the solder 92d is interposed between the joint portion 52b of the heat sink 52 and the facing portion E2a of the emitter terminal E2, and the solder joint portion 122 is formed. When it is more difficult for the current to flow in the facing portion E2a than in the joint portion 52b, the movement to flow farther in the joint portion 52b having a low resistance is strengthened in the solder joint portion 122. Thereby, in the solder 92d, the current density on the back side in the flow direction is higher than that on the front side. In such a manner, in the solder 92d, the current tends to be locally concentrated.

Each of the heat sink 52 and the emitter terminal E2 is formed of a metal material such as copper. The heat sink 52 and the emitter terminal E2 have at least the same main component metal. For example, when the facing portion E2a is thinner than the joint portion 52b, the current is difficult to flow in the facing portion E2a. Therefore, in the solder joint portion 122, the movement to flow farther in the joint portion 52b is strengthened.

The plate surfaces of the joint portion 52b and the facing portion E2a face each other. The solder 92d is interposed between the plate surfaces of the joint portion 52b and the facing portion E2a. When, in the projection view from the facing direction, a terminal placement surface (facing surface) of the joint portion 52b is larger than the facing portion E2a, in the solder joint portion 122, the movement to flow farther in the joint portion 52b is strengthened. The same difficulty occurs in the semiconductor device 11. When the current is locally concentrated in the solders 91d and 92d, for example, the electromigration is concerned.

Figure 36:
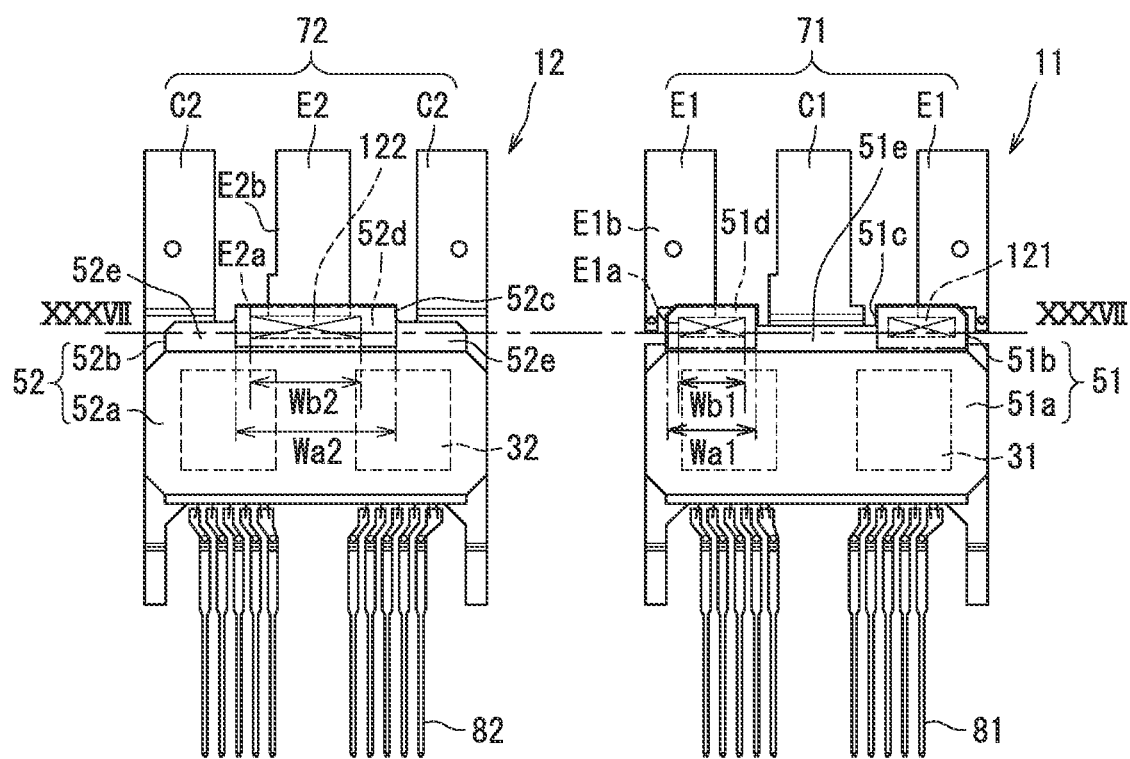
FIG. 36 is a plan view showing a semiconductor device according to a fourth embodiment.
Figure 37:
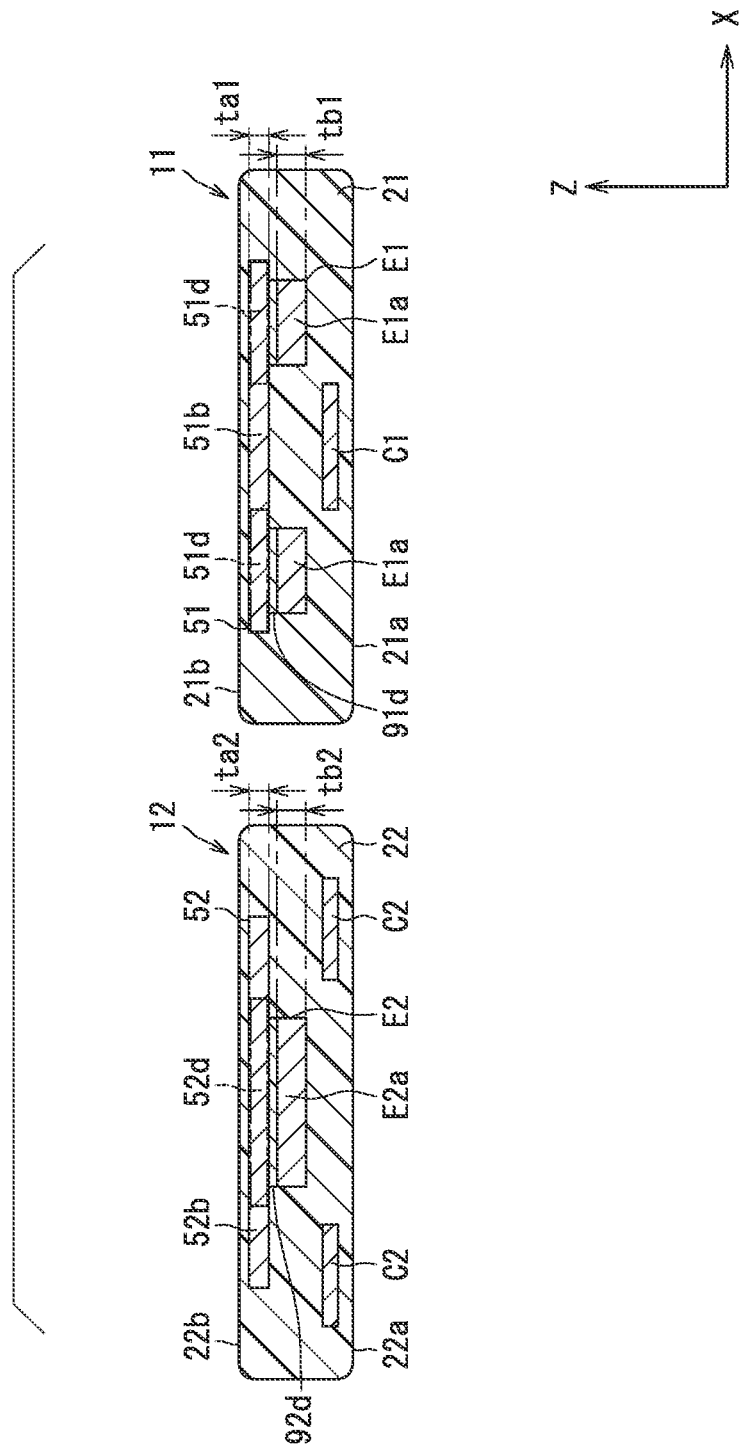
FIG. 37 is a cross-sectional view taken along a line XXXVII-XXXVII in FIG. 36.

Next, the semiconductor devices 11 and 12 of the present embodiment will be described with reference to FIG. 36 and FIG. 37. In FIG. 36, for convenience, the sealing resin bodies 21 and 22 are omitted. FIG. 37 is a cross-sectional view taken along a line XXXVII-XXXVII in FIG. 36. In FIG. 37, the sealing resin bodies 21 and 22 are also shown. FIG. 37 corresponds to FIG. 5 of the preceding embodiment.

The heat sink 51 of the semiconductor device 11 includes the main portion 51a and the joint portion 51b. Each of the two emitter terminals E1 includes the facing portion E1a and an extension portion E1b. The facing portion E1a is placed on the joint portion 51b so that the plate surfaces face each other. The facing portion E1a is connected to the joint portion 51b via the solder 91d. The extension portion E1b is continuous from the facing portion E1a. The extension portion E1b extends in the Y direction and away from the joint portion 51b. As shown in FIG. 37, assuming that the thickness of the joint portion 51b is ta1 and the thickness of the facing portion E1a is tb1, the thickness tb1 is equal to or more than the thickness ta1 (tb1≥ta1) at least in the solder joint portion 121.

In the present embodies, the thickness of the joint portion 51b is made substantially uniform over the entire area. Further, the thickness of the facing portion E1a is made substantially uniform over the entire area. The thickness tb1 of the facing portion E1a is thicker than the thickness ta1 of the joint portion 51b (tb1>ta1). The arrangement surface of the emitter terminal E1 in the joint portion 51b is larger than that of the facing portion E1a. The joint portion 51b includes two convex portions 51c corresponding to the two facing portions E1a. The convex portion 51c projects in the Y direction and away from the main portion 51a.

Placement areas 51d for the facing portions E1a are provided at both ends of the joint portion 51b in the X direction. In the joint portion 51b, the area facing the collector terminal C1 is a non-placement area 51e in which the facing portion E1a is not placed. In the x direction, the placement area 51d, the non-placement area 51e, and the placement area 51d are provided in this order. A width Wa1 of the placement area 51d and a width of a convex portion 51c coincide with each other. The width Wa1 is the length in the X direction.

The width Wa1 is the length orthogonal to the plate thickness direction of the joint portion 51b and the main flow direction of the current in the joint portion 51b. The width Wa1 is a length in a direction orthogonal to the plate thickness direction and the extension direction of the joint portion 51b from the main portion 51a. A part of the placement area 51d in the Y direction, specifically, a part away from the main portion 51a forms the convex portion 51c. Each of the placement areas 51d has a substantially rectangular shape in a plane. In the XY plane, the solder 91d is connected to the central portion of the placement area 51d, and the solder 91d is not connected to the peripheral portion surrounding the central portion.

The solder 91d is connected to a part of the facing portion E1a. In the facing portion E1a, the joint portion is provided at one end of the emitter terminal E1 in the long-side direction. A width Wb1 of the facing portion E1a is narrower than the width Wa1 of the placement area 51d of the joint portion 51b. That is, the width Wa1 is wider than the width Wb1 (Wa1>Wb1). The width Wb1 is the length including the joint portion in the X direction. The width Wb1 is a length in a direction orthogonal to the plate thickness direction and the long-side direction of the emitter terminal E1.

The heat sink 52 of the semiconductor device 12 includes the main portion 52a and the joint portion 52b. One emitter terminal E2 includes the facing portion E2a and an extension portion E2b. The facing portion E2a is placed on the joint portion 52b so that the plate surfaces face each other. The facing portion E2a is connected to the joint portion 52b via the solder 92d. The extension portion E2b is continuous from the facing portion E2a. The extension portion E2b extends in the Y direction and away from the joint portion 52b. As shown in FIG. 37, assuming that the thickness of the joint portion 52b is ta2 and the thickness of the facing portion E2a is tb2, the thickness tb2 is equal to or more than the thickness ta2 (tb2≥ta2) at least in the solder joint portion 122.

In the present embodiment, the thickness of the joint portion 52b is made substantially uniform over the entire area. Further, the thickness of the facing portion E2a is made substantially uniform over the entire area. The thickness tb2 of the facing portion E2a is thicker than the thickness ta2 of the joint portion 52b (tb2>ta2). The arrangement surface of the emitter terminal E2 in the joint portion 52b is larger than that of the facing portion E2a. The joint portion 52b includes one convex portion 52c corresponding to the facing portion E2a. The convex portion 52c projects in the Y direction and away from the main portion 52a.

A placement area 52d for the facing portions E2a is provided at the center of the joint portion 52b in the X direction. In the joint portion 52b, the area facing the collector terminal C2 is a non-placement area 52e in which the facing portion E2a is not placed. In the X direction, the non-placement area 52e, the placement area 52d, and the non-placement area 52e are provided in this order. A width Wa2 of the placement area 52d and a width of the convex portion 52c coincide with each other. The width Wa2 is the length in the X direction.

The width Wa2 is the length orthogonal to the plate thickness direction of the joint portion 52b and the main flow direction of the current in the joint portion 52b. The width Wa2 is a length in a direction orthogonal to the plate thickness direction and the extension direction of the joint portion 52b from the main portion 52a. A part of the placement area 52d in the Y direction, specifically, a part away from the main portion 52a forms the convex portion 52c. The placement area 52d has a substantially rectangular shape in a plane. In the XY plane, the solder 92d is connected to the central portion of the placement area 52d, and the solder 92d is not connected to the peripheral portion surrounding the central portion.

The solder 92d is connected to a part of the facing portion E2a. In the facing portion E2a, the joint portion is provided at one end of the emitter terminal E2 in the long-side direction. A width Wb2 of the facing portion E2a is narrower than the width Wa2 of the placement area 52d of the joint portion 52b. That is, the width Wa2 is wider than the width Wb2 (Wa2>Wb2). The width Wb2 is the length including the joint portion in the X direction. The width Wb2 is a length in a direction orthogonal to the plate thickness direction and the long-side direction of the emitter terminal E2.

According to the semiconductor devices 11 and 12 of the present embodiment, the thickness tb1 of the facing portion E1a is equal to or larger than the thickness ta1 of the joint portion 51b. Since the current easily flows through the facing portion E1a as compared with the configuration in which the facing portion E1a is thinner than the joint portion 51b, it is possible to prevent the local concentration of the current in the solder 91d. Therefore, it is possible to improve the reliability of the semiconductor device 11. Similarly, the thickness tb2 of the facing portion E2a is equal to or larger than the thickness ta2 of the joint portion 52b. Therefore, it is possible to improve the reliability of the semiconductor device 12.

In the present embodiment, the placement surface of the emitter terminal E1 in the joint portion 51b is larger than that of the facing portion E1a. The width Wa1 of the placement area 51d is wider than the width Wb1 of the facing portion E1a. It is possible to improve the reliability of the semiconductor device 11 by satisfying the above relationship of tb1 ta1 while using the configuration in which the current is locally concentrated on the solder 91d. Similarly, the placement surface of the emitter terminal E2 in the joint portion 52b is larger than that of the facing portion E2a. The width Wa2 of the placement area 52d is wider than the width Wb2 of the facing portion E2a. It is possible to improve the reliability of the semiconductor device 12 by satisfying the above relationship of tb2≥ta2 while using the configuration in which the current is locally concentrated on the solder 92d.

In the present embodiment, the semiconductor devices 11 includes the multiple semiconductor elements 31, and the semiconductor devices 12 includes the multiple semiconductor elements 32. The multiple semiconductor elements 31 are connected to the same main portion 51a via the solders 91b and 91c. It is possible to improve the reliability of the semiconductor device 11 by satisfying the above relationship of tb1 ta1 while using the configuration in which the current is locally concentrated on the solder 91d.

The multiple semiconductor elements 32 are connected to the same main portion 52a via the solders 92b and 92c. It is possible to improve the reliability of the semiconductor device 12 by satisfying the above relationship of tb2≥ta2 while using the configuration in which the current is locally concentrated on the solder 92d.

In the semiconductor device 12, the number of emitter terminals E2 is smaller than the number of semiconductor elements 32. The number of emitter terminals E2 is smaller than the number of collector terminals C2. The semiconductor device 12 includes two semiconductor elements 32 and one emitter terminal E2. It is possible to improve the reliability of the semiconductor device 11 by satisfying the above relationship of tb1≥ta1 while using the configuration in which the current is locally concentrated on the emitter terminal E2, that is, the solder 92d of the solder joint portion 122, as described above.

As shown in FIG. 37, in the present embodiment, in the semiconductor device 11, the thickness of the facing portion E1a of the emitter terminal E1 is thicker than the thickness of the collector terminal C1. As shown in FIG. 37, in the semiconductor device 12, the thickness of the facing portion E2a of the emitter terminal E2 is thicker than the thickness of the collector terminal C2. As described above, in the main terminals 71 and 72, at least the facing portions E1a and E2a of the emitter terminals E1 and E2 are thicker than the other portions. Accordingly, without changing the connection conditions between the collector terminals C1 and C2 and the bus bar and the like, it is possible to prevent the local concentration of the current.

Figure 38:
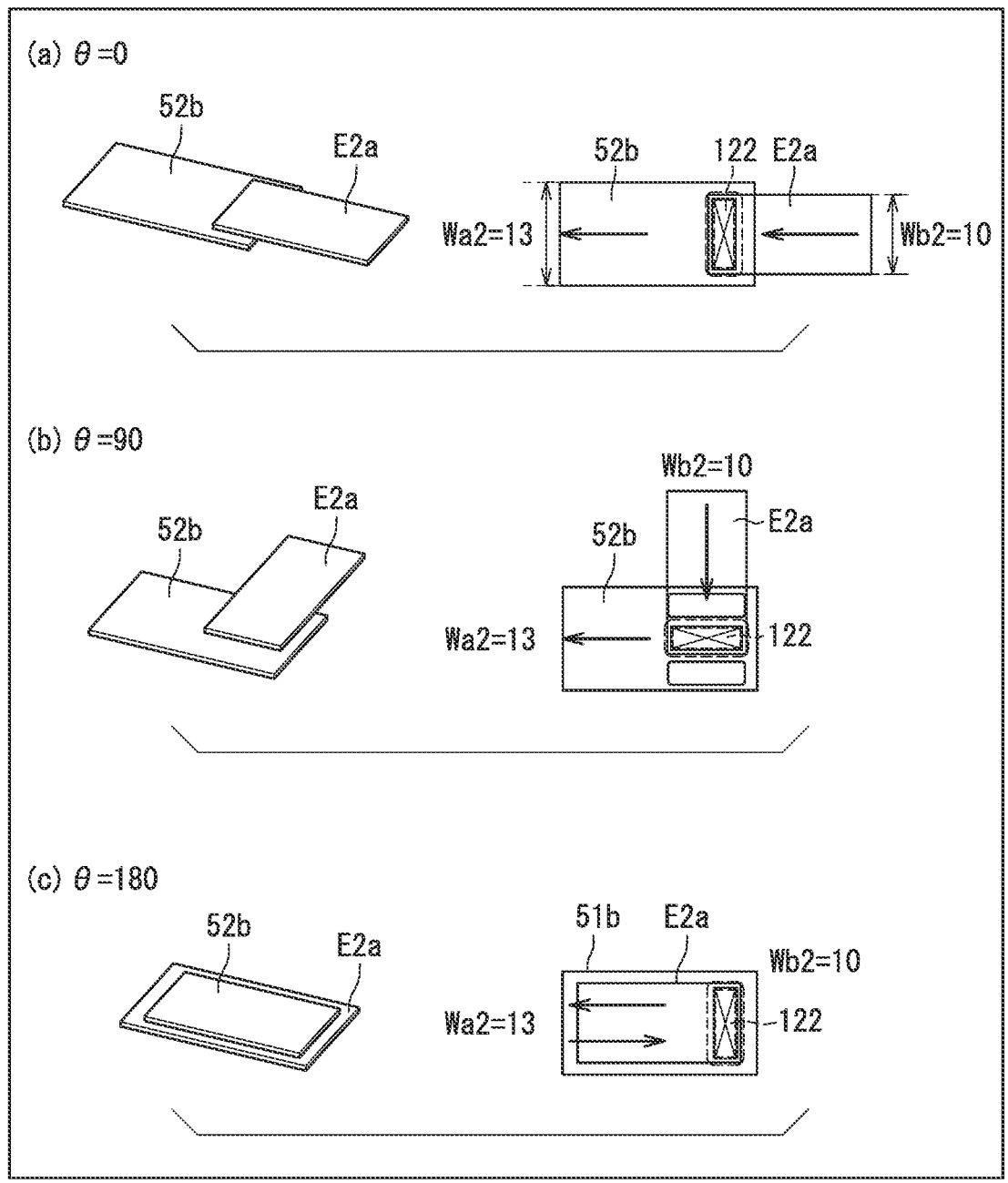
FIG. 38 is a view showing a model used for simulation.

Next, a more preferable relationship of the thicknesses ta1, ta2, tb1, and tb2 will be described. FIG. 38 shows a model used for simulation; FIG. 39 shows a simulation result. The periphery of the solder joint portion 122 of the semiconductor device 12 was simplified and used as a model. FIG. 38 shows the main current flow by a solid arrow. In FIG. 38(a), the main flow direction of the current flowing through the joint portion 52b is same as the main flow direction of the current flowing through the emitter terminal E2. That is, the angle θ formed by the current is 0°. In FIG. 38 (b), θ is 90°, and, in FIG. 38 (c), θ is 180°. In FIGS. 38 (a) to 38 (c), the width of the solder joint portion 122 substantially coincides with the width Wb2 of the emitter terminal E2.

In the simulation, the width Wa2 was set to 13 mm and the width Wb2 was set to 10 mm. Further, the thickness ta2 of the joint portion 52b was set to 0.5 mm (millimeters). Then, the thickness tb2 of the emitter terminal E2 was variously changed, and the maximum value of the current density at the solder joint portion 122 was obtained. FIG. 39 (a) shows the results of θ=0°, FIG. 39 (b) shows the results of θ=90°, and FIG. 39 (c) shows the results of θ=180°.

As shown in FIG. 39 (a), in the case of θ=0°, the maximum value of the current density was the largest value in a relation of tb2<ta2. The maximum value of current density in a relation of tb2≥ta2 was smaller than that in the relation of tb2<ta2. Further, when the thickness tb2 is in the vicinity of ta2×(Wa2/Wb2), the maximum value of the current density was the smallest (lowest point).

Assuming that the thickness when it is equal to the thickness ta2 is defined as tb2s and the thickness of the lowest point is defined as tb2m, the difference Δ between the tb2s and the tb2m is expressed by the following equation.

$$\Delta = tb2m - tb2s = ta2 \times \{(Wa2/Wb2) - 1\} \quad \text{(Sixth equation 6)}$$

The thickness tb2 is thicker than the thickness ta2 within a range of twice A having the lowest point as the apex. This range is expressed by the following equation 7.

$$ta2 < tb2 \leq ta2 \times \{(2 \times Wa2 - Wb2)/Wb2\} \quad \text{(Seventh equation)}$$

By satisfying the relationship of the seventh equation, the maximum value of the current density can be made smaller. That is, it is possible to effectively prevent the local concentration of the current in the solder joint portion 122. Although the model shows the example of θ=0°, it is not limited to the case where the main flow directions of the currents are exactly the same. When the range of 0°≤θ<45°, that is, the current component in the same direction is large, the effect can be achieved.

Also in the case of θ=90°, although the drawing is omitted, the maximum value of the current density was the largest value in a relation of tb2<ta2. As shown in FIG. 39(b), in the range of tb2≥ta2, as the thickness tb2 is thicker, the maximum of the current density is smaller. Also in the case of θ=180°, although the drawing is omitted, the maximum value of the current density was the largest value in the relation of tb2<ta2. As shown in FIG. 39(c), in the range of tb2≥ta2, as the thickness tb2 is thicker, the maximum of the current density is smaller.

As described above, in the range of 45°≤θ≤180°, the maximum value of the current density becomes smaller as the thickness tb2 increases in the range of tb2≥ta2. In particular, when tb2>ta2 is satisfied, it is possible to effectively prevent the local concentration of the current. The similar effect can be obtained with the semiconductor device 11.

In the semiconductor devices 11 and 12, the thicknesses of the facing portions E1a and E2a of the emitter terminals E1 and E2 may be substantially equal to the thicknesses of the extension portions E1b and E2b. The thicknesses of the emitter terminals E1 and E2 are same in the total length.

Figure 40:
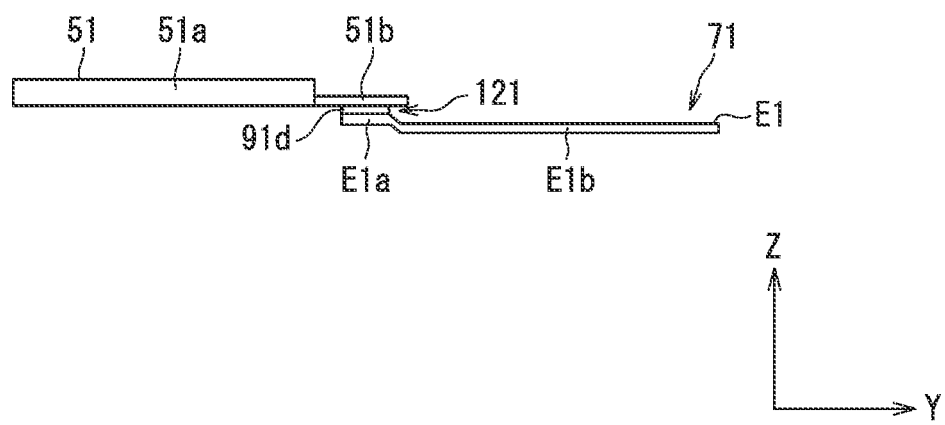
FIG. 40 is a plan view showing a twelfth modification.

For example, as in a twelfth modification shown in FIG. 40, the thickness of the facing portion E1a may be thicker than the thickness of the extension portion E1b. The thickness of the extension portion E1b is thinner than the thickness ta1 of the joint portion 51b. In the emitter terminal E1, the facing portion E1a is thickened, and the extension portion E1b is thinned. Thereby, also for the emitter terminal E1, without changing the connection conditions between the collector terminals C1 and C2 and the bus bar and the like, it is possible to prevent the local concentration of the current. Further, as compared with the configuration in which the thicknesses are same in the total length, it is possible to reduce the cost. The similar applies to the emitter terminal E2.

The semiconductor devices 11 and 12 according to the present embodiment may include, at least, the semiconductor element, the metal member having the main portion electrically connected to the semiconductor element and the joint portion, and the terminal connected to the joint portion by the solder.

The example in which the semiconductor device 11 includes the two corresponding semiconductor element 31 and the semiconductor device 12 includes the two corresponding semiconductor elements 32 has been shown. However, it is not limited to this. The semiconductor device 11 may include one semiconductor element 31, and the semiconductor device 12 may include the semiconductor element 32. Alternatively, the semiconductor device 11 may include three or more semiconductor elements 31, and the semiconductor device 12 may include three or more semiconductor elements 32. For example, as shown in FIG. 33, four semiconductor elements 31 may be connected to the same heat sinks 41 and 51.

The placements of the multiple semiconductor elements 31 and 32 are not limited to the above example. The placements are not limited to the configuration in which all the semiconductor elements 31 and 32 are arranged in the X direction. The placement can be adopted to a configuration in which at least one of the semiconductor elements 31 is placed so as to be displaced in the Y direction with respect to another semiconductor element 31. The placement can be adopted to a configuration in which at least one of the semiconductor elements 32 is placed so as to be displaced in the Y direction with respect to another semiconductor element 32. For example, the configuration shown in FIG. 34 can be employed.

The example in which the semiconductor devices 11 and 12 respectively include the sealing resin bodies 21 and 22 has been shown. However, it is not limited to this. The sealing resin bodies 21 and 22 may not be provided.

The structures of the semiconductor devices 11 and 12 are not limited to the double-sided heat dissipation structure. A single-sided heat dissipation structure can be also employed. Further, the present disclosure is not limited to a switching element having a vertical structure, and can be applied to a switching element having a horizontal structure (for example, a LDMOS).

OTHER EMBODIMENTS

In the above, the embodiments, the configurations, the aspects of the semiconductor device according to the present disclosure are exemplified. The present disclosure is not limited to the above-described embodiments, each configuration and each aspect related to the present disclosure. For example, embodiments, configurations, and examples obtained from an appropriate combination of technical elements disclosed in different embodiments, configurations, and examples are also included within the scope of the embodiments, configurations, and examples of the present disclosure.

The invention claimed is:

1. A semiconductor device comprising:
   a plurality of semiconductor elements each having a one surface and a rear surface opposite to the one surface in a plate thickness direction, wherein a plurality of electrodes are placed on the one surface and the rear surface;
   a first member that is a heat dissipation member placed to sandwich the plurality of semiconductor elements and is electrically connected to each of the plurality of electrodes on the one surface;
   a second member that is the heat dissipation member and is electrically connected to each of the plurality of electrodes on the rear surface; and
   a plurality of terminals that are continuous from the heat dissipation member,
   wherein:
   in a plan view from the plate thickness direction, an area of the second member is smaller than an area of the first member;
   at least two of the plurality of semiconductor elements are arranged in a longitudinal direction of the second member;
   the semiconductor device further includes, as a plurality of solder joint portions formed between the plurality of semiconductor elements and the second member, a first joint portion that electrically connects each of the plurality of semiconductor elements and the second member and a second joint portion that electrically connects at least one of the plurality of terminals and the second member;

the plurality of solder joint portions are symmetrically placed with respect to an axis that passes through a gravity center of the second member and is orthogonal to the plate thickness direction and the longitudinal direction;

the plurality of terminals is arranged in a direction parallel to the longitudinal direction of the second member; and the plurality of terminals includes:
one first terminal that is continuous from the first member; and
two second terminals that are continuous from the second member, wherein
the one first terminal and the two second terminals include a collector terminal or an emitter terminal.

2. The semiconductor device according to claim 1, wherein:

the axis is a first axis;

a second axis is an axis that passes through the gravity center in a short-side direction orthogonal to the plate thickness direction and the longitudinal direction and is orthogonal to the first axis and the plate thickness direction;

among the plurality of solder joint portions, at least two solder joint portions corresponding to a top two in descending order of a connection area with the second member are placed to overlap with the second axis in a short-side direction of the second member.

3. The semiconductor device according to claim 2, wherein:

the first joint portion includes a plurality of first joint portions; and all of the plurality of first joint portions are placed to overlap with the second axis in the short-side direction.

4. The semiconductor device according to claim 2, wherein:

the second joint portion is placed at a position separated from the second axis in the short-side direction and does not overlap with the second axis.

5. The semiconductor device according to claim 4, further comprising:

a sealing resin body that seals at least a part of each of the first member and the second member and the plurality of semiconductor elements, wherein:

all of the plurality of terminals project from an identical surface of the sealing resin body;

a center of the first joint portion in the plan view is provided at a position separated from the second joint portion in the short-side direction; and in the short-side direction, a distance between the center and the second axis is smaller than a distance between the center and the second joint portion.

6. The semiconductor device according to claim 1, wherein:

the first member is not continuous from a different member adjacent to the first member in the longitudinal direction via the first terminal or the two second terminals.

7. The semiconductor device according to claim 1, wherein:

the second member is not continuous from a different member adjacent to the second member in the longitudinal direction via the one first terminal or the two second terminals.

8. The semiconductor device according to claim 1, wherein:

the first member or the second member is not continuous from a different member adjacent to the first member or the second member in the longitudinal direction via the one first terminal or the two second terminals.

* * * * *